US012635191B2

(12) United States Patent
Lordi et al.

(10) Patent No.: US 12,635,191 B2
(45) Date of Patent: May 19, 2026

(54) SUPERJUNCTION DEVICES FORMED BY FIELD ASSISTED DIFFUSION OF DOPANTS

(71) Applicant: Lawrence Livermore National Security, LLC, Livermore, CA (US)

(72) Inventors: Vincenzo Lordi, Livermore, CA (US); Noah Patrick Allen, Oakland, CA (US); Qinghui Shao, Fremont, CA (US); Clint Duncan Frye, Livermore, CA (US); Kyoung Eun Kweon, Pleasanton, CA (US); Lars F. Voss, Livermore, CA (US); Joel Basile Varley, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 609 days.

(21) Appl. No.: 17/880,552

(22) Filed: Aug. 3, 2022

(65) Prior Publication Data

US 2024/0047516 A1    Feb. 8, 2024

(51) Int. Cl.
| | |
|---|---|
| *H10D 62/10* | (2025.01) |
| *H01L 21/225* | (2006.01) |
| *H01L 21/66* | (2006.01) |
| *H10D 62/85* | (2025.01) |
| *H10D 62/854* | (2025.01) |

(Continued)

(52) U.S. Cl.
CPC ....... *H10D 62/111* (2025.01); *H10D 62/8503* (2025.01); *H10D 62/854* (2025.01); *H10P 32/14* (2026.01); *H10P 32/174* (2026.01); *H10P 74/238* (2026.01)

(58) Field of Classification Search
CPC ... H01L 21/2258; H01L 21/326; H01L 22/26; H10D 62/111; H10D 62/8503; H10D 62/854

See application file for complete search history.

(56) References Cited

U.S. PATENT DOCUMENTS

| | | | |
|---|---|---|---|
| 5,766,695 A | 6/1998 | Nguyen et al. |
| 6,639,354 B1 | 10/2003 | Kojima et al. |

(Continued)

FOREIGN PATENT DOCUMENTS

| | | |
|---|---|---|
| KR | 20130047539 A | 5/2013 |
| KR | 20150032425 A | 3/2015 |

OTHER PUBLICATIONS

International Search Report and Written Opinion from PCT Application No. PCT/US2023/028165, dated Nov. 7, 2023, 11 pages.

(Continued)

*Primary Examiner* — William B Partridge
*Assistant Examiner* — Chevy J Boegel
(74) *Attorney, Agent, or Firm* — Zilka-Kotab, P.C.

(57) ABSTRACT

An apparatus, in accordance with one embodiment, includes a superjunction device having a voltage sustaining layer formed of a semiconductor material and a dopant in the voltage sustaining layer. The dopant is for distributing an electric field within the voltage sustaining layer. The dopant is more concentrated along a sidewall of the voltage sustaining layer than toward a center of the voltage sustaining layer, the sidewall extending at least a portion of the distance between a top surface and a bottom surface of a voltage sustaining layer. Methods of electric field-enhanced dopant diffusion to form a superjunction device are also presented.

21 Claims, 26 Drawing Sheets

(51) Int. Cl.
| | | |
|---|---|---|
| *H10P 32/10* | (2026.01) | |
| *H10P 32/14* | (2026.01) | |
| *H10P 74/00* | (2026.01) | |

(56) References Cited

U.S. PATENT DOCUMENTS

| | | | |
|---|---|---|---|
| 10,930,506 | B2 | 2/2021 | Voss et al. |
| 2001/0030329 | A1 | 10/2001 | Ueta et al. |
| 2005/0040755 | A1 | 2/2005 | Song et al. |
| 2007/0029597 | A1 | 2/2007 | Lee et al. |
| 2012/0068188 | A1 | 3/2012 | Feigelson et al. |
| 2013/0056793 | A1 | 3/2013 | Srinivasan |
| 2015/0060908 | A1 | 3/2015 | Jain et al. |
| 2015/0147856 | A1 | 5/2015 | Irsigler et al. |
| 2016/0093495 | A1 | 3/2016 | Agraffeil |
| 2016/0093510 | A1 | 3/2016 | Agraffeil |
| 2016/0093698 | A1 | 3/2016 | Agraffeil |
| 2017/0077239 | A1* | 3/2017 | Shimizu ............... H10D 8/00 |
| 2017/0263720 | A1* | 9/2017 | Hirler ............... H10D 64/01 |
| 2018/0109250 | A1 | 4/2018 | Shah et al. |
| 2018/0308966 | A1 | 10/2018 | Jacquet et al. |
| 2018/0315815 | A1 | 11/2018 | Liu et al. |
| 2019/0181329 | A1 | 6/2019 | Enatsu et al. |
| 2019/0393038 | A1* | 12/2019 | Voss ............... H01L 21/3245 |
| 2020/0235202 | A1* | 7/2020 | Chang ............... H01L 23/3171 |
| 2021/0257463 | A1* | 8/2021 | Varley ............... H10D 64/62 |
| 2021/0399091 | A1* | 12/2021 | Cui ............... H01L 21/02057 |

OTHER PUBLICATIONS

Quaranta et al., "Field-assisted solid state doping of glasses for optical materials," Optical Materials, vol. 32, pp. 1352-1355.
Udrea et al., "Superjunction Power Devices, History, Development, and Future Prospects," IEEE Transactions on Electron Devices, vol. 64, No. 3, Mar. 2017, pp. 713-727.
Voss et al., U.S. Appl. No. 16/446,460, filed Jun. 19, 2019, 47 pages.
Restriction Requirement from U.S. Appl. No. 16/446,460, dated Sep. 6, 2019.
Non-Final Office Action from U.S. Appl. No. 16/446,460, dated Oct. 31, 2019.
Ex Parte Quayle from U.S. Appl. No. 16/446,460, dated May 13, 2020.
Notice of Allowance from U.S. Appl. No. 16/446,460, dated Oct. 19, 2020.
Varley et al., U.S. Appl. No. 17/166,962, filed Feb. 3, 2021, 97 pages.
Restriction Requirement from U.S. Appl. No. 17/166,962, dated Feb. 7, 2022.
Non-Final Office Action from U.S. Appl. No. 17/166,962, dated May 25, 2022.
Steckl et al., "Rare-Earth-Doped GaN: Growth, Properties, and Fabrication of Electroluminescent Devices," IEEE Journal of Selected Topics in Quantum Electronics, Vo. 8, No. 4, Jul./Aug. 2002, pp. 749-766.

Basha et al., "Investigations of cobalt and carbon codoping in gallium nitride for spintronic applications," Journal of Magnetism and Magnetic Materials, vol. 324, 2012, pp. 1528-1533.
Yang et al., "P-Type GaN Formation by Mg Diffusion," Japanese Journal of Applied Physics, vol. 39, Part 2, No. 5A, May 1, 2000, pp. L390-L392.
Mendis, B., "Thermal Diffusion of Dopants in Silicon Carbide," A dissertation submitted to the Graduate Faculty of Auburn University, Aug. 4, 2012, pp. 1-206.
To et al., "Doping of GaN by Mg Diffusion," Conference on Optoelectronic and Microelectronic Materials and Devices, 2002, pp. 75-78, retrieved from https://www.researchgate.net/publication/4037906_Doping_of_GaN_by_Mg_diffusion.
Hull et al., "Thermodynamic modeling of the Ni—Al—Ga—N system," Journal of Materials Research, vol. 19, No. 6, Jun. 2004, pp. 1742-1751.
Wilson et al., "Thermal stability of implanted dopants in GaN," American Institute of Physics, Applied Physics Letters, vol. 66, No. 17, Apr. 24, 1995, pp. 2238-2240.
Khludkov et al., "Gallium Nitride as a Material for Spintronics," Russian Physics Journal, vol. 55, No. 8, Jan. 2013, pp. 903-909.
Greco et al., "Ohmic contacts to Gallium Nitride materials," Elsevier, Applied Surface Science, vol. 383, Apr. 13, 2016, pp. 324-345.
Ting et al., "Electrical and structural characteristics of tin-doped GaN thin films and its hetero-junction diode made all by RF reactive sputtering," Elsevier, Materials Science in Semiconductor Processing, vol. 59, 2017, pp. 50-55.
Yen et al., "P-type GaN Formed by Mg Diffusion Using Mg3N2 as the Mg Source," Springer, Proceedings of the 25th International Conference on the Physics of Semiconductors Part II, 2000, pp. 1501-1502.
Pan et al., "The doping of GaN with Mg diffusion," Elsevier, Solid-State Electronics, vol. 43, 1999, pp. 621-623.
Harafuji et al., "Magnesium Diffusion at Dislocation in Wurtzite-Type GaN Crystal," Japanese Journal of Applied Physics, vol. 44, No. 9A, 2005, pp. 6495-6504.
Chang et al., "Study of Mg diffusion during metalorganic chemical vapor deposition of GaN and AlGaN," American Institute of Physics, Applied Physics Letters, vol. 74, No. 5, Feb. 1, 1999, pp. 688-690.
Liu et al., "Proposal for the formation of a minority carrier injecting contact on wide bandgap semiconductors," Journal of Crystal Growth, vol. 117, 1992, pp. 913-917.
Gonella et al., "Diffusion behavior of transition metals in field-assisted ion-exchanged glasses," Solid State Ionics, vol. 177, 2006, pp. 3151-3155.
Rajakarunanayake et al., "Electric field assisted doping of semiconductors during epitaxial growth," Journal of Crystal Growth, vol. 111, 1991, pp. 782-786.
Cattaruzza et al., "Doping of silicate glasses with erbium by a field-assisted solid-state ion exchange technique," Journal of Physics D: Applied Physics, vol. 42, 2009, pp. 1-5.

* cited by examiner

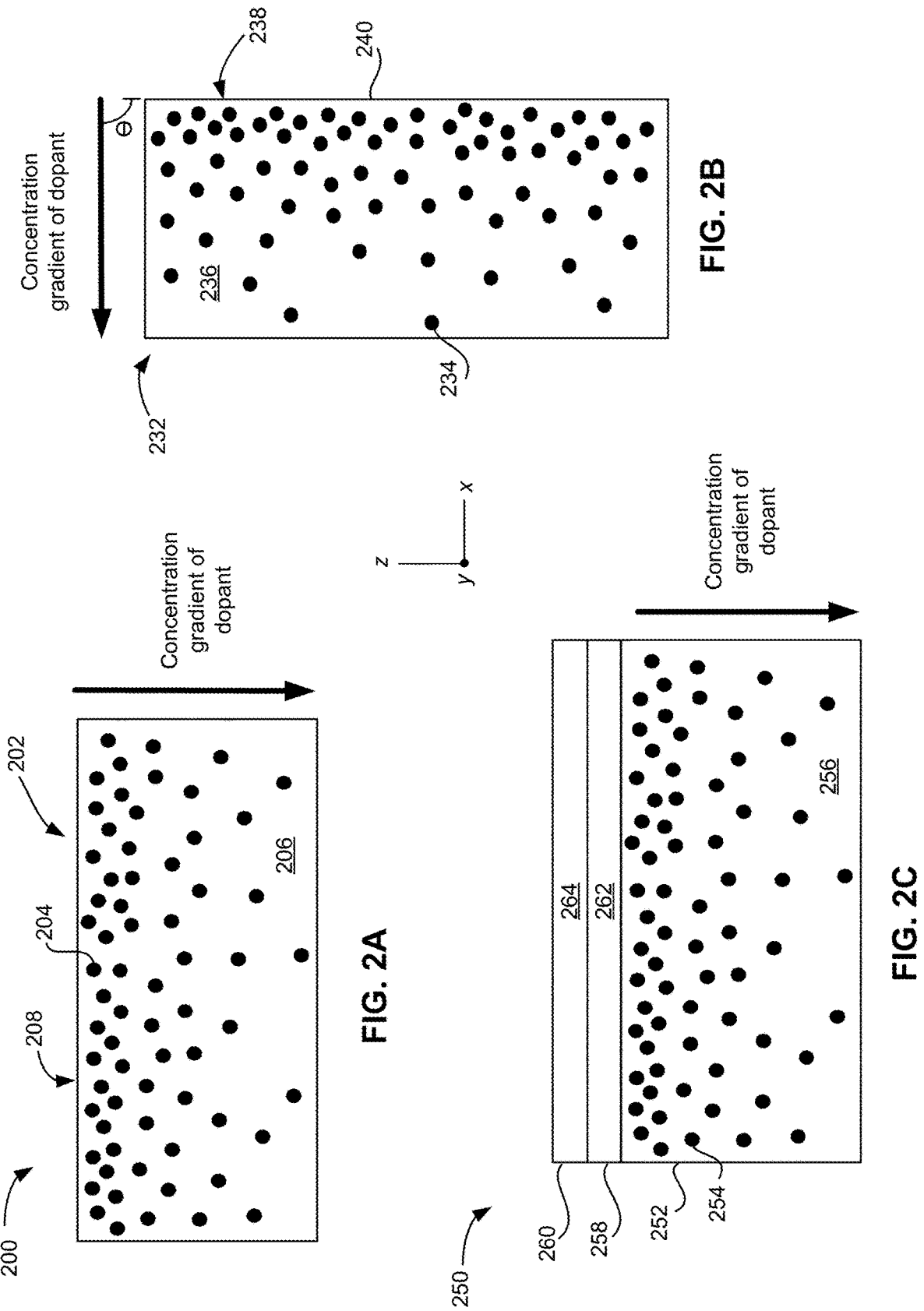

600

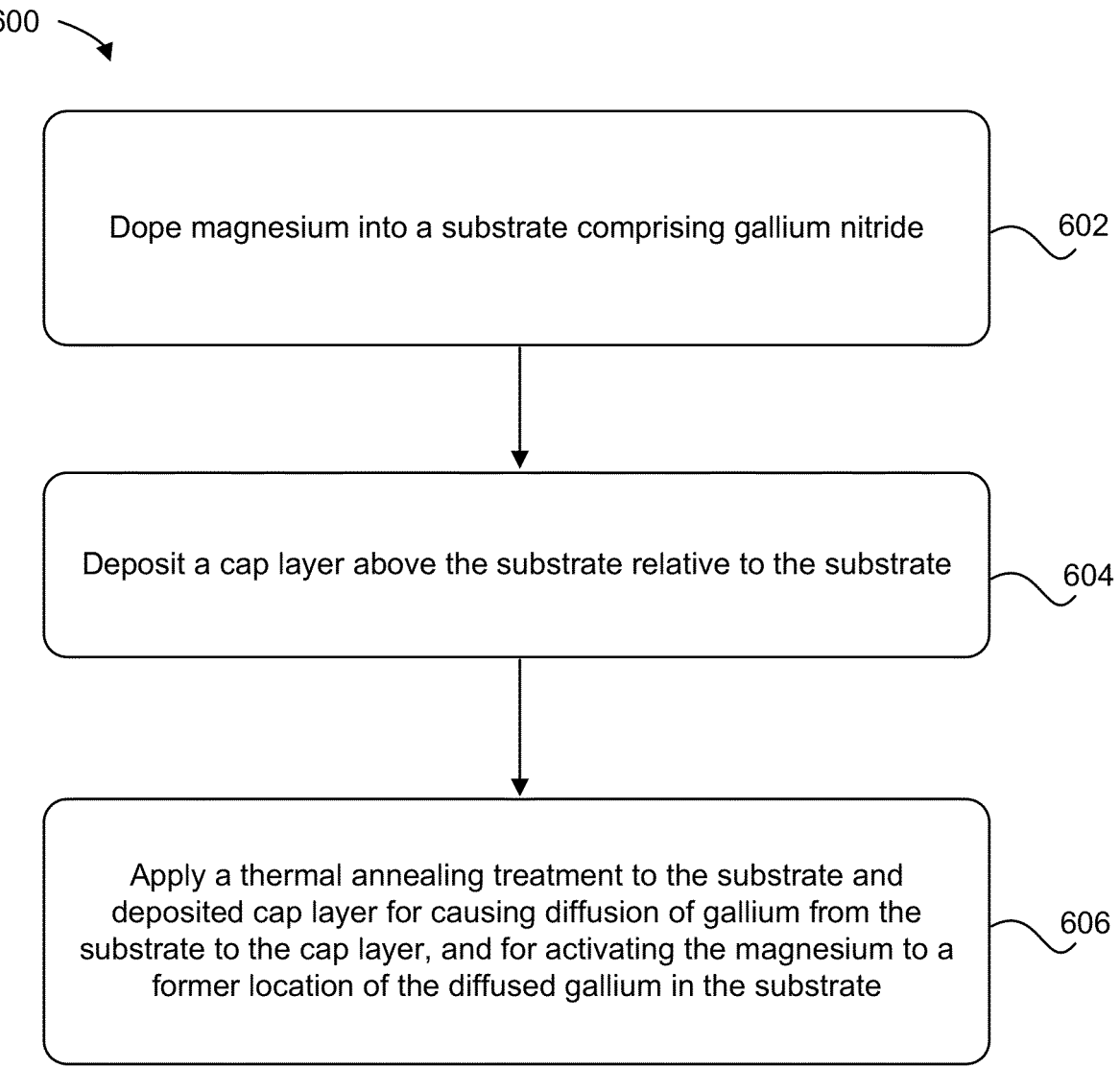

Dope magnesium into a substrate comprising gallium nitride — 602

Deposit a cap layer above the substrate relative to the substrate — 604

Apply a thermal annealing treatment to the substrate and deposited cap layer for causing diffusion of gallium from the substrate to the cap layer, and for activating the magnesium to a former location of the diffused gallium in the substrate — 606

FIG. 6

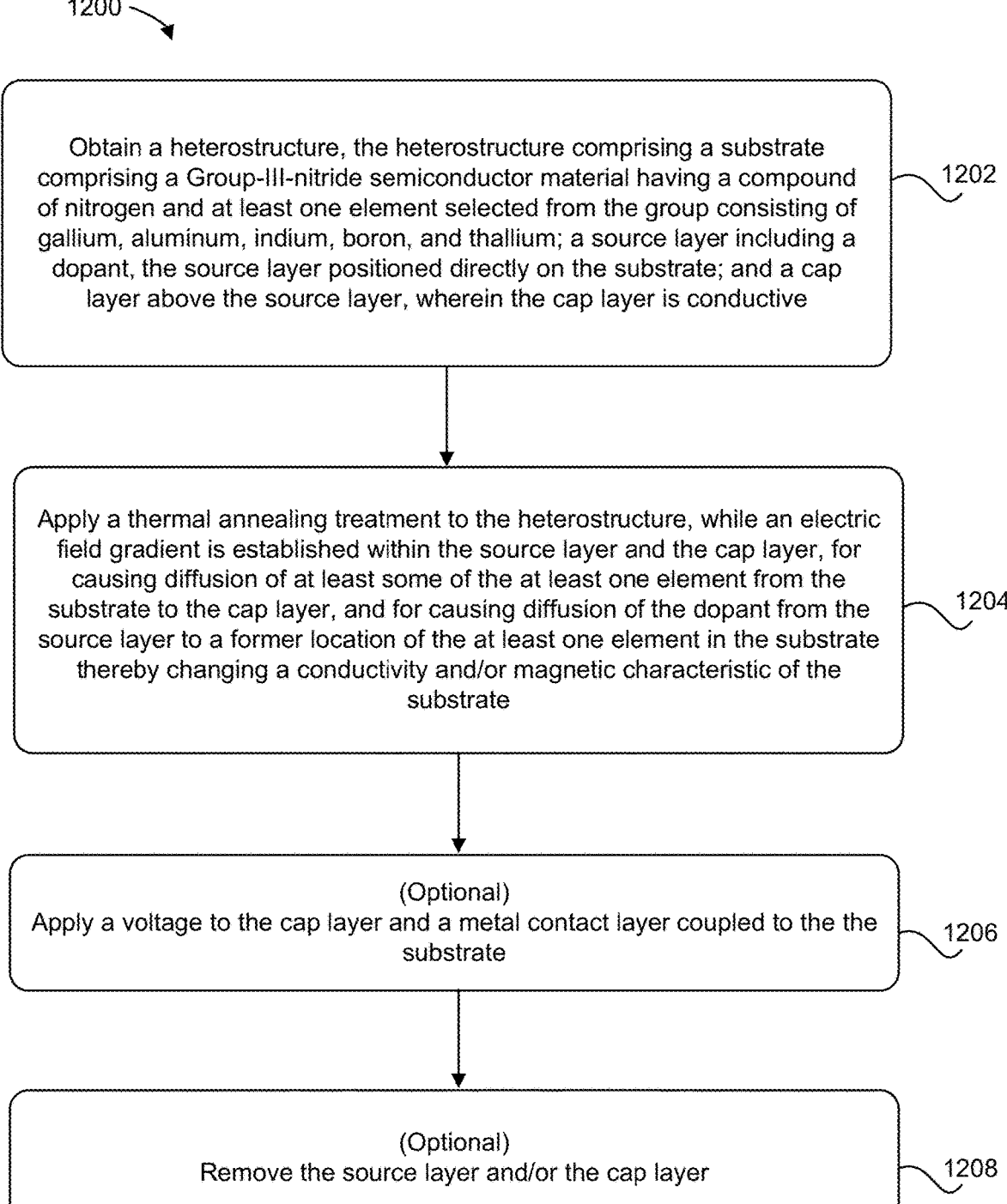

1200

Obtain a heterostructure, the heterostructure comprising a substrate comprising a Group-III-nitride semiconductor material having a compound of nitrogen and at least one element selected from the group consisting of gallium, aluminum, indium, boron, and thallium; a source layer including a dopant, the source layer positioned directly on the substrate; and a cap layer above the source layer, wherein the cap layer is conductive

1202

Apply a thermal annealing treatment to the heterostructure, while an electric field gradient is established within the source layer and the cap layer, for causing diffusion of at least some of the at least one element from the substrate to the cap layer, and for causing diffusion of the dopant from the source layer to a former location of the at least one element in the substrate thereby changing a conductivity and/or magnetic characteristic of the substrate

1204

(Optional)
Apply a voltage to the cap layer and a metal contact layer coupled to the the substrate

1206

(Optional)
Remove the source layer and/or the cap layer

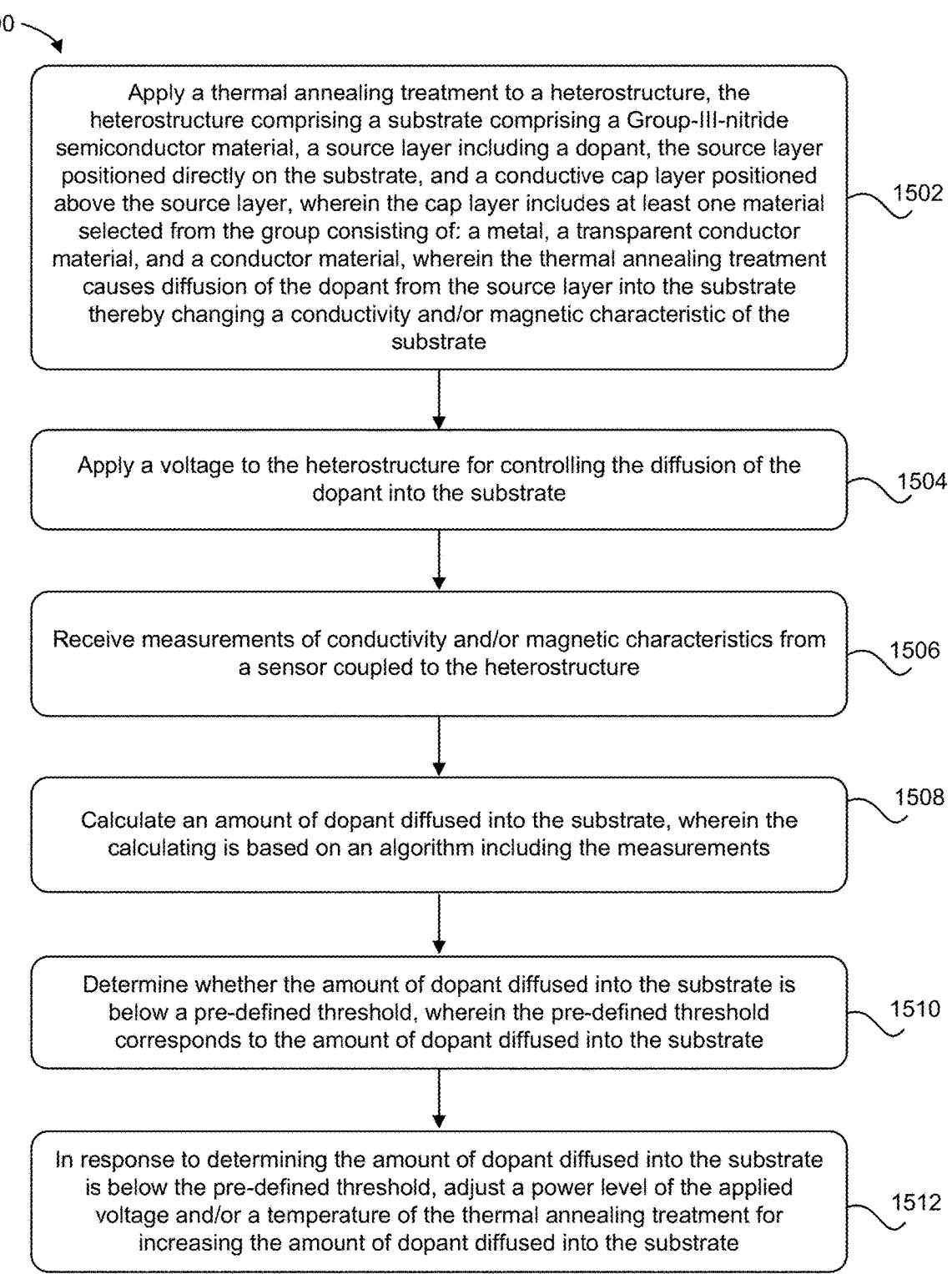

Apply a thermal annealing treatment to a heterostructure, the heterostructure comprising a substrate comprising a Group-III-nitride semiconductor material, a source layer including a dopant, the source layer positioned directly on the substrate, and a conductive cap layer positioned above the source layer, wherein the cap layer includes at least one material selected from the group consisting of: a metal, a transparent conductor material, and a conductor material, wherein the thermal annealing treatment causes diffusion of the dopant from the source layer into the substrate thereby changing a conductivity and/or magnetic characteristic of the substrate

1502

Apply a voltage to the heterostructure for controlling the diffusion of the dopant into the substrate

1504

Receive measurements of conductivity and/or magnetic characteristics from a sensor coupled to the heterostructure

1506

Calculate an amount of dopant diffused into the substrate, wherein the calculating is based on an algorithm including the measurements

1508

Determine whether the amount of dopant diffused into the substrate is below a pre-defined threshold, wherein the pre-defined threshold corresponds to the amount of dopant diffused into the substrate

1510

In response to determining the amount of dopant diffused into the substrate is below the pre-defined threshold, adjust a power level of the applied voltage and/or a temperature of the thermal annealing treatment for increasing the amount of dopant diffused into the substrate

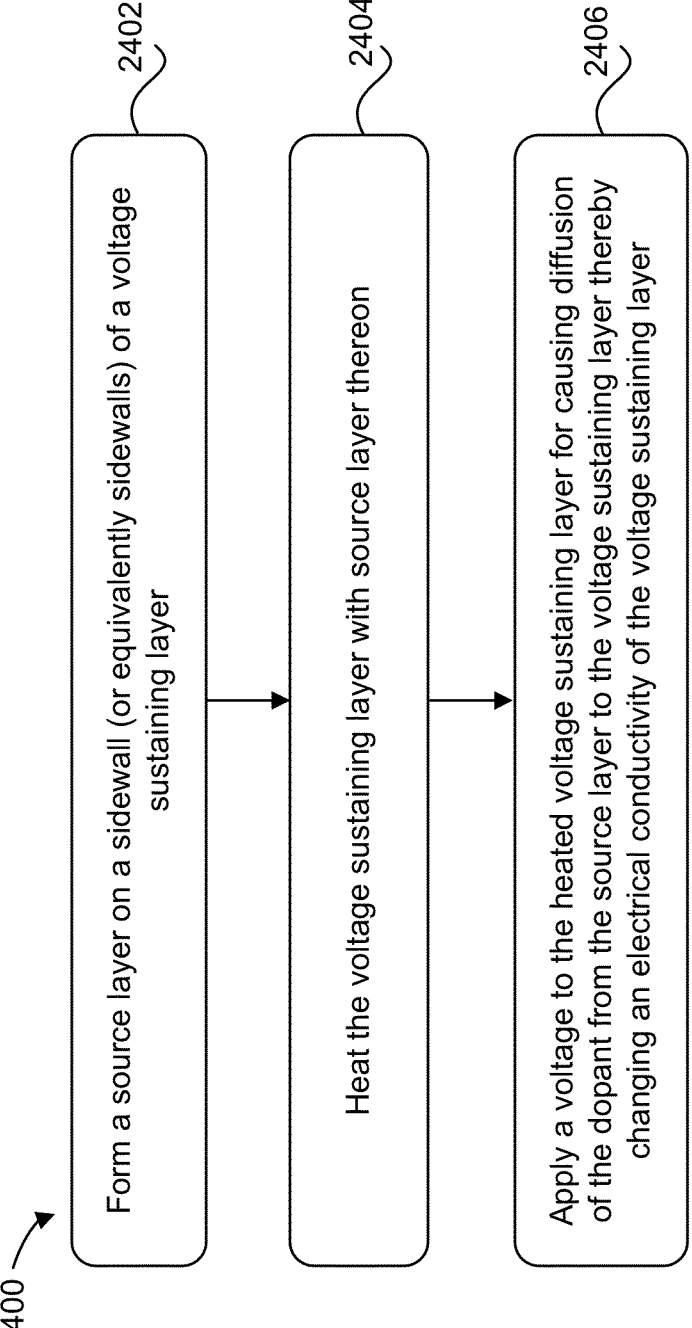

2400

2402

Form a source layer on a sidewall (or equivalently sidewalls) of a voltage sustaining layer

2404

Heat the voltage sustaining layer with source layer thereon

2406

Apply a voltage to the heated voltage sustaining layer for causing diffusion of the dopant from the source layer to the voltage sustaining layer thereby changing an electrical conductivity of the voltage sustaining layer

SUPERJUNCTION DEVICES FORMED BY FIELD ASSISTED DIFFUSION OF DOPANTS

This invention was made with Government support under Contract No. DE-AC52-07NA27344 awarded by the United States Department of Energy. The Government has certain rights in the invention.

FIELD OF THE INVENTION

The present invention relates to superjunction devices, and more particularly, this invention relates to superjunction devices formed by field assisted diffusion of dopants, said superjunction devices being usable, for example, in electronic devices such as semiconductor devices, integrated circuit devices, diodes, etc.

BACKGROUND

There exists a theoretical limit for the ability of semiconductors such as Silicon (Si), Silicon Carbide (SiC), and Gallium Nitride (GaN) to withstand a certain voltage while also having a low switching resistance, e.g., "on" resistance. This limit is generally referred to as the breakdown voltage.

For example, consider a p-n junction diode. There is a limit at which a reverse bias can be applied to the device. The diode has some characteristic breakdown voltage such that a reverse bias voltage applied to the device can be increased only so far before the maximum electric field the material can handle is reached and the onset of avalanche breakdown occurs. This is a material limit, due mainly to the fact that the voltage is applied across one dimension. The voltage is related to the breakdown electric field, and breakdown occurs when the field gets too large and carrier multiplication occurs. If a device is designed to have lower fields for the same voltage, it will survive to higher voltages before the breakdown field is reached and hence a larger breakdown voltage is exhibited. Conversely, if a forward bias is applied, the diode will exhibit some voltage drop, and exhibit heating.

In order to create devices that can withstand higher voltages with lower power loss, semiconductor materials with a larger bandgap have been used, such as diamond, aluminum nitride, and gallium oxide. However, for a variety of reasons including cost and processing considerations, semiconductors such as Si, SiC, and GaN are generally preferred. Moreover, GaN is preferred over Si and SiC for next generation power electronic materials due to its relatively higher critical field strength and electron mobility.

In an effort to increase the effective breakdown voltage, attempts have been made to create a layer in which the voltage is applied to a semiconductor material in two dimensions, e.g., horizontally and vertically. A goal is to create a material that behaves more like it has almost no free carriers in the reverse bias, which is ideal for holding off a large voltage. However, in the forward bias, conduction may only occur in a portion of the layer. Nonetheless, although the conducting area is smaller, the device still benefits from a relatively higher conductivity. The one dimensional material limit is thus overcome for a given material, enabling creation of devices that can withstand higher voltages at lower conduction loss can be created for the given material.

A superjunction device is one which utilizes one or more charge balancing layers (CBLs) to effectively spread the electric field over two or three dimensions within a semiconductor voltage sustaining layer instead of one dimension. Effectively, this increases the maximum voltage a device is capable of withstanding. To take full advantage of ideal material limits, CBLs are typically patterned vertically through the thickness of a film. However, lateral CBLs do exist. To realize such devices requires the ability to control doping patterns precisely in different layers of the device and in three dimensions, which are extremely difficult.

Complex dopant patterning in next generation power semiconductors (e.g., SiC, GaN, diamond, etc.) to create CBL's has proven difficult. Proposed methods include multiple masked ion implantation and regrowth steps, etched trench and ion implantation steps, and etched trench and regrowth steps. However, realization has been hindered by the introduction of impurities and/or defects into the semiconductor crystal.

Consider p-type GaN, which was first demonstrated by metal-organic chemical vapor deposition (MOCVD) growth of Magnesium (Mg) doped GaN in the 1980s, as recognized by a Nobel Prize in Physics in 2014. The importance of p-type doping of GaN is significant, as it has enabled the proliferation of light emitting diodes and laser diodes based on the III-Nitride system (indium nitride (InN) GaN, aluminum nitride (AlN), and alloys thereof). In addition, p-GaN is useful in high power electronics such as diodes and transistors. The high breakdown strength and excellent transport properties of GaN has made GaN an attractive leading candidate to replace silicon Si and SiC power electronics in power grids, electric vehicles, and elsewhere.

Growth of p-type Mg doped GaN is limited in that the Mg is introduced in the final layer of growth. This is due in part to the difficulty in growing a sidewall of a three-dimensional (3D) structure with p-type doped GaN by repeated etching and growing steps, because once the interface is exposed, it becomes susceptible to oxidation and degradation of the sidewall efficacy.

Moreover, post-growth p-type doping of GaN has remained elusive. Conventional p-type doping post growth includes ion implantation into GaN; but these methods are challenging because high-temperature annealing, i.e., greater than 1200° C., is required to "activate" the dopants, and these high temperatures degrade the GaN and severely limit the device fabrication by dictating when the annealing can be performed in the process. One study included a specialized rapid thermal annealing system capable of operating at high pressure and delivering rapid heating pulses to >1300° C. from a baseline of 1100 to 1200° C., with pulses on the order of several seconds. Another recent study showed a high activation percentage by using a precise dose of Mg to limit formation of damage following 1250° C. annealing.

Several drawbacks exist with these approaches; for instance, the specialized rapid thermal annealing system relies on a specialized piece of equipment that operates at high pressure, higher than the atmospheric pressure of nitrogen (N) to prevent N from coming out of the GaN, and also operates at a high temperature of 1100 to 1200° C. with repeated spikes of temperature over 1300° C. in bursts of a few seconds each. The reliance on this highly specific and specialized piece of equipment is limiting. In addition, the high baseline temperature and repeated exposures to greater-than-1300° C. temperatures limit the possibility of pre-processing of the GaN. Thus, the activation cycle of the GaN would be the very first step due to the high temperatures involved; for example, metal could not be added to the GaN prior to activation, and dielectrics could not be added to the GaN prior to activation.

In the latter case using a precise dose of Mg to limit damage, high hole concentrations were only achieved for one specific dose thereby limiting the utility. In both cases, the preferred very high temperatures (>1200° C.) included the use of an AlN cap layer to prevent decomposition of the GaN. Decomposition can begin at 700 to 800° C., but becomes extremely significant at temperatures >1000° C. The combination of the AlN cap to prevent decomposition and the high temperatures used in such systems places a strict limitation on when the implantation and activation can be performed in the process. Thus, the implantation and activation preferably are completed as a first step before any etching or metallization.

Moreover, ion implantation tends to cause damage to the crystal lattice of the GaN. The damaging effects are due to the high energy of the ions combined with the high temperatures of the implantation process because the diffusivity of Mg in GaN is so low.

Furthermore, ion implantation tends to be limited to line of sight, thereby limiting the utility thereof mainly to 2D structures. Thus, ion implantation onto the sidewall of a vertical 3D structure would be extremely challenging to the extent that ion implantation onto the sidewall of a 3D structure may not be possible.

Another option is to use diffusion to dope the GaN crystal with Mg. Early reports of diffusion of Mg into GaN include methods requiring long time periods (many hours), elevated temperatures, and have produced decidedly mixed results suggesting that other Ga—Mg compounds were formed. Moreover, the low diffusivity of Mg in GaN at high temperatures of >1000° C. is essentially immeasurable. The diffusivity is so low, the Mg does not move. Moreover, these early reports of using high temperatures for diffusing Mg did not appear to effectively dope the GaN. In addition, a diffusion process that enables doping of virtually any three-dimensional topology remains elusive.

For these reasons, it would be desirable to dope semiconductor layers using diffusion at a lower temperature and shorter times to create superjunction devices. Moreover, selective area processing that could be applied at various stages of processing would be desirable. The diffusion process, if improved in the ways presented hereinbelow (e.g., lower temperature and shorter time), would be further advantageous for the ease of doping three-dimensional devices.

SUMMARY

By utilizing the field-assisted diffusion method, CBLs can be achieved in semiconductor materials where traditional means of fabrication cannot be applied.

Considering this, the field-assisted diffusion methodology presented herein offers a simpler solution with lower cost and readily available equipment.

Additionally, by measuring the film impedance and/or optical properties during diffusion, a feedback mechanism can be established such that tight control of the resulting doping profile can be achieved.

An apparatus, in accordance with one embodiment, includes a superjunction device having a voltage sustaining layer formed of a semiconductor material and a dopant in the voltage sustaining layer. The dopant is for distributing an electric field within the voltage sustaining layer. The dopant is more concentrated along a sidewall of the voltage sustaining layer than toward a center of the voltage sustaining layer, the sidewall extending at least a portion of the distance between a top surface and a bottom surface of a voltage sustaining layer.

A method of electric field-enhanced dopant diffusion to form a superjunction device, in accordance with one embodiment, includes forming a source layer on a sidewall of a voltage sustaining layer comprised of a semiconductor material, the source layer comprising a dopant. The voltage sustaining layer with source layer thereon is heated, and a voltage is applied to the heated voltage sustaining layer for causing diffusion of the dopant from the source layer to the voltage sustaining layer thereby changing an electrical conductivity of the voltage sustaining layer.

Other aspects and advantages of the present invention will become apparent from the following detailed description, which, when taken in conjunction with the drawings, illustrate by way of example the principles of the invention.

BRIEF DESCRIPTION OF THE DRAWINGS

FIG. 2A is a schematic diagram of a structure having concentration gradient of a dopant in a substrate, according to one embodiment.

FIG. 2B is a schematic diagram of a structure having concentration gradient of a dopant in a sidewall of a substrate, according to one embodiment.

FIG. 2C is a schematic diagram of a product having an ohmic contact, according to one embodiment.

FIG. 6 is a flow chart of a method, according to one embodiment.

FIG. 12 is a flow chart of a method for field-assisted interfacial diffusion, according to one embodiment.

FIG. 15 is a flowchart of a method, according to one embodiment.

FIG. 24 is a flowchart of a method for electric field-enhanced dopant diffusion to form a superjunction product, in accordance with one embodiment.

FIG. 25 parts (a)-(e) graphically depict a method for electric field-enhanced dopant diffusion to form a superjunction product, in accordance with one illustrative embodiment.

DETAILED DESCRIPTION

Figure 1B:
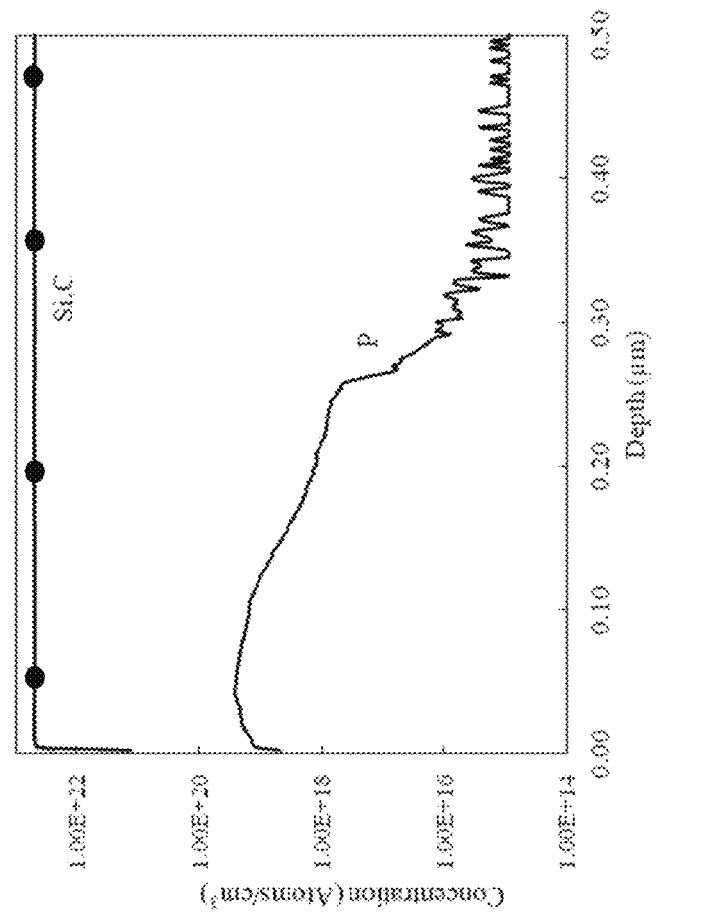
FIG. 1B is a plot of diffusion of P into a SiC layer.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

As also used herein, the term "about" when combined with a value refers to plus and minus 10% of the reference value. For example, a length of about 1 μm refers to a length of 1 μm±0.1 μm.

It is also noted that, as used in the specification and the appended claims, wt % is defined as the percentage of weight of a particular component is to the total weight of the mixture. Moreover, mol % is defined as the percentage of moles of a particular component relative to the total moles of the mixture.

Unless expressly defined otherwise herein, each component listed in a particular approach may be present in an effective amount. An effective amount of a component means that enough of the component is present to result in a discernable change in a target characteristic of the final product in which the component is present, and preferably results in a change of the characteristic to within a desired range. One skilled in the art, now armed with the teachings herein, would be able to readily determine an effective amount of a particular component without having to resort to undue experimentation.

The following description discloses several preferred embodiments of superjunction devices and methods of making the same by field-assisted interfacial doping diffusion and/or related systems and methods.

In one general approach, an apparatus includes a superjunction device having a voltage sustaining layer formed of a semiconductor material and a dopant in the voltage sustaining layer. The dopant is for distributing an electric field within the voltage sustaining layer. The dopant is more concentrated along a sidewall of the voltage sustaining layer than toward a center of the voltage sustaining layer, the sidewall extending at least a portion of the distance between a top surface and a bottom surface of a voltage sustaining layer.

In another general approach, a method of electric field-enhanced dopant diffusion to form a superjunction device includes forming a source layer on a sidewall of a voltage sustaining layer comprised of a semiconductor material, the source layer comprising a dopant. The voltage sustaining layer with source layer thereon is heated, and a voltage is applied to the heated voltage sustaining layer for causing diffusion of the dopant from the source layer to the voltage sustaining layer thereby changing an electrical conductivity of the voltage sustaining layer.

A list of acronyms used in the description is provided below.

AC Alternating current
AFM Atomic force microscopy
Al Aluminum
ALD Atomic layer deposition
3D Three dimensional
Au Gold
B Boron
Br Bromine
C Celsius
CBL Charge balanced layer
Cl Chlorine
DC Direct current
CVD Chemical vapor deposition
GAID Gallidation assisted impurity diffusion
eV Electron volts
F Fluorine
FAID Field assisted interfacial doping FASSIE Field-assisted solid ion exchange
FinFET Fin-shaped field effect transistor
Ga Gallium
GaN Gallium Nitride
I Iodine
I-V Current-voltage
JFET Junction gate field effect transistor
JTE Junction terminal extensions
K Kelvin
LED Light emitting diode
μm Micron
Mg Magnesium
MIS Metal-insulator-semiconductor
MOCVD Metal organic chemical vapor deposition
MOSFET Metal oxide silicon field effect transistor
MV Megavolts
N Nitrogen
Ni Nickel
nm Nanometer
O Oxygen
Pd Palladium
Pt Platinum
PVD Plasma vapor deposition
SAID Silicidation-assisted impurity doping.
SEM Scanning electron microscopy
Se Selenium
Si Silicon
SiC Silicon Carbide
SIMS Secondary ion mass spectrometry
Te Tellurium
V Vacancy site/Volts
VAID Vacancy-assisted ion diffusion
WF Work function
Y Yttrium

Overview and Examples of Field-Assisted Interfacial Diffusion

According to various embodiments, a method is described for doping gallium nitride p-type with diffusion doping. In particular, some embodiments describe diffusing magnesium (Mg) into n-type or intrinsic gallium nitride (GaN) at temperatures as low as 800° C. or lower in order to create p-type gallium nitride having a high carrier concentration. Other embodiments may include diffusing into p-type gallium nitride to create regions with higher p-type doping. P-type doping of GaN is useful for numerous electronic and optoelectronic devices that rely on p-n or p-i-n junctions to create a region within a semiconductor with an electric field such as laser diodes, light emitting diodes, switches, transistors, power diodes, etc. Moreover, GaN is a next generation power electronics material; for example, GaN may be useful in grid level switching, etc.

P-type doping of GaN is preferred for numerous electronic and optoelectronic devices that rely on p-n or p-i-n junctions to create a region within a semiconductor with an electric field such as laser diodes, light emitting diodes, switches, transistors, power diodes, amongst others. Typically, Mg-doped p-GaN can be produced during crystal growth or via ion implantation and activation, though the latter requires very high activation temperatures (>1200° C.) and specialized equipment. P-type doping of GaN has been a long-standing challenge.

One embodiment of the present invention includes a method for relatively low temperature (<1000° C.) diffusion of Mg into GaN by using a source layer such as a Mg-containing layer, as well as a cap layer, e.g., of platinum (Pt), palladium (Pd), gold (Au), yttrium (Y), or nickel (Ni), to modify the thermodynamics of the system and enhance the diffusion rate into GaN and may be employed on three-dimensional (3D) structures. In various approaches, p-GaN with hole concentrations $>1\times10^{17}$ cm$^{-3}$ may be achievable, which may be comparable to state-of-the-art hole concentrations achieved using conventional grown p-type GaN.

Metal contacts to n-GaN are typically annealed in the range 700-1000° C., so temperatures less than 1000° C. may avoid metallic degradation. In preferred approaches, a temperature of 800° C. or below for a short duration of time (<1 hour, depending on the temperature) may limit decomposition of GaN to insignificant levels. Moreover, a diffusion process is preferable that would enable doping of virtually any 3D topology. Deposition of the diffusion source would also allow patterning using standard photolithographic techniques. Finally, diffusion should not pose the same issues of lattice damage created by ion implantation.

The advantages of various methods described herein include, a) the methods do not use specialized equipment, b) the temperature range for diffusion includes temperatures less than 1000° C., preferably less than 800° C., to allow better integration with post-doping processing, and c) 3D structures such as vertical pillars can be doped. The structure of p-type GaN with Mg filling some of the Ga sites formed by methods described herein has essentially no damage to the crystal lattice compared to the original pre-doped GaN. Moreover, the p-type doping of GaN by methods described herein allows further processing of the product, e.g., addition of metal film, dielectric layer, etc. after the activation cycle.

Various embodiments described herein demonstrate an effective technique for low temperature and short-time diffusion doping of GaN with Mg. In some approaches, the method is a vacancy-assisted ion diffusion (VAID) process for doping a material with a dopant. In one approach, the process includes gallidation-assisted impurity diffusion (GAID). A comparable process has previously been demonstrated in silicon carbide (SiC), using silicidation of metal contacts, e.g., Silicidation Assisted Impurity Doping (SAID) as shown in the process 100 of FIG. 1A. As silicon (Si) 112 diffuses from a SiC layer 106 through the $P_2O_5$ layer 104 to the nickel (Ni) layer 102, a void ($V_{Si}$) 108 remains in the SiC layer 106. Phosphorus (P) 110 from the phosphorous pentoxide ($P_2O_5$) layer 104 diffuses to the void ($V_{Si}$) 108 in the SiC layer 106. In some instances, Si 112 may diffuse from the SiC layer 106 to the $P_2O_5$ layer 104.

Figure 1A:
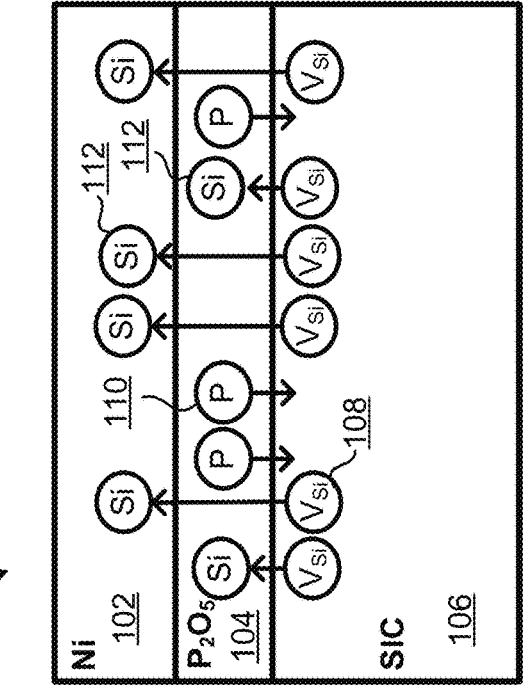
FIG. 1A is a schematic diagram of silicidation assisted impurity doping.

FIG. 1B is a plot of the concentration of components (y-axis) in the SiC layer at increasing depths (x-axis) to show the diffusion of P into the SiC layer. The top curve (●) shows the concentration of Si and C in the SiC layer. The lower curve shows the concentration of P in the SiC layer and confirms the presence of P in the SiC layer following diffusion by the process 100 described in FIG. 1A.

FIG. 2A depicts a product 200 having a doped Group-III-nitride material, in accordance with one embodiment. As an option, the present product 200 may be implemented in conjunction with features from any other embodiment listed herein, such as those described with reference to the other FIGS. Of course, however, such product 200 and others presented herein may be used in various applications and/or in permutations which may or may not be specifically described in the illustrative embodiments listed herein. Further, the product 200 presented herein may be used in any desired environment.

In one embodiment, a product 200 includes a structure 202 including a material of a Group-III-nitride 206 having a dopant 204 along at least a portion of the structure 202. A concentration of the dopant 204 in the structure 202 has a concentration gradient characteristic of diffusion of the dopant inward (arrow) from at least a portion of a surface 208 of the structure 202 in a direction substantially normal to the portion of the surface. For example, diffusion of the dopant from at least a portion of the surface 208 of the structure 202 is in a z-direction substantially perpendicular to the x-y plane of a portion of the surface 208 of the structure 202.

Moreover, the structure 202 has less than 1% decomposition of the Group-III-nitride 206 at the surface 208 of the structure 202. In one approach, the structure has less than 1% thermal degradation of the Group-III-nitride material at the surface of the structure. In one approach, the structure has less than 1% loss of nitrogen from the Group-III-nitride material at the surface of the structure as may be measured by the stoichiometry of the Group-III element to nitride (e.g., for GaN, measure the Ga to N at the surface of the structure). As would be understood by one skilled in the art, thermal degradation of a doped Group-III-nitride is manifested by a loss of nitrogen from the structure. In some approaches, the structure has substantially no degradation of the Group-III-nitride material at the surface of the structure where the surface may have the greatest concentration of dopant following diffusion of the dopant into the structure.

In one approach, as shown in FIG. 2B, the structure 232 has a vertical sidewall 240 extending along a z-direction oriented substantially perpendicular to the plane of deposition (x-y plane) of the structure. A concentration of the dopant 234 extends inward (arrow) from the vertical sidewall 240 such that the material 236 has a concentration gradient characteristic of diffusion of the dopant inward from at least a portion of a surface 238 of the vertical sidewall 240 in a direction substantially parallel to the x-y plane. In one approach, diffusion of the dopant 234 may be at an angle Θ of about 90° of normal to the x-y plane of deposition of the structure 232. In some approaches, diffusion of the dopant inward from at least a portion of the vertical sidewall may be at substantially 0° tilt from normal onto the sidewall, or essentially 90° of normal.

In various approaches, the structure has essentially no damage characteristic of ion implantation into the voltage sustaining layer, such as semiconductor lattice defects that necessarily occur due to ion implantation. In one approach, the structure has essentially no damage to the crystal lattice of the Group-III-nitride material. Ion implantation generates both Group-III vacancies and nitride vacancies. For example, ion implantation of a GaN substrate generates gallium (Ga) and nitrogen (N) vacancies. While Ga vacancies are desirable for activation, N vacancies are detrimental to p-type doping because N vacancies are n-type defects. In some approaches, the structure does not have N vacancies in the substrate material following diffusion of the dopant into the substrate.

Further, ion implantation forms detrimental defect complexes in the Group-III-nitride material. Thus, in some approaches, the structure has essentially no detrimental defect complexes in the Group-III-nitride material following diffusion of the dopant into the substrate.

In one approach, the Group-III-nitride includes a compound of a nitrogen and at least one element of the following: gallium, aluminum, indium, boron, scandium, thallium, etc. In one approach, the Group-III-nitride may be a binary compound, for example GaN, InN, AlN, BN, TlN, etc. In one approach, the Group-III-nitride may be a ternary compound, for example, InGaN, AlGaN, AlInN, etc. In one approach, the Group-III-nitride may be a quaternary compound, for example AlInGaN.

As shown in FIGS. 2A-2B, in some approaches, the doped-Group-III-nitride 206, 236 may have a p-type conductivity along at least the portion of the structure 202, 232. In one approach, the dopant may include magnesium.

In one approach, the product may include a junction termination extension (JTE) as demonstrated by a concentration gradient of the dopant in the Group-III-nitride material of the structure. In one approach, the structure 232 may include a JTE as shown in FIG. 2B at a vertical sidewall where the dopant 234 has a concentration gradient characteristic of diffusion of the dopant inward from at least a portion of a surface 238 of the vertical sidewall 240 in a direction substantially parallel to the x-y plane.

In one approach, the product may include an ohmic contact. As shown in FIG. 2C, a product 250 may include an ohmic contact having a structure 252, a layer 258 of a source material 262 on the structure 252 and the layer 258 being positioned relative to the structure 252, and a metal layer 260 sandwiching the layer 258 of source material 262 between the structure 252 and the metal layer 260. In one approach, the layer 258 is directly on a surface of the structure 252.

The structure 252 may include a material 256 of Group-III-nitride having a dopant 254. In one approach, the dopant 254 may be present in the material 256 in a concentration gradient characteristic of diffusion of the dopant inward from the source layer 258. In one approach the layer of source material of the dopant of the structure is positioned directly on the surface of the structure where the greatest concentration of dopant is present in the structure.

In one approach, the source material 262 includes the dopant 254. In preferred approaches, the source material 262 of the layer 258 positioned above the structure 252 includes magnesium.

In one approach of the product having an ohmic contact, the layer of source material of the dopant may be a layer in the metal layer. In another approach of the product having an ohmic contact, the layer of source material of the dopant may be mixed in the metal layer.

In some approaches, the metal 264 of the metal layer 260 may include at least one of the following: platinum, gold, nickel, palladium, a combination thereof. etc. These approaches are by way of example only and are not meant to be limiting in any way.

In one approach, the structure may include a doped-Group-III-nitride that has an n-type conductivity along at least a portion of the structure. In various approaches, a dopant of the structure may include at least one of the following: silicon, germanium, tin, carbon, etc.

In some approaches, dopant of the Group-III-nitride material may include at one or more rare earth dopants, e.g., a lanthanide such as europium, samarium, erbium, etc.

In some approaches, dopant of the Group-III-nitride material may include at least one of the following: manganese, chromium, iron, nickel, vanadium, cobalt, gadolinium, etc.

Figure 3:
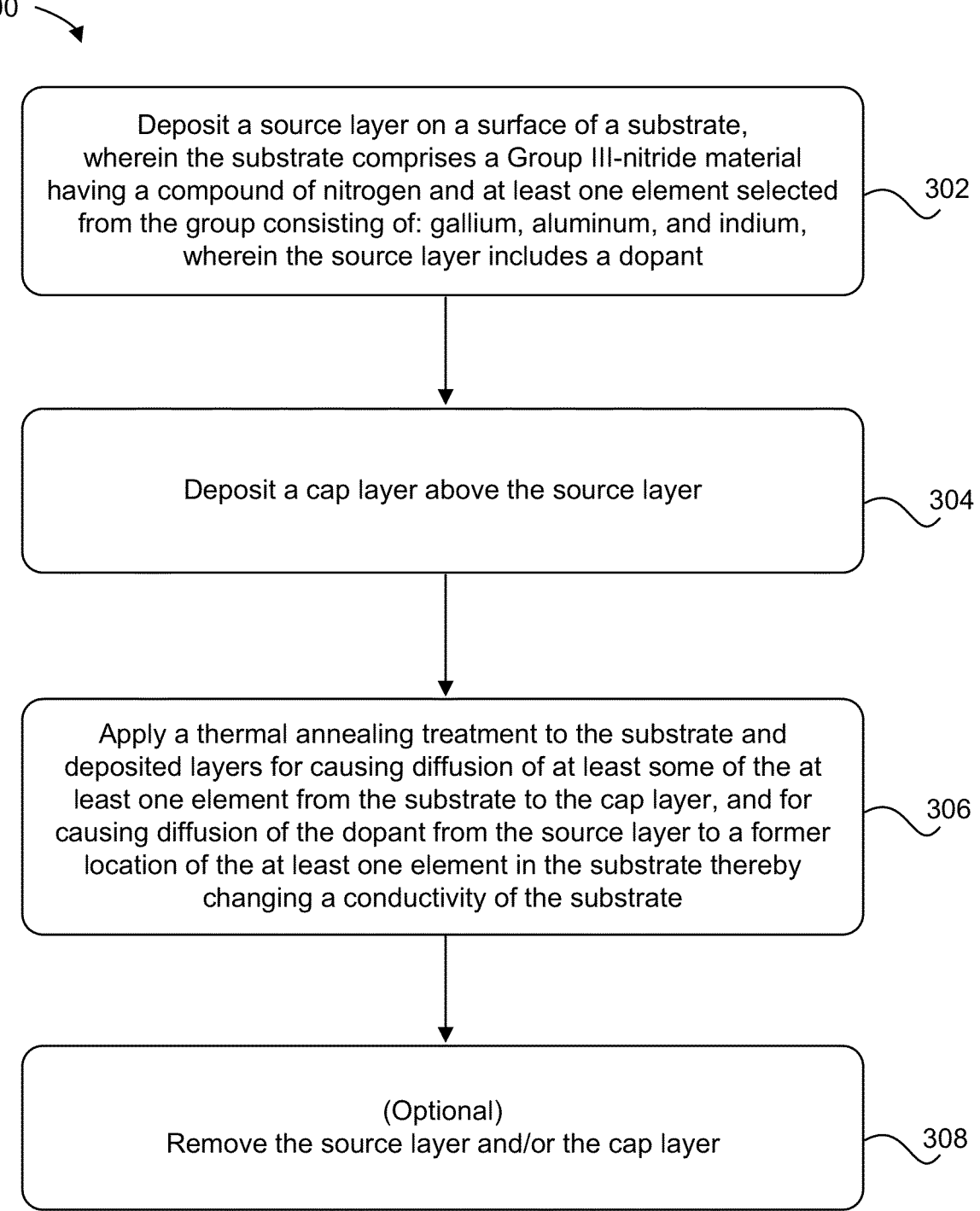
FIG. 3 is a flow chart of a method, according to one embodiment.

FIG. 3 shows a method 300 for Group-III-nitride assisted impurity diffusion, in accordance with one embodiment. As an option, the present method 300 may be implemented to dope other materials such as those shown in the other FIGS. described herein. Of course, however, this method 300 and others presented herein may be used to form structures for a wide variety of devices and/or purposes which may or may not be related to the illustrative embodiments listed herein. Further, the methods presented herein may be carried out in any desired environment. Moreover, more or less operations than those shown in FIG. 3 may be included in method 300, according to various embodiments. It should also be noted that any of the aforementioned features may be used in any of the embodiments described in accordance with the various methods.

Method 300 begins with step 302 of depositing a source layer on a surface of a substrate, wherein the substrate comprises a Group-III-nitride material having a compound of nitrogen and at least one of the following: gallium, aluminum, indium, boron, scandium, thallium, etc. In one approach, the source layer includes a dopant.

In some approaches, method 300 may include the following materials: InP, GaAs, $Ga_2O_3$, BN, Si, Ge, diamond, SiC, etc.).

According to an exemplary embodiment of this process, a GaN substrate may be coated with a two-layer structure including a source layer and a cap layer. In one approach, the source layer (e.g., a first layer, a layer of dopant, etc.) may be in contact with the GaN substrate. In one approach, the dopant of the source layer includes magnesium. In one approach the source layer may be a solid Mg source that may be selected from pure Mg, or compounds including Mg such as Mg halides (e.g., $MgF_2$, $MgCl_2$, $MgBr_2$, $MgI_2$, etc.), Mg oxides and chalcogenides (e.g., MgO, MgS, MgSe, MgTe, etc.), Mg nitrides (e.g., $Mg_2N_3$, $Mg_3N_2$. $Mg_3Al_2N_4$, etc.), Mg carbides (e.g., $MgCN_2$, etc.), Mg hydrides (e.g., $MgH_2$ and Mg borohydrides, $MgB_2$, etc.), and their alloys. For example, in one approach, alloys of AlMgN may include various ratios of Al to Mg, e.g., $Al_xMg_{1-x}N_y$, where $0>x>1$ for a given N content, y. In one approach, the source layer may include magnesium hydride ($MgH_2$), etc. Table 1 lists some examples of Mg compound candidates for the solid Mg source but is not meant to be limiting. In some approaches, pure Mg may be included as a solid Mg source. In some processes, preferably, none of these Mg sources react with GaN without a metal; thus, a metal cap layer may help pull the Ga out of the GaN layer. In preferred approaches, the Mg source has a melting point that is greater than 1000° C., but lower-melting-point Mg source materials may be used in conjunction with lower temperature processes, e.g., below the melting point of the respective Mg source material.

In some approaches, the source layer may include an n-type dopant. Exemplary examples of n-type dopants of the source layer for diffusing into the substrate during application of thermal treatment include the following: silicon, germanium, tin, carbon, combinations thereof, etc.

In one approach, the source layer may include a rare earth dopant for diffusing into the Group-III-nitride substrate. Exemplary examples of rare earth dopants include the lanthanides such as europium, samarium, erbium, combinations thereof, etc.

For application in spintronic devices, the process described herein provides a method to fabricate doped Group-III-nitrides. In one approach, the source layer may

TABLE 1

| Candidates of Mg Compounds | | | | | |
|---|---|---|---|---|---|
| Mg Compound | Melting Pt ° C. | Boiling Pt ° C. | Decom-position ° C. | Soluble | Hazard |
| $Mg_3N_2$ | | | 800 | | |
| MgO | 2852 | 3600 | | water, acid, ammonia | 1/0/0 |
| $MgF_2$ | 1263 | 2260 | | | 3/0/0 |

TABLE 1-continued

| Candidates of Mg Compounds | | | | | |
|---|---|---|---|---|---|
| Mg Compound | Melting Pt ° C. | Boiling Pt ° C. | Decom-position ° C. | Soluble | Hazard |
| $MgCl_2$ | 714 | 1412 | 300 | water, acetone, pyridine | 1/0/0 |
| $MgBr_2$ | 711 | 1250 | yes | ethanol, methanol | 1/0/0 |
| $MgI_2$ | 637 | | yes | water, ether, alcohol, ammonia | 3/1/1 | include a dopant optimal for spintronic processes for diffusion into the Group-III-nitride (e.g., GaN) substrate. Exemplary examples of solid dopants for spintronic devices include the following: manganese, chromium, iron, nickel, vanadium, cobalt, gadolinium, combinations thereof, etc.

In various approaches, the source layer may be deposited on the substrate to form a vertical sidewall oriented in a z-direction substantially perpendicular to an x-y plane of deposition of the substrate. In one approach, the substrate may be a pillar, vertical structure having an aspect ratio h:w of greater than one, etc. and the source layer may be deposited on a vertical side of the substrate thereby forming a vertical sidewall between the substrate and the source layer.

Method 300 includes a step 304 of depositing a cap layer above the source layer relative to the source layer. The cap layer (e.g., a second layer, a metal layer, etc.) may be a metal or another material that is known to react with a Group-III-nitride to form a Group-III metal compound during thermal annealing. For example, the cap layer may include a metal that is known to react with GaN to form a gallium metal compound (e.g., gallide) during thermal annealing such as Pt, Pd, Au, Ni, etc. In one approach, the cap layer may include a combination or alloy of such metals. In preferred approaches, the cap layer includes metals that are known to react with GaN to form gallides (e.g., $Pt_2Ga$) at temperatures as low as 400° C.

Moreover, the metal of the cap layer preferably is one known not to form a nitride with the Group-III-nitride, so that the metal does not pull any of the nitrogen out of the Group-III-nitride substrate layer. The metal of the cap layer does not preferably react with the nitride of the Group-III-nitride substrate layer. For example, in exemplary approaches, a metal does not form a nitride with GaN and thus nitrogen is not pulled out of the GaN layer.

In various approaches, metals for the second layer (e.g., cap layer) that are favorable in terms of being thermally stable at the desired annealing temperature include metals with a melting point greater than 1000° C. In some approaches, the metal(s) included in the second layer have a melting point greater than 1100° C. In preferred approaches, the metal included in the cap layer has a melting point high enough to withstand the temperatures of the annealing step.

In some approaches the metal(s) included in the second layer have a negative enthalpy of formation ($\Delta H°_f$) when reacting with GaN to form gallides and are thus thermodynamically favorable. Illustrative examples of metals in terms of having preferable melting points for the second layer include Ni, Au, Pt, Pd, etc. Table 2 lists values of $\Delta H°_f$ of metal-rich gallide and aluminide intermetallic phases. The metals listed in the first column are examples of illustrative metals for a second layer in which a more negative ΔH is more favorable thermodynamically.

TABLE 2

Enthalpy values of metal-rich gallide and aluminide intermediate phases

| Metal | Phase | ΔH ° f (kJ/mol · atom) |
|-------|-------|------------------------|
| Ni | $Ni_3Ga$ | −26.5 |
| | $Ni_3Al$ | −41.6 |
| Pd | $Pd_2Ga$ | −64 |
| | $Pd_2Al$ | −87 |
| Au | AuGa | −24 |
| | AuAl | −36 |
| Pt | $Pt_3Ga$ | −46 |
| | $Pt_3Al$ | −50 |

In various approaches, illustrative examples of metals that react with GaN to form a gallide but also do not react with GaN to form a nitride include Pd, Pt, Ni, Au, etc. Exemplary metals to be included in a cap layer include Au, Y, Pd, and Pt.

In one approach in which the substrate and source layer form a vertical sidewall therebetween, the cap layer may be deposited on the vertical side of the source layer opposite the vertical sidewall of the source layer adjacent to the substrate.

Step 306 of method 300 includes applying a thermal annealing treatment to the substrate and deposited layers for causing diffusion of at least some of the at least one element from the substrate to the cap layer, and for causing diffusion of the dopant from the source layer to a former location of the at least one element in the substrate thereby changing a conductivity of the substrate. One approach of step 306 includes causing diffusion of the dopant from the source layer to a former location of the at least one element in the substrate thereby changing a magnetic characteristic of the substrate. Another approach of step 306 includes causing diffusion of the dopant from the source layer to a former location of the at least one element in the substrate thereby changing a conductivity and a magnetic characteristic of the substrate. After deposition of the source layer and cap layer on the Group-III-nitride layer, the wafer may be subjected to thermal annealing.

In various approaches, applying the thermal annealing treatment causes diffusion of at least some molecules of the at least one element from the substrate to the cap layer, and causes diffusion of at least some molecules of magnesium from the source layer to the former location of some of the molecules of the at least one element in the substrate. In some approaches, applying the thermal annealing treatment may change the conductivity of the substrate from a n-type conductivity to a p-type conductivity.

A temperature for the thermal annealing treatment of step 306 may be in a range of greater than 200° C. to less than 1000° C. In preferred approaches, a temperature for the thermal annealing may be in a range of greater than 600° C. to less than 800° C. In an exemplary approach, a temperature for the thermal annealing treatment is preferably above 400° C.

The time duration of thermal annealing may be less than an hour, less than 30 minutes, less than 20 minutes, less than 15 minutes, less than 10 minutes, less than 5 minutes, less than 3 minutes, etc. for example, the time duration of annealing may be about 15 minutes, 14, 13, 12, 11, 10, 9, 8, 7, 6, 5, 4, 3, 2, 1, or fractions thereof. The process may include one annealing step, or several such annealing steps. The annealing time is considered to be the total time at temperature in a rapid thermal annealing system. In other systems, the time for the ramp up and down to the temperature may be considered if this time is comparable to the total time at temperature.

In some approaches, step 306 of applying a thermal annealing treatment may occur in an atmosphere, where the atmosphere includes hydrogen. In one approach, the thermal annealing treatment in an atmosphere including hydrogen may happen before diffusion of the Group-III-element to form a metal compound in the cap layer and the diffusion of the dopant to the substrate of Group-III-nitride. In one approach, the thermal annealing treatment in an atmosphere including hydrogen may happen during diffusion of the Group-III-element to form a metal compound in the cap layer and the diffusion of the dopant to the substrate of Group-III-nitride. In another approach, the thermal annealing treatment in an atmosphere including hydrogen may happen before and during diffusion of the Group-III-element to form a metal compound in the cap layer and the diffusion of the dopant to the substrate of Group-III-nitride.

In some approaches, hydrogen may be incorporated in the substrate of Group-III nitride from a source layer having $MgH_2$, a source layer having other hydrogen-containing compounds, from thermal annealing treatment in an atmosphere of hydrogen, etc. In these approaches, an additional annealing step after diffusion may be used to remove hydrogen from the doped Group-III substrate. In one approach, method 300 may include a step of removing hydrogen from the substrate after step 306 of the thermal annealing treatment. For example, hydrogen may be removed from a doped GaN substrate in a post diffusion activation step. In one approach, an additional thermal annealing treatment at a temperature around 800° C. (e.g., in a range of about 600° C. to about 900° C.) for a duration of time. In some approaches, the duration of time may be at least one hour to at about 12 hours, as would be generally understood by one skilled in the art.

In some approaches, step 306 of applying a thermal annealing treatment causes a diffusion of a dopant in the source layer to extend a concentration of the dopant inward from the surface of the substrate from the source layer.

In one approach, where the substrate and source layer form a vertical sidewall (e.g., the substrate is a pillar, vertical structure having an aspect ratio height:width of greater than 1), step 306 of applying a thermal treatment to the structure causes a diffusion of the dopant of the source layer to extend a concentration of the dopant inward from the source layer. The concentration gradient may be characteristic of diffusion of the dopant inward from at least a portion of a surface of the vertical sidewall in a direction substantially parallel to the x-y plane. In one approach, diffusion of the dopant may be at an angle of about 90° of normal to the x-y plane of deposition of the structure (as illustrated in vertical structure of FIG. 2B). In some approaches, diffusion of the dopant inward from at least a portion of the vertical sidewall may be at substantially 0° tilt from normal onto the sidewall, or essentially 90° of normal.

Figure 4:
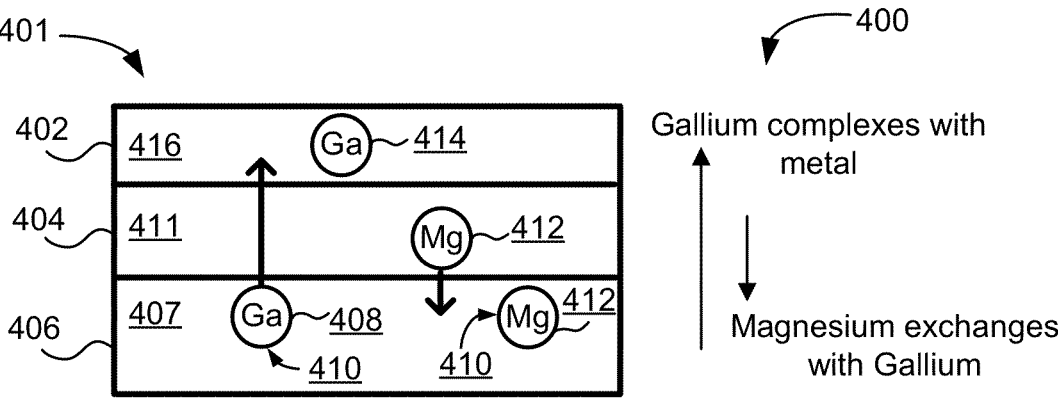
FIG. 4 is a schematic diagram of gallidation-assisted impurity diffusion, according to one embodiment.

FIG. 4 depicts a schematic drawing of a process 400 for Gallidation Assisted Impurity Diffusion (GAID), in accordance with one embodiment. As an option, the present process 400 may be implemented in conjunction with features from any other embodiment listed herein, such as those described with reference to the other FIGS. Of course, however, such process 400 and others presented herein may be used in various applications and/or in permutations which may or may not be specifically described in the illustrative embodiments listed herein. Further, the process 400 presented herein may be used in any desired environment.

As shown in the schematic diagram in FIG. 4, a source layer 404 may be positioned above a substrate 406 of GaN 407. In some approaches, the source layer 404 may include a form of magnesium 411 (e.g., $MgF_2$, Mg, etc.). A cap layer 402 (e.g., second layer, metal layer, etc.) may be positioned above the source layer 404. The cap layer 402 may include metals 416 such as the following: Pt, Au, Ni, Pd, Y, etc.

In one approach where the source layer 404 is a Mg source layer, the Mg molecules 412 exchange locations at the Gallium (Ga) vacancy 410 when the Ga 408 diffuses from the GaN 407 of the substrate 406 to complex to form a compound 414 with a metal 416 in the cap layer 402.

In one approach, the thermal annealing treatment causes a diffusion of Ga 408 from the substrate 406 to the cap layer 402, where the Ga 408 forms a gallium metal compound 414 with the metal 416 of the cap layer 402. For example, and not meant to be limiting in any way, a cap layer having the metal platinum (Pt), may form the compound $Pt_2Ga$ in the cap layer with the Ga diffused from a GaN substrate.

Figure 5:
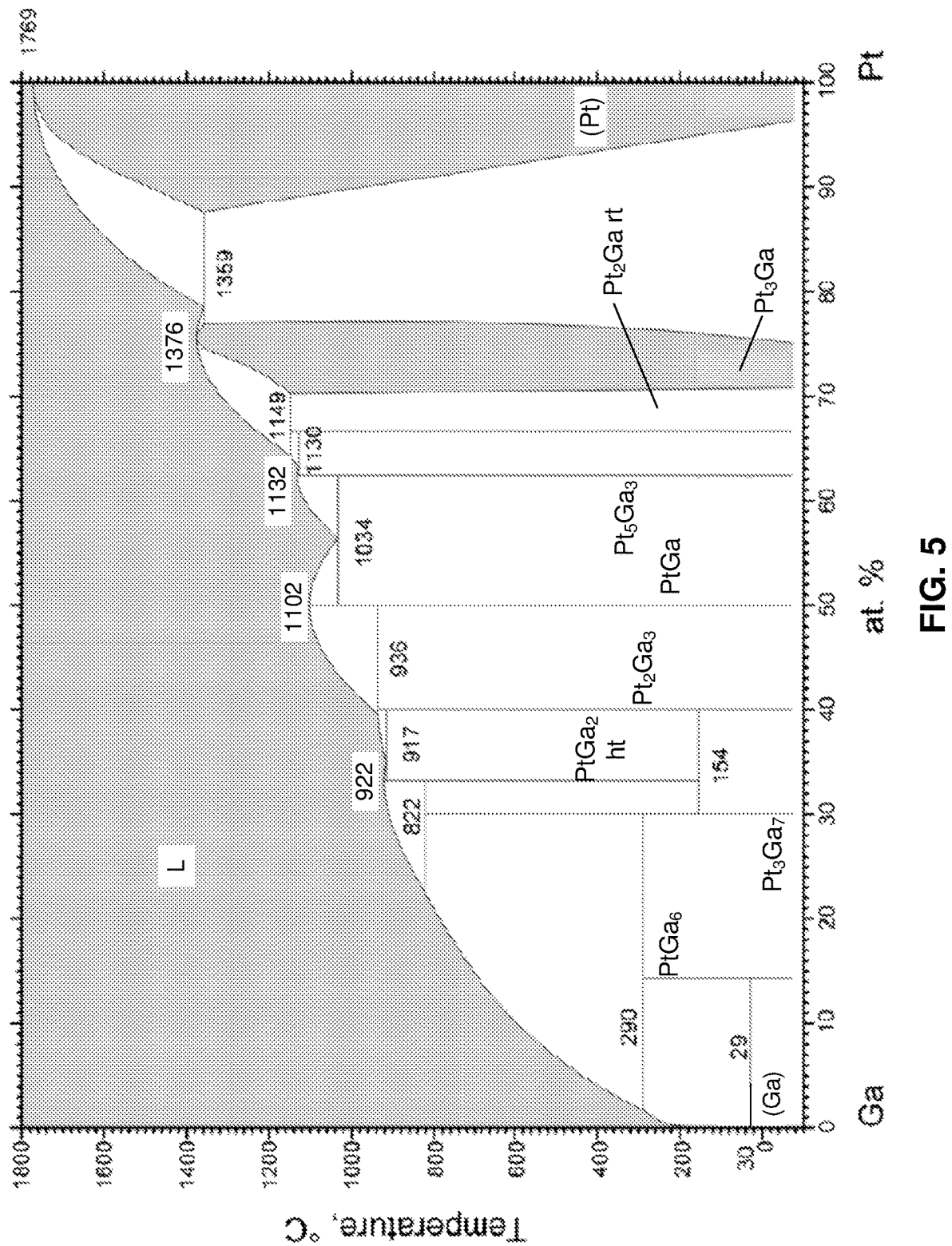
FIG. 5 is a phase diagram of Ga and Pt compounds.

FIG. 5 is a phase diagram of Ga and Pt, showing numerous Pt—Ga compounds relative to the temperature used in the annealing process. Conversely, a similar phase diagram of Pt—N (not shown) shows no Pt—N compounds. In one approach, gold (Au)also reacts with GaN producing similar type phase diagrams of forming Au—Ga compounds (but no Au—N compounds) as shown for Pt. In another approach, palladium (Pd) reacts with GaN producing similar type phase diagrams of forming Pd—Ga compounds (but no Pd—N compounds). In yet another approach, nickel (Ni) reacts with GaN producing similar type phase diagrams of forming Ni—Ga compounds (but no NI—N compounds). These approaches are by way of example only and are not meant to be limiting in any way.

Looking back to FIG. 4, in various approaches, Ga 408 may diffuse through the Mg source layer 404 to the second layer, creating a Ga vacancy 410 in the substrate 406 of GaN 407. This Ga vacancy 410 acts as a site for Mg 412 to diffuse into, thus enhancing the diffusivity of Mg 412 in a substrate 406 of GaN 407 significantly. In addition, because the Mg 412 may diffuse directly onto a Ga site, e.g., a Ga vacancy 410, the Mg 412 may already be electrically active and, thus, act as a dopant.

In some approaches, the first layer may be of sufficient thickness to prevent diffusion of the second layer to the surface, but thin enough to allow interaction between the GaN and the second layer. In a preferred approach, a thin layer of Mg source above a GaN layer and the Mg source layer capped with a metal such as Pd, Pt, etc. is annealed thereby diffusing the Ga out of the GaN layer through the Mg source and into the metal. Concurrently and/or subsequently, the Mg diffuses into the locations where the Ga was positioned. According to the described method, the temperature can be significantly lowered (relative to conventional techniques) while enabling the Mg to travel into the GaN layer. In various approaches, Mg may be diffused several hundred nanometers (nm) into the GaN, thereby forming a doped region with the desired p-type conductivity.

In various approaches, depth profiles (e.g., obtained after annealing at 800° C. for 15 min and at 1000° C. for 15 min) indicate significant Mg diffusion into the GaN. In some approaches, a Mg source may be chosen that can react with the Ga independent of a cap layer. For example, but not limited to, $MgF_2$ may react to form $GaF_3$.

Looking back to method 300 in FIG. 3, an optional step 308 includes removing the source layer and/or the cap layer.

According to various approaches described herein the reacted coating (e.g., the first and second layers, source and cap layers, etc.) may be removed from the substrate having a changed conductivity. For example, looking to the structure 401 in FIG. 4, the source layer 404 and cap layer 402 may be removed from the Mg-doped GaN substrate 406 that has p-type conductivity.

Techniques to remove the reacted coating may include planarization, polishing, lapping, plasma etching, chemical etching, etc. In some approaches, removal of the reacted coating includes chemical etching steps, such as an etching step to react with the metal (e.g., submersion in boiling aqua regia to attack Pt), followed by an etching step to oxidize the Mg/Ga/F compound (e.g., application of a heated hydroxide), and a final etching step using a fluorine containing etch such as hydrofluoric acid (HF) or ammonium fluoride ($NH_4F$). For example, in one exemplary approach, a method includes etching in boiling aqua regia, etching in heated 44% KOH in $H_2O$ at 80° C., then etching in buffered oxide etch or another HF containing solution.

FIG. 6 shows a method 600 for activating magnesium-doped gallium nitride, in accordance with one embodiment. As an option, the present method 600 may be implemented to activate other materials such as those shown in the other FIGS. described herein. Of course, however, this method 600 and others presented herein may be used to form structures for a wide variety of devices and/or purposes which may or may not be related to the illustrative embodiments listed herein. Further, the methods presented herein may be carried out in any desired environment. Moreover, more or less operations than those shown in FIG. 6 may be included in method 600, according to various embodiments. It should also be noted that any of the aforementioned features may be used in any of the embodiments described in accordance with the various methods.

Method 600 begins with a substrate of magnesium-doped GaN. In some approaches, step 602 includes doping magnesium (Mg) into a substrate that includes gallium nitride (GaN). The processes for doping GaN may include ion implantation, conventional diffusion, diffusion process described herein, etc.

Step 604 of method 600 includes depositing a cap layer above the substrate relative to the substrate. In some approaches, the cap layer may be deposited directly on the surface of the substrate. In some approaches, the cap layer may be deposited directly on the upper surface of the substrate. In one approach, the cap layer may be deposited on a portion of the substrate.

As described in detail in method 300 of FIG. 3, the material of the cap layer of step 604 in method 600 includes a metal that forms a compound with gallium but does not react with the nitride of GaN. Exemplary metals that may be deposited as a cap layer include platinum, gold, nickel, palladium, combinations thereof, etc.

Step 606 of method 600 includes applying a thermal annealing treatment to the substrate and deposited cap layer for causing diffusion of gallium from the substrate to the cap layer, and for activating the magnesium to a former location of the diffused gallium in the substrate.

In various approaches, a temperature for the thermal annealing treatment may be a range of greater than 200° C. to less than 1000° C. In some approaches, a temperature for the thermal annealing treatment may be a range of greater than 600° C. to less than 800° C.

According to various embodiments described herein, an effective technique has been developed for low temperature and short time diffusion doping of GaN with Mg. This relies on an achieving a thin heterostructure design on the GaN to be doped that includes incorporation onto the GaN of 1) a Mg-containing source layer, and 2) a single or set of metallic cap layers that establish an electric field gradient within the Mg-source layer and GaN. The cap layer(s) and Mg-containing source layer may be chosen according to their work functions and dielectric constants, respectively, to tune the amount of built-in electric field within the layers and in turn influence the Fermi level throughout the hetero structure.

In one embodiment, a potential bias may be applied across the heterostructure to influence the Fermi level throughout the structure and the electric field. Moreover, tuning the choice of heterostructure layers and application of potential bias may enhance the coupling between the Fermi level within the GaN layer and the solubility of prospective dopants, such as Mg, thereby allowing the dopant incorporation kinetics into the GaN layer to be tuned. A thermal annealing treatment is applied in conjunction with the electric field and Fermi level control to assist in the impurity incorporation kinetics. Thermal annealing may modulate the concentration and diffusivity of gallium vacancies within the GaN layer as well as incorporate substitutional Mg acceptors expected for increasingly n-type material. Control of the Fermi level also enables control and/or suppression of the formation of compensating defects, which may be detrimental to achieving high p-type doping.

Various embodiments disclose diffusion doping using field-induced effects in metal-semiconductor junctions by incorporating an explicit dielectric layer that simultaneously may mediate an electric field and Fermi level as well as be a source of the intended dopants. As disclosed herein, the process differs from incorporation methods using ion exchange processes under electric fields in glasses, such as a field-assisted solid ion exchange (FASSIE). The FASSIE technique relies on the deposition of metallic films and the application of large potential differences across the insulator to replace alkali impurities within the glass without explicit chemical specificity. In contrast, as described herein, one approach uses an electrical bias across a heterostructure to control the Fermi level to target chemical specificity in what type species may be to selectively replace pre-defined types of species with elements from the source layer into the substrate layer. For example, the process uses electrical bias across a heterostructure to target substitution of nitrogen vacancy donors, gallium vacancy acceptors, etc. in GaN.

According to one embodiment, the process of Field-Assisted Interfacial Doping (FAID) is related to approaches described herein such as Gallidation Assisted Impurity Diffusion (GAID), and a contemplated comparable process previously demonstrated in SiC, using silicidation of metal contacts, e.g., Silicidation Assisted Impurity Doping.

According to another embodiment, a method includes diffusing magnesium (Mg) into gallium nitride (GaN) in order to create p-type gallium nitride (p-type GaN). In one approach described herein, a method for relatively low temperature (<1000° C.) diffusion of Mg into GaN using a Mg-containing source layer and a metallic cap layer such as Pt, Pd, Au, and low work-function metals like Y to modify the electric field and overall thermodynamics of the system to enhance the diffusion rate of Mg into GaN. In one approach, a Mg-containing source layer may include a dielectric layer. In one approach, the cap layer includes a conductive material. Electrical bias using the cap layer contact can be additionally applied to influence the overall diffusion rates via Fermi-level control within the layers and can be employed on 3D structures.

In one approach, a p-GaN with hole concentrations $>1\times10^{17}$ cm$^{-3}$ may be formed.

Figure 9:
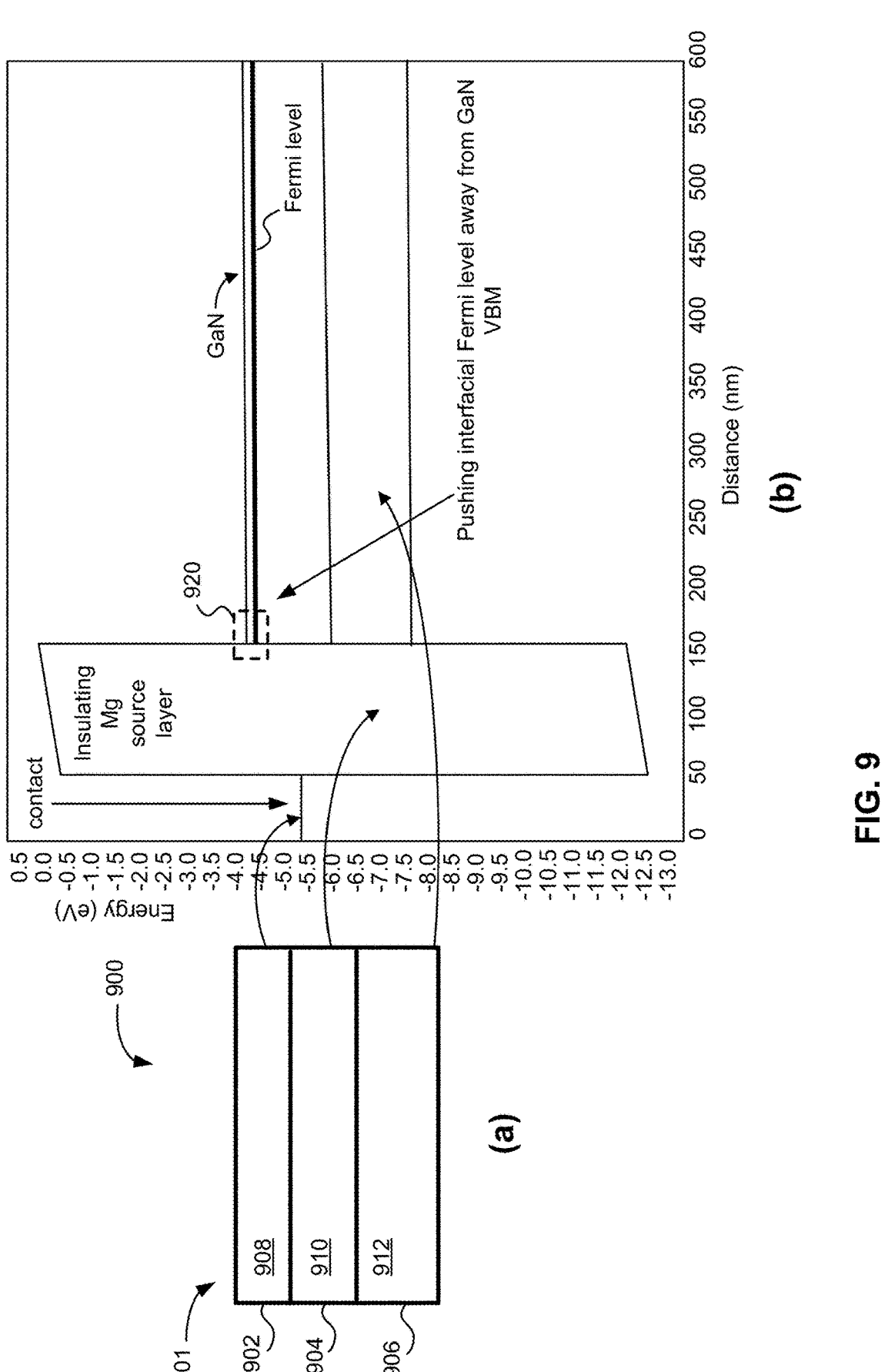
FIG. 9 is a schematic drawing of the principles of Field-assisted Interfacial doping (FAID), according to one embodiment. Part (a) is a schematic drawing of a heterostructure, and part (b) is the corresponding band gap diagram of the heterostructure.

According to one embodiment, a schematic drawing of the working principles of Field-Assisted Interfacial Doping (FAID) is shown in FIG. 9. As illustrated in part (a), an apparatus 900 includes a heterostructure 901 that comprises a cap layer 902 that serves as a contact. The material 908 of the cap layer 902 having a suitably low work function is deposited onto an insulating source layer 904 that is deposited on the substrate 906. In one approach, the cap layer 902 includes a conductive material. The material 910 of the insulating source layer 904 may include Mg. The substrate 906 may be comprised of a semiconductor material such as GaN.

The layers of the heterostructure 901 of part (a) correspond to the regions of a theoretical band gap diagram of part (b). This example drives the interfacial Fermi level (bold line) at the source-layer/substrate layer junction 920 (towards more n-type even when unbiased), which facilitates Ga vacancy formation for vacancy assisted diffusion and incorporation of the desired Mg-source layer dopant. Thermal annealing in conjunction with the application of an electrical bias additionally facilitates the diffusion of the source dopant to desired concentrations and depths.

According to various approaches, a FAID process may include materials having an active region, and in some cases, these materials may also be included in the substrate, such as AlN, InP, GaAs, Ga$_2$O$_3$, BN, Si, Ge, etc. In one approach, a GaN substrate is coated with a two-layer structure. The first layer, in contact with the GaN, is a source layer.

In one approach, the source layer may include a Mg source such as pure Mg, or compounds including Mg such as Mg halides (e.g., MgF$_2$, MgCl$_2$, MgBr$_2$, MgI$_2$, etc.), Mg oxides and chalcogenides (e.g., MgO, MgS, MgSe, MgTe, etc.), Mg nitrides (e.g., Mg$_2$N$_3$, Mg$_3$N$_2$. Mg$_3$Al$_2$N$_4$, etc.), Mg carbides (e.g., MgCN$_2$, etc.), Mg hydrides (e.g., MgH$_2$ and Mg borohydrides, MgB$_2$, etc.), and their alloys. For example, in one approach, alloys of AlMgN may include various ratios of Al to Mg, e.g., Al$_x$Mg$_{1-x}$N$_y$, where 0>x>1 for a given N content, y. In some approaches, the source layer may include a dielectric source layer. Preferably, the source layer is electrically insulating to mediate the flow of electrons and allow charges to build up at the interface. In one approach, a source layer including pure Mg is conductive.

In some approaches, the second layer includes a metal, other material, etc. that is generally understood to have metallic or near-metallic conductivity. Without wishing to be bound by any theory, it is believed the second layer(s), e.g., cap layers, are generally understood to react with GaN to form a gallide during thermal annealing. For example, the second layer(s) may include Pt, Pd, Au, Y, Ni, etc. These metals are known to react with GaN to form gallides (e.g., Pt$_2$Ga) at temperatures as low as 400° C. In one approach, the cap layer includes a conductive material, for example, a transparent conductor material, other conductor material, etc.

In various approaches, a thickness of the first layer, e.g., source layer, is of sufficient thickness to prevent diffusion of the second layer to the surface, but thin enough to allow interaction between the GaN and the second layer. For example, if the first layer is too thin then in addition to the Ga diffusing out of the GaN substrate layer, the metal (i.e., Au) of the second layer may diffuse into the GaN substrate layer. In systems without applied voltage, e.g., bias, preferred cap layers including metallic material having low work functions. In approaches having applied voltage, e.g., electrical bias, the cap layer(s) may include any desired metallic material as metallic contacts.

After deposition of these layers to form a heterostructure, a thermal annealing treatment may be applied to the heterostructure. In systems without bias, a choice of Mg-source and specific cap layers having a low work function may allow the Fermi level in the vicinity of the GaN surface to be driven away from the valence band, lowering the energy of prospective Ga vacancy formation, as well as acceptor incorporation like Mg on a Ga site. A thermal annealing treatment may facilitate Ga diffusion into and possibly through the Mg source layer to the second layer, e.g., the cap layer, creating a Ga vacancy in the GaN. The resulting Ga vacancy acts as a site for Mg from the first layer to diffuse into, thus enhancing the diffusivity of Mg in GaN significantly. In addition, because the Mg has diffused directly onto a Ga site, it is already electrically active and can act as a dopant.

In various approaches, by carefully choosing the temperature and time of annealing, high carrier concentrations of p-GaN may be measured using Hall Effect. In a preferred approach, a source layer of $MgF_2$ having a deposition thickness of 100 nm capped by a Pt layer having a deposition thickness of 100 nm and a thermal annealing treatment of 800° C. for 3 minutes. For example, the preferred approach may yield a p-doped GaN having a sheet carrier concentration in a range of $0.8 \times 10^{12}$ cm$^{-2}$ to $2 \times 10^{12}$ cm$^{-2}$. This translates to a likely carrier concentration in a range of $3 \times 10^{17}$ cm$^{-3}$ to $8 \times 10^{17}$ cm$^{-3}$. Depth profiles for thermal annealing treatments at 800° C. for 15 min and 1000° C. for 15 min suggest significant Mg diffusion into the GaN.

In some approaches, a Mg source may be chosen that may react with Ga independent of a cap layer. For example, $MgF_2$ may react with gallium (Ga) to form $GaF_3$. In some approaches, source material may include Ga—N—Mg—F, Ga—N—Mg—Cl, Ga—N—Mg—H.

Diffusivity of Mg from the Source Layer to the Substrate

In one approach, formation of vacancy of Ga in the substrate ($V_{Ga}$) and Mg in the vacancy site of GaN ($Mg_{Ga}$) may be more favorable as the Fermi level moves toward the conduction band. Without wishing to be bound by any theory, it is believed that diffusion of Mg through $V_{Ga}$ may depend on control of the Fermi level. For example, when the Fermi level of the semiconductor material is closer to the conduction band, gallium vacancies ($V_{Ga}$) are likely to form, and Mg tends to fill the vacancy sites ($Mg_{Ga}$). In one approach, by adding a metal cap layer having a low work function, at zero bias the Fermi level moves toward the conduction band to form $V_{Ga}$ and $Mg_{Ga}$. In another approach, applying a voltage to the heterostructure causes the Fermi level to move toward the conduction band so that $V_{Ga}$ and $Mg_{Ga}$ are more readily formed. Moreover, in material that is more n-type, the rate of diffusion through $V_{GA}$ may be higher.

According to one approach, diffusion of Mg may depend on a formation energy of $V_{Ga}$ and diffusion barriers of Mg through both $V_{Ga}$ and interstitials. Moreover, in one approach, diffusion of Mg through a vacancy site ($V_{Ga}$) within the substrate GaN has a significantly lower barrier, e.g., lower formation energy, than diffusion of Mg by interstitial diffusion.

Mg Source Layer: Mg and $MgH_2$

According to one approach, $MgH_2$ may be used. H may temporarily compensate the Mg, and the H may be driven off after diffusion. In one example, the process may be analogous to MOCVD-grown GaN. Moreover, $MgH_2$ is a wide band gap insulator. In one approach, with H compensation, the formation energy of $Mg_{Ga}$ may be lowered and nitrogen vacancies ($V_N$) may be suppressed.

According to one embodiment, a GAID process of diffusion may include pure Mg and hydride Mg (nominally $MgH_2$) on GaN/$Al_2O_3$ substrates. In various approaches, Mg and $MgH_2$ may be used as magnesium source materials. $MgH_2$ is particularly of interest due to the role that H plays in controlling the Fermi level in GaN. This is well known to be important for growth of p-GaN. H rapidly diffuses in p-type GaN and forms a neutral Mg—H complex that effectively removes free holes from Mg-doped GaN. While compensated GaN is not the end goal, by shifting the Fermi level deeper into the bandgap, the solubility of Mg is increased, the diffusion barrier for Mg is lowered, and other compensating centers such as nitrogen vacancies can be suppressed.

Figure 10:
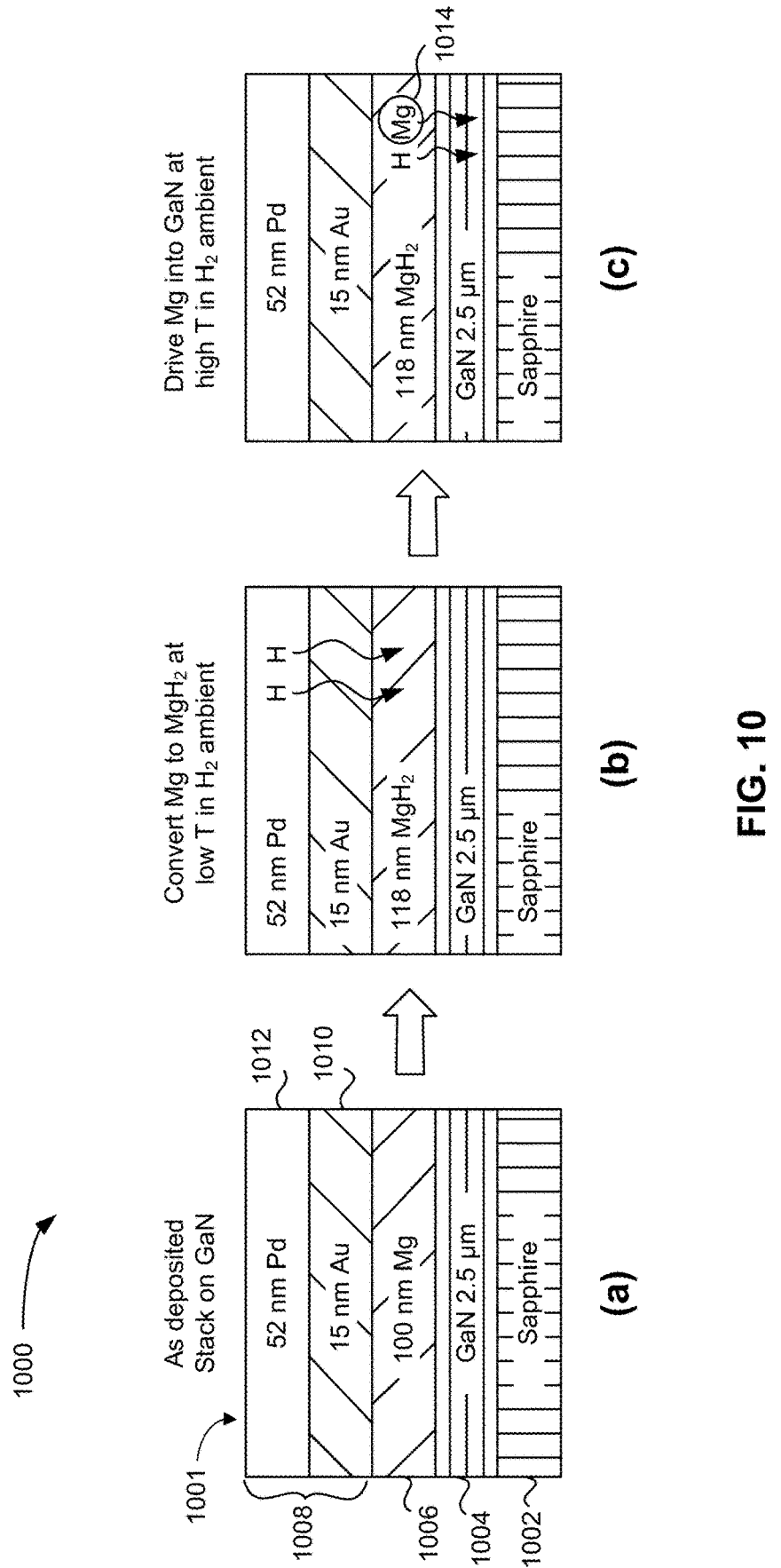
FIG. 10 is a schematic drawing of a process of co-diffusion of H with Mg into a substrate, according to one embodiment. Part (a) depicts the as-deposited stack of layers of the heterostructure, part (b) depicts the conversion of Mg to $MgH_2$, and part (c) depicts the diffusion of Mg into the substrate.

FIG. 10 depicts a schematic drawing of a process 1000 for co-diffusion of H with Mg into a substrate, in accordance with one embodiment. As an option, the present process 1000 may be implemented in conjunction with features from any other embodiment listed herein, such as those described with reference to the other FIGS. Of course, however, such process 1000 and others presented herein may be used in various applications and/or in permutations which may or may not be specifically described in the illustrative embodiments listed herein. Further, the process 1000 presented herein may be used in any desired environment.

In one embodiment, co-diffusion of H with Mg may occur with a heterostructure having a Mg source layer and a series of cap layers, including gold and palladium. FIG. 10 is a schematic drawing of a heterostructure 1001 for co-diffusion of H with Mg into a GaN substrate to pin the Fermi level deep in the bandgap. Part (a) includes the as-deposited stack of layers of the heterostructure 1001. Onto a sapphire substrate 1002 and a substrate 1004 to be doped, a source layer 1006 is deposited followed by deposition of a series of two cap layers 1008. A first layer 1010 of the cap layers 1008 may include gold (Au) and a second layer 1012 of the cap layers 1008 may include palladium (Pd) positioned above the first layer 1010 comprising Au. The substrate 1004 to be doped may include GaN, and the source layer 1006 includes a dopant such as Mg.

Part (b) shows the conversion of the dopant to a hydride, for example, Mg to $MgH_2$ at a low temperature in an $H_2$ ambient atmosphere. The deposition thickness of source layer 1006 may increase following the conversion to including a hydride, e.g., $MgH_2$. Part (c) shows that during a thermal annealing treatment of a high temperature in an $H_2$ ambient atmosphere, the dopant 1014, e.g., Mg may diffuse into GaN while H may be diffused out of the heterostructure 1001.

Effect of the Cap Layer on Mg Diffusion in a Heterostructure

Candidates for material of a cap layer(s) may include Ni, Rh, Au, Pd, Pt, Y, Ag, Zn, etc. In various approaches, the cap layer includes a conductive material, for example, a metal, a transparent conductor material (e.g., tin oxide, indium tin oxide, fluorine-doped tin oxide, etc.), other conductive materials (e.g., TiN, $CeB_6$, etc.), etc. In some approaches, phases of a cap layer material X, where X is Au, Pt, Pd, Y, etc., with $MgF_2$ and F may be included. Without wishing to be limiting in any way, examples include for Au—$MgF_2$:$Au_3F_8$; for Pt—$MgF_2$:$PtF_4$; for Pd—$MgF_2$:$PdF_3$; for Y:$YMg_2$—$YF_2$, etc.

In some approaches, the material of the cap layer of the heterostructure may influence the efficiency of diffusion of the substrate with the dopant from the source layer. In preferred approaches, a strong cap layer effect with the material gold (Au) for efficient diffusion of the substrate. In one approach, a cap layer including Au may allow diffusion of a GaN substrate with Mg to a depth of 20 nm to 100 nm.

Control of the Fermi Level of the Heterostructure

With an applied voltage to a heterostructure for diffusion doping, most cap layer metals may cause diffusion of Mg, however, the amount of diffused Mg corresponds may be different for each metal. The location of the Fermi level in the band gap of the GaN may control the diffusivity of Mg. For example, a preferred diffusion pathway as described herein is through Ga vacancies in the GaN and the formation of those vacancies is controlled by the position of the Fermi level. Preferably, changing the position of the Fermi level to nearer the conduction band of the substrate may result in better dopant diffusivity.

In one approach, formation of a heterostructure having a specific metal cap layer with low work function forms a metal-insulator-semiconductor (MIS) structure that at zero bias may move the Fermi level near the substrate surface, e.g., a surface of GaN. In some approaches, an applied voltage during a thermal annealing treatment may have the same effect of moving the Fermi level near the substrate surface.

A metal with a low work function tends to bend the bands in a way that creates a built-in field at the surface of the substrate, e.g., GaN. Moreover, the built-in field may cause the Fermi level to move closer to the conduction band. In preferred approaches, when the Fermi level is closer to the conduction band, diffusion of the dopant is enhanced. In one approach, selecting the material for the cap layer based on the work function of the material may move the Fermi level near the substrate surface. A comparison of bending predicted depending on metal work function suggests Y>>Au>Pd>Pt. Increasing $V_{Ga}$ formation energy at surface may lower Mg diffusivity, (see FIG. 19, in Experiments section).

In one approach, a heterostructure having an additional cap layer comprising yttrium (Y) has significantly enhanced Mg diffusion compared to heterostructures having a cap layer comprising Au, Pd, and Pt.

Effect of Metal Work Function/Yttrium Cap Layer

Figure 16:
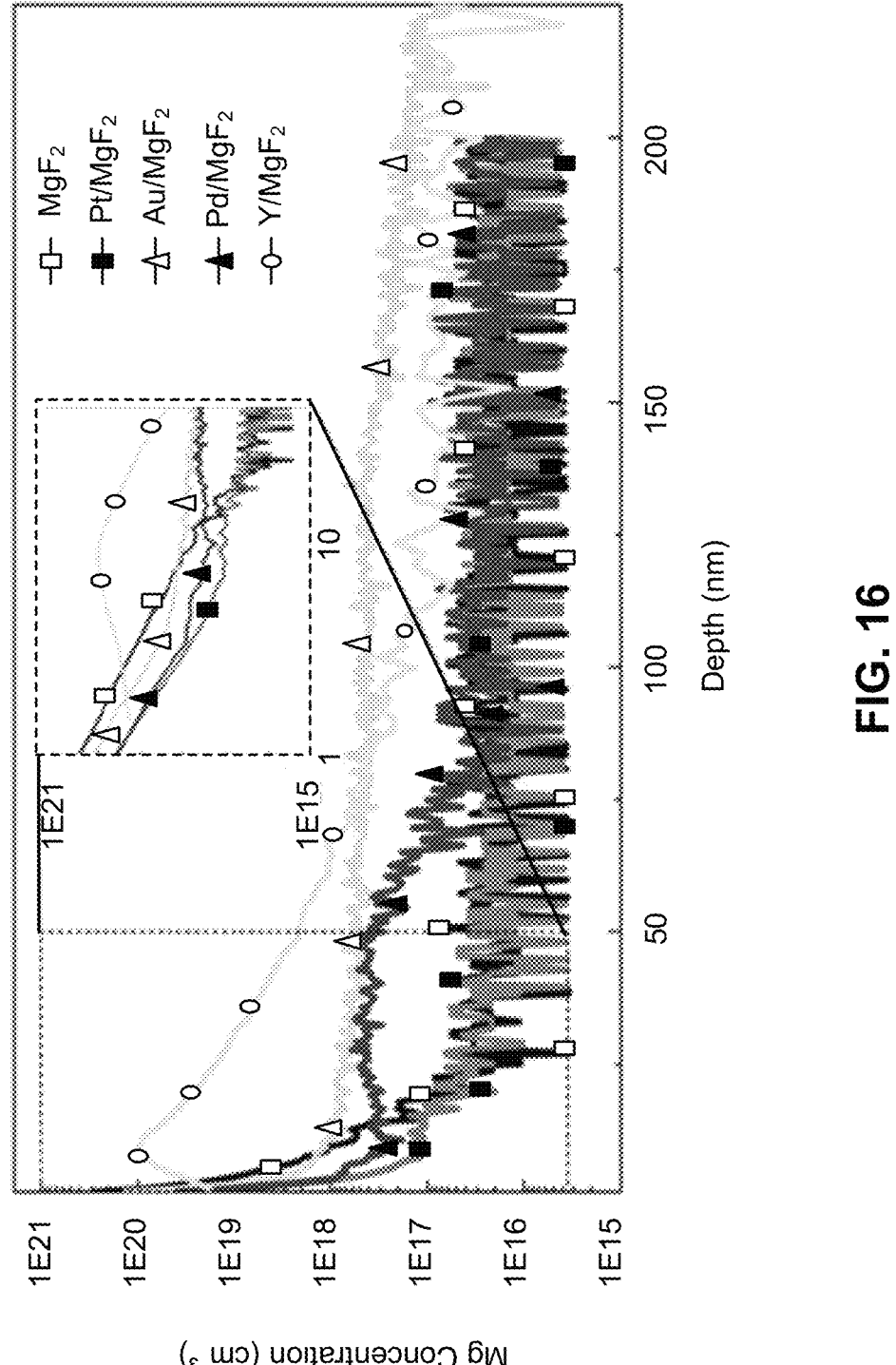
FIG. 16 is a plot of secondary ion mass spectrometry (SIMS) measuring Mg concentrations using different cap layer material, including yttrium, according to one embodiment.

Mg profiles have been measured of $MgF_2$ layers on $GaN/Al_2O_3$ uncapped and capped with Au, Pd, and Pt. Initially, it was believed that the metals with the most thermodynamically favorable gallide would preferably enhance the diffusivity of the dopant into the substrate. Based on Gibbs Free Energy, for example, enhanced diffusivity may be expected with a cap layer having following material, in order of greatest effect, Pd>Pt>Au. However, in a surprising result, better diffusion of the dopant Mg was observed with Au, followed by Pd and Pt (FIG. 16, see Experiments section). Moreover, in these systems, the amount of metal and F incorporation may be inverse to the amount of Mg. Thus, it appeared unwanted elements may be diffuse and may act as compensating defects. In addition, diffusion may become more favorable as Mg moves the Fermi level towards the valence band.

In various approaches, in addition to metal reactivity of the cap layer, the principles of band bending and control of the Fermi level may be essential for efficient Mg diffusivity into GaN. Without wishing to be bound by any theory, it is believed a decreasing work function, e.g., work function of Pt>Pd>Au, influences the band bending at the surface to push the Fermi level closer to the conduction band. In preferred approaches, moving the Femi level closer to the conduction band may result in (1) enhancing formation of Ga vacancies, (2) enhancing diffusion of Mg, and (3) suppressing formation of compensating defects. For example, a cap layer comprising Au, having a low work function (WF), results in enhanced formation of Ga vacancies and enhanced diffusion of Mg. In another example, an Au/Pd bilayer may have resulted in reduced amounts of metal and F co-diffusing with the Mg. Moreover, without wishing to be bound by any theory, it is believed because the GaN is held as n-type in the diffused region, there should be less of a thermodynamic driver for incorporation or formation of compensating defects to maintain thermodynamic equilibrium.

As disclosed herein, in one approach, a candidate cap layer material included yttrium (Y), a metal having a low work function and is known to form gallides.

Thermal Annealing Treatment

In some approaches, lower annealing temperatures, in a range of greater than 200° C. to less than 800° C., is preferable for minimizing reactivity of the substrate during diffusion. For example, some metals may have high reactivity with a GaN substrate in an $H_2$ ambient, and the reactivity may be minimized with lower diffusion temperatures.

Characterization of Surface of Doped GaN Substrate

In various approaches, removing the reacted coating tends to be challenging. In one approach, removal of the source layer/cap layer may include a series of etching steps to result in a doped substrate without the source/cap layers. In preferred approaches, a selective area diffusion doping process by vacancy assisted diffusion may result in a surface, after stripping the bilayer, that is essentially undamaged.

Field-Assisted Diffusion

In one embodiment, controlling the Fermi level position at the interface between the Mg containing layer and the GaN during diffusion may modulate the concentration profile of $Mg_{Ga}$ of the substrate. As described herein, a cap layer including the low work function material yttrium (Y) is preferable for moving the Fermi level and improving diffusion of Mg into the substrate.

Figure 11A:
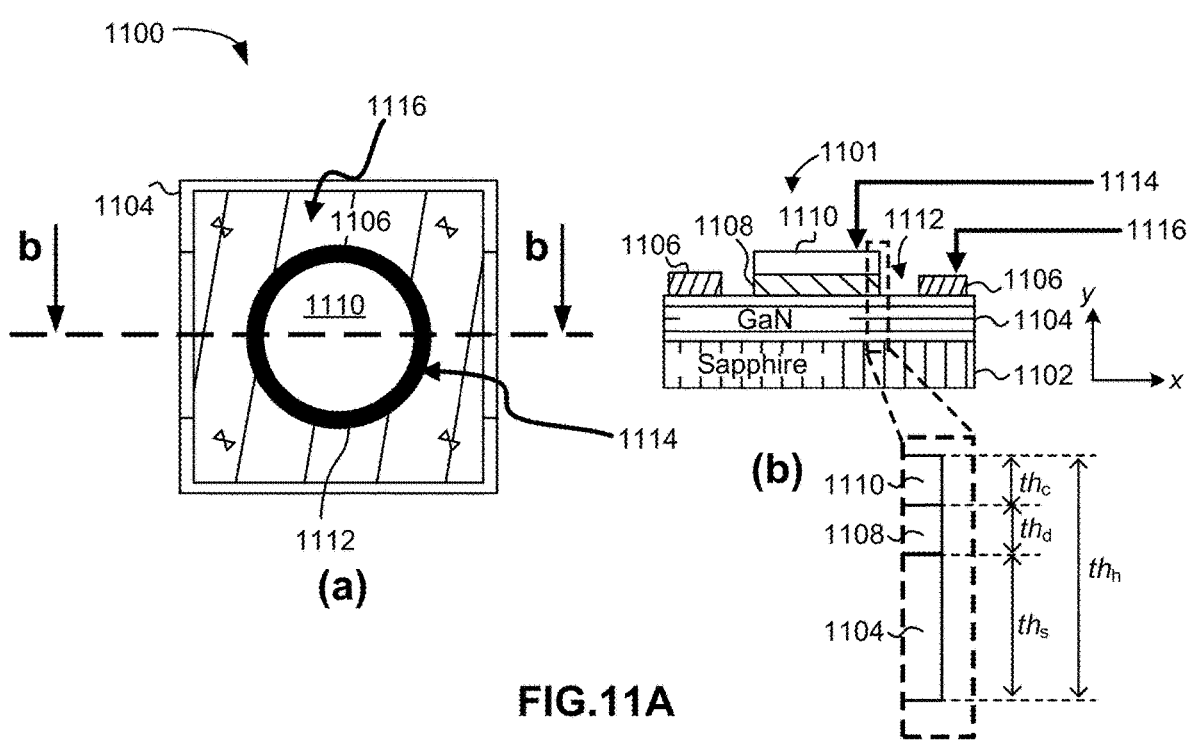
FIG. 11A is a schematic drawing of an apparatus for field-assisted interfacial diffusion of a dopant, according to one embodiment. Part (a) is a top-down view of the apparatus, and part (b) is a side view of the apparatus.

FIG. 11A depicts an apparatus 1100 for field-assisted interfacial diffusion of a dopant into a substrate, in accordance with one embodiment. As an option, the present apparatus 1100 may be implemented in conjunction with features from any other embodiment listed herein, such as those described with reference to the other FIGS. Of course, however, such apparatus 1100 and others presented herein may be used in various applications and/or in permutations which may or may not be specifically described in the illustrative embodiments listed herein. Further, the apparatus 1100 presented herein may be used in any desired environment.

FIG. 11A is a schematic drawing of an apparatus 1100 for field-assisted diffusion that includes a heterostructure 1101. The apparatus 1100 may be fabricated for experimentation with bias control of the interface fermi level. In one approach, the heterostructure 1101 may be a metal-insulator-semiconductor (MIS) structure. Part (a) illustrates a top-down view of the apparatus 1100. The bold dashed line bisecting the top-down view of the apparatus 1100 represents the side view of the apparatus 1100 as illustrated in part (b).

In one approach, the heterostructure 1101 includes a substrate 1104, a source layer 1108 of any suitable material positioned on a surface of the substrate 1104, and a conductive cap layer 1110 positioned on the source layer 1108. The substrate 1104 includes a Group-III-nitride material of any suitable type, for example InN, GaN, AlN, and alloys thereof. In preferred approaches, the substrate 1104 includes GaN. The source layer 1108 includes a dopant. The cap layer may be of any suitable conductive material. In one approach, the conductive cap layer may include a transparent conductor material (e.g., tin oxide, indium tin oxide, fluorine-doped tin oxide, etc.). In one approach, the conductive cap layer may include other conductor materials (e.g., TiN, CeB$_6$, etc.). In a preferred approach, the conductive cap layer includes at least one of the following metals: platinum, palladium, gold, yttrium, and nickel.

In one approach, a base substrate 1102 that may be comprised of sapphire and/or any other suitable material that would become apparent to one skilled in the art upon reading the present disclosure, may be positioned below substrate 1104. The heterostructure 1101 may be fabricated by deposition of the source layer 1108 onto the substrate 1104, and the cap layer 1110, or cap layers, deposited onto the source layer 1108.

The Group-III-nitride material of the substrate 1104 preferably includes a compound of a nitrogen and at least one of the following elements: gallium, aluminum, indium, boron, scandium, and thallium.

The source layer 1108 may include a dopant such as Mg, having a dopant source such as pure Mg, or compounds including Mg such as Mg halides (e.g., MgF$_2$, MgCl$_2$, MgBr$_2$, MgI$_2$, etc.), Mg oxides and chalcogenides (e.g., MgO, MgS, MgSe, MgTe, etc.), Mg nitrides (e.g., Mg$_2$N$_3$, Mg$_3$N$_2$. Mg$_3$Al$_2$N$_4$, etc.), Mg carbides (e.g., MgCN$_2$, etc.), Mg hydrides (e.g., MgH$_2$ and Mg borohydrides, MgB$_2$, etc.), and their alloys. For example, in one approach, alloys of AlMgN may include various ratios of Al to Mg, e.g., Al$_x$Mg$_{1-x}$N$_y$, where $0>x>1$ for a given N content, y. In some approaches, the dopant may include at least one of the following: silicon, germanium, tin, and carbon. In some approaches, the dopant may be a rare earth dopant, such as a lanthanide (e.g., europium, samarium, erbium, etc.). In other approaches, the dopant may include at least one of the following: manganese, chromium, iron, nickel, vanadium, cobalt, gadolinium, etc.

The cap layer 1110 may include one or more layers, where each of the one or more layers includes a different metal. The metal of the cap layer 1110 may include at least one of Au, Pt, Pd, Y, etc. In preferred approaches, a work function (WF) of the cap layer may be in a range of greater than about 2.0 to less than about 5.0.

In one approach, a deposition thickness (th$_d$) of the source layer 1108 may be about equal to the deposition thickness (th$_c$) of the cap layer 1110. In various approaches, each deposition thickness th$_d$, th$_c$ of the source layer 1108 and cap layer 1110 may be in a range of about 1 nanometer (nm) to about 1000 nm. The deposition thickness th$_s$ of the substrate may be up to 50 fold thicker than the source layer 1108 and/or cap layer 1110. The deposition thickness (thh) of the heterostructure may be in a range of about 1 nm to about 5000 nm. In various approaches, a deposition thickness may be defined as the thickness of the layer in a y-direction perpendicular to the width of the structure in a x-direction.

In one embodiment, the apparatus 1100 may include a metal contact layer 1106 coupled to the substrate 1104. The metal contact layer 1106 may be comprised of at least one of Ti, Al, Pt, Au, etc. In preferred approaches, there is a gap 1112 between the metal contact layer 1106 and the source layer 1108 in order to modulate the interface between the substrate 1104 and the source layer 1108 and prevent an electrical short. The metal contact layer 1106 may surround the periphery of the heterostructure 1101 comprising the bilayer of source layer 1108 and cap layer 1110.

The cap layer 1110 may function as a first electrode 1114, e.g., a MIS probe. In one approach, the cap layer may be the first electrode. In another approach, the cap layer has a first electrode layer. The metal contact layer 1106 may function as a second electrode 1116, e.g., an ohmic probe.

Figure 11B:
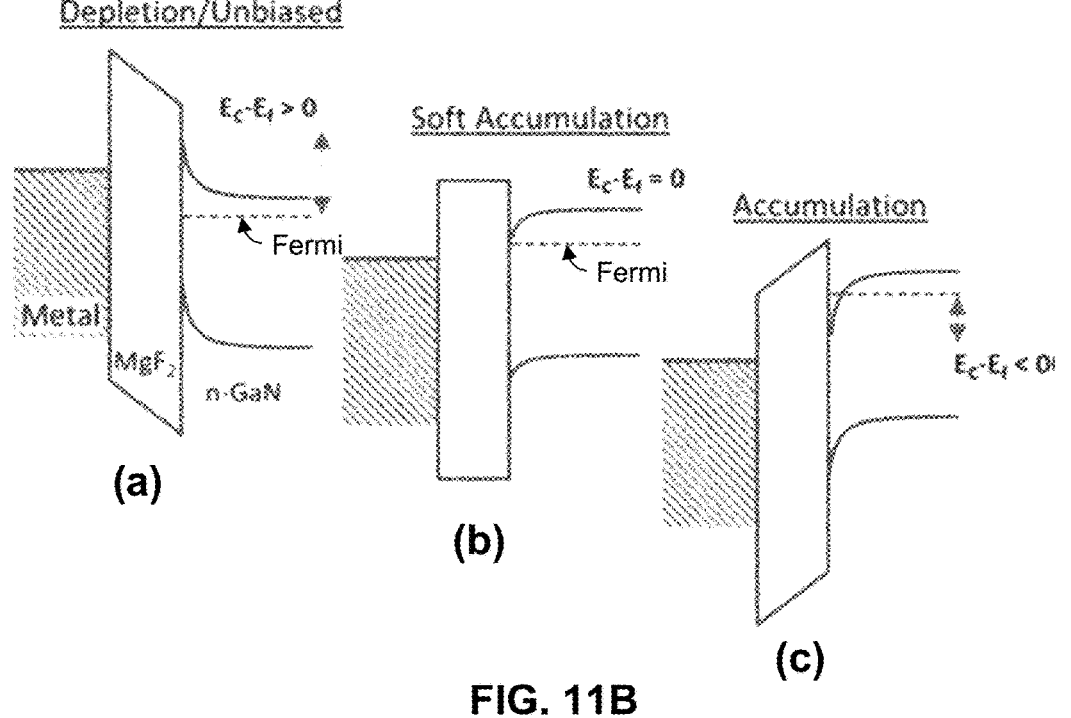
FIG. 11B depicts a series of theoretical band profiles representing field-assisted interfacial diffusion, according to one embodiment. Part (a) depicts depletion/unbiased, part (b) depicts soft accumulation, and part (c) depicts accumulation.

Initially, the two electrodes 1114, 1116 may be used to bias the sample into 'soft accumulation' as shown in the theoretical band profile of part (b) of FIG. 11B so that the Fermi level lies at or above the conduction band. Assuming the insulating layer does not degrade during the diffusion process, a capacitive signal may be used as feedback control so that the interface can be monitored, and Fermi level position held constant. For comparison, part (a) in FIG. 11B depicts a theoretical band profile without bias including depletion. Part (c) represents accumulation.

FIG. 12 shows a method 1200 for electric field-enhanced impurity diffusion to form a product, in accordance with one embodiment. As an option, the present method 1200 may be implemented to dope other materials such as those shown in the other FIGS. described herein. Of course, however, this method 1200 and others presented herein may be used to form structures for a wide variety of devices and/or purposes which may or may not be related to the illustrative embodiments listed herein. Further, the methods presented herein may be carried out in any desired environment. Moreover, more or less operations than those shown in FIG. 12 may be included in method 1200, according to various embodiments. It should also be noted that any of the aforementioned features may be used in any of the embodiments described in accordance with the various methods.

Method 1200 begins with step 1202 that includes obtaining a heterostructure that includes a substrate having a Group-III-nitride semiconductor material, a source layer positioned above the substrate, and a cap layer positioned above the source layer. The Group-III-nitride semiconductor material includes a compound of nitrogen and at least one of the following elements: gallium, aluminum, indium, boron, scandium, and thallium. The cap layer includes at least one of the following metals: yttrium, platinum, gold, palladium, and nickel.

In one approach, the metal of the cap layer is preferably selected to have a low work function (WF) to configure the heterostructure and built-in field to bend the conduction and valence band in the semiconductor such that the diffusivity of the solid source dopant from the source layer is enhanced.

In one approach, the metal of the cap layer may configure the heterostructure such that the build-in field bends the conduction and valence band in the semiconductor that in turn lowers the formation energy of defects, such as Gallium vacancies, and provides a diffusion pathway for the dopant.

In some approaches, the source layer includes a dopant such as magnesium (Mg). In some approaches, the material of the source layer includes a solid magnesium source such as one of the following: pure Mg, or a compound including Mg such as Mg halides (e.g., MgF$_2$, MgCl$_2$, MgBr$_2$, MgI$_2$, etc.), Mg oxides and chalcogenides (e.g., MgO, MgS, MgSe, MgTe, etc.), Mg nitrides (e.g., Mg$_2$N$_3$, Mg$_3$N$_2$. Mg$_3$Al$_2$N$_4$, etc.), Mg carbides (e.g., MgCN$_2$, etc.), Mg hydrides (e.g., MgH$_2$ and Mg borohydrides), and their alloys. For example, in one approach, alloys of AlMgN may include various ratios of Al to Mg, e.g., Al$_x$Mg$_{1-x}$N$_y$, where $0>x>1$ for a given N content, y.

In one approach, the heterostructure may include a metal-semiconductor structure such that the metal is the dopant and also functions to modify the built-in field in the semiconductor. For example, a heterostructure may have a source layer that is pure metal, e.g., magnesium (Mg).

In one approach, the heterostructure may be obtained by forming the heterostructure as described herein. In another approach, the heterostructure may be obtained by purchasing a heterostructure from a custom fabricator. In other approaches, a heterostructure may be obtained by methods, processes, etc. as generally known to one skilled in the art.

Step 1204 includes applying a thermal annealing treatment to the heterostructure, while an electric field gradient is established within the source layer and the cap layer. The electric field gradient may be induced by the deposited heterostructure without any external bias. The thermal annealing treatment causes diffusion of at least some of the at least one element from the substrate to the cap layer and causes diffusion of the dopant from the source layer to a former location of the at least one element in the substrate thereby changing a conductivity and/or magnetic characteristic of the substrate. In one approach, an electric field forms within the heterostructure from a "built-in" field of the metal-insulator-semiconductor (MIS) structure of the heterostructure where the insulator is the solid source dopant.

A temperature for the thermal annealing treatment may be in a range of greater than 200° C. to less than about 1000° C. In preferred approaches, the temperature for thermal annealing treatment is in a range of greater than 600° C. and less than 800° C.

A time duration of the thermal annealing treatment is less than one hour. In preferred approaches, the time duration of thermal annealing is less than 20 minutes.

In some approaches, the thermal annealing treatment may be applied in an atmosphere that includes hydrogen. In one approach, the thermal annealing treatment includes removing hydrogen from the substrate. In one approach, the thermal annealing treatment may change the conductivity of the substrate from a n-type conductivity to a p-type conductivity.

In one approach, a bias enhances the field-assisted diffusion of dopant into the substrate. Step 1206 of method 1200 includes applying a voltage to the cap layer and a metal contact layer coupled to the substrate. In a preferred approach, a voltage is applied for forming an external electric field to enhance the diffusivity of the desired dopant. In one approach, a voltage is applied to form an external electric field to suppress formation of compensating defect during diffusion, e.g., suppressing nitrogen vacancies. In one approach, a voltage may be applied to form an external electric field and in so doing inject current into a region of the heterostructure targeted for diffusion, and thus further mitigate formation of compensating vacancies.

In one approach, the method 1200 may include a further step 1208 for removing the source layer and/or the cap layer from the heterostructure. Techniques to remove the reacted coating may include planarization, polishing, lapping, plasma etching, chemical etching, etc. as described herein.

Figure 13:
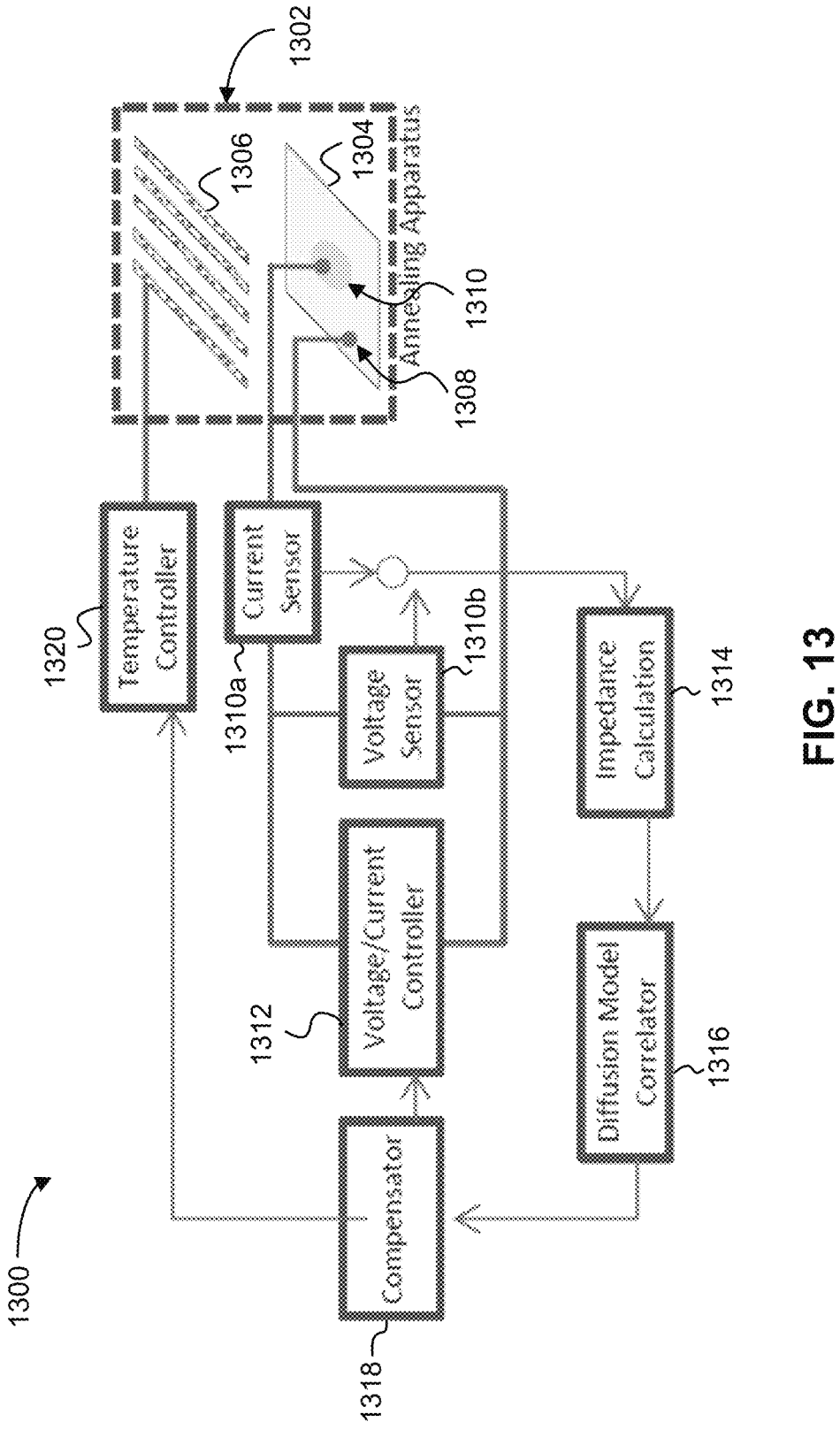
FIG. 13 is a schematic drawing of an apparatus for controlling the field-assisted interfacial diffusion of the dopant, according to one embodiment.

FIG. 13 depicts an apparatus 1300 for controlling the field-assisted interfacial diffusion of a dopant into a substrate, in accordance with one embodiment. As an option, the present apparatus 1300 may be implemented in conjunction with features from any other embodiment listed herein, such as those described with reference to the other FIGS. Of course, however, such apparatus 1300 and others presented herein may be used in various applications and/or in permutations which may or may not be specifically described in the illustrative embodiments listed herein. Further, the apparatus 1300 presented herein may be used in any desired environment.

According to one embodiment, the apparatus 1300 provides real-time, in situ measurement of the resistivity, capacitance, etc. of the diffusion of a dopant into a substrate 1310 of a semiconductor material. An annealing apparatus 1302 is a component of the larger apparatus 1300 that allows control of the field-assisted diffusion process. As described herein a thermal annealing treatment system 1306 (e.g., heater) is included in the annealing apparatus 1302. The apparatus 1300 may include at least one of the following sensors 1310a-b: a voltage sensor 1310b, a current sensor 1310a, a capacitance sensor, etc. The sensor(s) 1310a-b report real-time measurements of the resistivity, capacitance, etc. of the substrate 1310 during the diffusion process, thereby providing an indication of the extent of diffusion of the dopant into the substrate 1310.

The apparatus 1300 includes a mechanism 1312 for applying voltage to the electrodes in electrical communication with the substrate 1310 residing in the apparatus 1302. In one approach, the mechanism 1312 for applying voltage applies the voltage to a terminal (e.g., that is coupled to the substrate 1310) on the bilayer diffusion structure of the heterostructure and a terminal 1308 on a separate metal contact 1304 coupled to the substrate 1310 comprising the semiconductor material. The mechanism 1312 for applying a voltage controls the internal electric field (e.g., built-in electric field) and enhance diffusion.

The mechanism 1312 for applying voltage may include a voltage/current controller mechanism 1312 electrically coupled to the electrodes in the annealing apparatus 1302. The mechanism 1312 for applying voltage may be configured to control a power level for applying the voltage according to a pre-defined threshold, where the pre-defined threshold corresponds to an amount of dopant diffused into the substrate of the hetero structure.

The amount of dopant diffused into the substrate may be determined from a series of computational algorithms that process data received from the sensor(s) 1310a-b. In one approach, a current sensor 1310a and/or voltage sensor 1310b send real-time measurements to an Impedance Calculation module 1314 for calculations using an algorithm for determining a current amount of diffusion in the structure based on the measurements received form the sensor(s) 1310a-b. A Diffusion Model Correlator 1316 may process the data from the Impedance Calculation module 1314, feeding the result to the Compensator 1318, which in turn provides data to the mechanism 1312 for applying voltage to adjust the power level, e.g., voltage level and/or current level. In addition, the Compensator 1318 may send data to a Temperature Controller 1320 to adjust the output of the thermal annealing treatment system 1306 within the annealing apparatus 1302. The mechanism 1312 for applying voltage may increase, decrease, and/or stop the voltage applied and/or similarly control the level of current applied, and/or the temperature controller 1320 may adjust the temperature in order to target a desired dopant concentration in the substrate.

Figure 14:
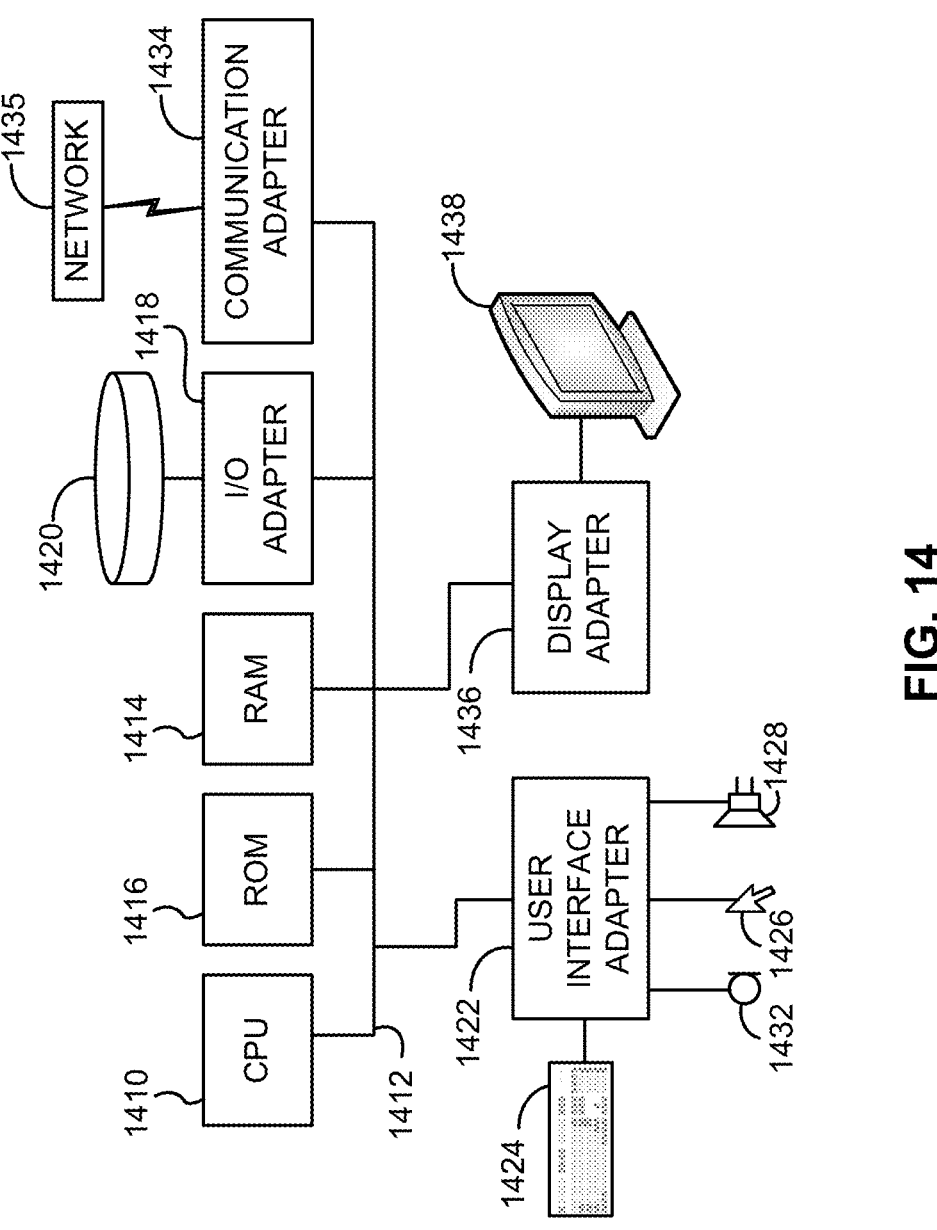
FIG. 14 is a schematic drawing of a representative hardware environment associated with an apparatus of FIG. 13, according to one embodiment.

FIG. 14 shows a representative hardware environment associated with an apparatus 1300 of FIG. 13, in accordance with one embodiment. Such figure illustrates a typical hardware configuration of a workstation having a central processing unit 1410, such as a microprocessor, and a number of other units interconnected via a system bus 1412. The workstation of FIG. 14 may be coupled to the apparatus 1300 of FIG. 13 to enable a user to control the apparatus 1300.

The workstation shown in FIG. 14 includes a Random Access Memory (RAM) 1414, Read Only Memory (ROM) 1416, an I/O adapter 1418 for connecting peripheral devices such as disk storage units 1420 to the bus 1412, a user interface adapter 1422 for connecting a keyboard 1424, a mouse 1426, a speaker 1428, a microphone 1432, and/or other user interface devices such as a touch screen and a digital camera (not shown) to the bus 1412, communication adapter 1434 for connecting the workstation to a communication network 1435 (e.g., a data processing network) and a display adapter 1436 for connecting the bus 1412 to a display device 1438.

The workstation may have resident thereon an operating system such as the Microsoft WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field-programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

Now referring to FIG. 15, there is depicted a flowchart of a method 1500 for diffusing a dopant into a substrate to a pre-defined threshold, in accordance with one embodiment. The method 1500 may be performed in accordance with the present invention in any of the environments depicted in FIGURES, among others, in various embodiments. Of course, more or less operations than those specifically described in FIG. 15 may be included in method 1500, as would be understood by one of skill in the art upon reading the present descriptions.

Each of the steps of the method 1500 may be performed by any suitable component of the operating environment. For example, in various embodiments, the method 1500 may be partially or entirely performed by a controller, computer, etc., or some other device having one or more processors therein. The processor, e.g., processing circuit(s), chip(s), and/or module(s) implemented in hardware and/or software, and preferably having at least one hardware component may be utilized in any device to perform one or more steps of the method 1500. Illustrative processors include, but are not limited to, a central processing unit (CPU), an application specific integrated circuit (ASIC), a field programmable gate array (FPGA), etc., combinations thereof, or any other suitable computing device known in the art.

Method 1500 provides in situ control of the diffusion of a dopant into a semiconductor substrate material. A controller in a diffusion apparatus (for example, apparatus 1300 in FIG. 13) may be configured to adjust voltage and/or thermal annealing treatment to a diffusion heterostructure according to measurements of resistivity, capacitance, etc. of the heterostructure during the diffusion process.

Method 1500 begins with operation 1502 of applying a thermal annealing treatment to a heterostructure. The heterostructure comprising a substrate comprising a Group-III-nitride semiconductor material, a source layer including a dopant, the source layer positioned directly on the substrate, and a cap layer positioned above the source layer. The cap layer includes at least one of the following metals: yttrium, platinum, gold, palladium, nickel, etc. The Group-III-nitride semiconductor material includes a compound of nitrogen and at least one of the following elements: gallium, aluminum, indium, boron, scandium, and thallium.

As described herein, the thermal annealing treatment causes diffusion of the dopant from the source layer into the substrate thereby changing a conductivity and/or magnetic characteristic of the substrate. In one approach, an electric field forms within the heterostructure from a "built-in" field of the metal-insulator-semiconductor (MIS) structure of the heterostructure where the insulator is the solid source dopant.

Operation 1504 of method 1500 includes applying a voltage to the heterostructure for controlling the diffusion of the dopant into the substrate. As described herein, a voltage is applied for forming an external electric field to enhance the diffusivity of the desired dopant.

Operation 1506 includes receiving measurements of conductivity and/or magnetic characteristics from a sensor coupled to the heterostructure. In some approaches, at least one of a voltage sensor, a current sensor, a capacitance sensor, etc. may be coupled to the heterostructure for sending real-time measurements of conductivity and/or magnetic characteristics to a controller.

Operation 1508 includes calculating an amount of dopant diffused into the substrate, where the calculating is based on an algorithm including the measurements. In various approaches, operation 1508 includes processing an algorithm(s) using the received real-time measurements from the sensor(s) to calculate an amount of diffused dopant in the substrate.

Operation 1510 includes determining whether the amount of dopant diffused into the substrate is below a pre-defined threshold, wherein the pre-defined threshold corresponds to the amount of dopant diffused into the substrate. In one approach, a pre-defined threshold of an amount of diffused dopant in the substrate may correspond to the application of the doped substrate.

Operation 1512 includes in response to determining the amount of dopant diffused into the substrate is below the pre-defined threshold, adjusting a power level of the applied voltage and/or a temperature of the thermal annealing treatment for increasing the amount of dopant diffused into the substrate. For example, operation 1512 may increase the power level of the applied voltage and/or increase the temperature and/or time duration of the thermal annealing treatment to the heterostructure for increased diffusion of the dopant into the substrate. Alternatively, in response to determining the amount of diffused dopant in the substrate meets the pre-defined threshold, operation 1512 may reduce, lower, etc. the power level of the applied voltage and/or reduce, lower, etc. the thermal annealing treatment to the heterostructure. Operation 1512 may be continual adjustment of the voltage and/or thermal annealing treatment to tune the amount of diffused dopant into the substrate.

In one approach, method 1500 controls the mechanism of applying voltage to the heterostructure, and monitors the diffused substrate changing in conductivity (e.g., n-type to p-type) with increased diffusion of dopant. Thus, the changing conductivity of the substrate results in a change in position of the Fermi level, e.g., moving down and thus causing the substrate to possibly become susceptible to compensating defects. In so doing the method tunes the mechanism of applying voltage to enhance diffusivity as well as suppress the formation of compensating defects. The method thus results in a substrate doped with a pre-defined amount of diffused Mg, and the diffused Mg is not compensated or neutralized.

The present invention may be a system, a method, and/or a computer program product. The computer program product may include a computer readable storage medium (or media) having computer readable program instructions thereon for causing a processor to carry out aspects of the present invention.

Experiments

Figure 7:
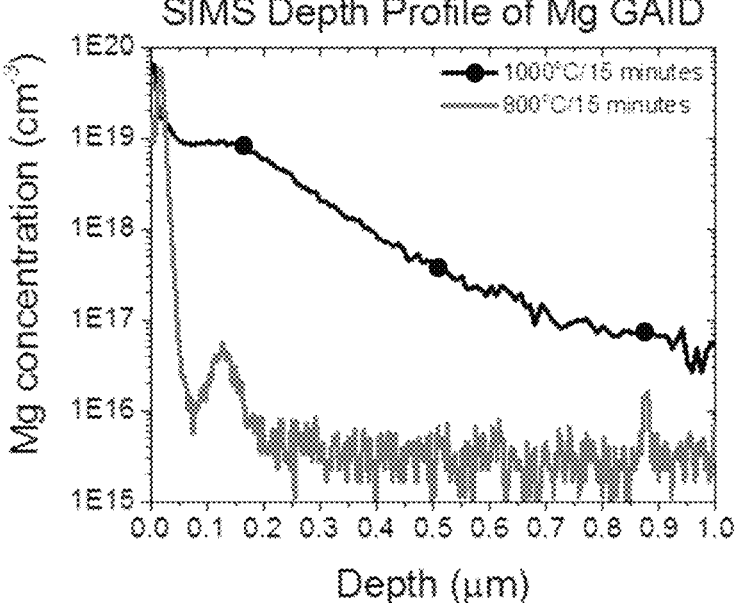
FIG. 7 is a plot of SIMS depth profile of magnesium-doped gallium nitride, according to one embodiment.

FIG. 7 is a plot of a depth profile of Mg into a GaN layer, according to one embodiment. The top curve (●) is a depth profile curve of Mg into the GaN layer at an annealing temperature of 1000° C. for 15 minutes. The bottom curve is a depth profile curve of Mg into the GaN at an annealing temperature of 800° C. for 15 minutes. The concentrations of Mg in GaN in each condition are in the range of $10^{15}$ to $10^{19}$, which, without wishing to be bound by any theory, are believed to be in the realm of possibility for Mg concentrations in a GaN layer.

Figure 8A:
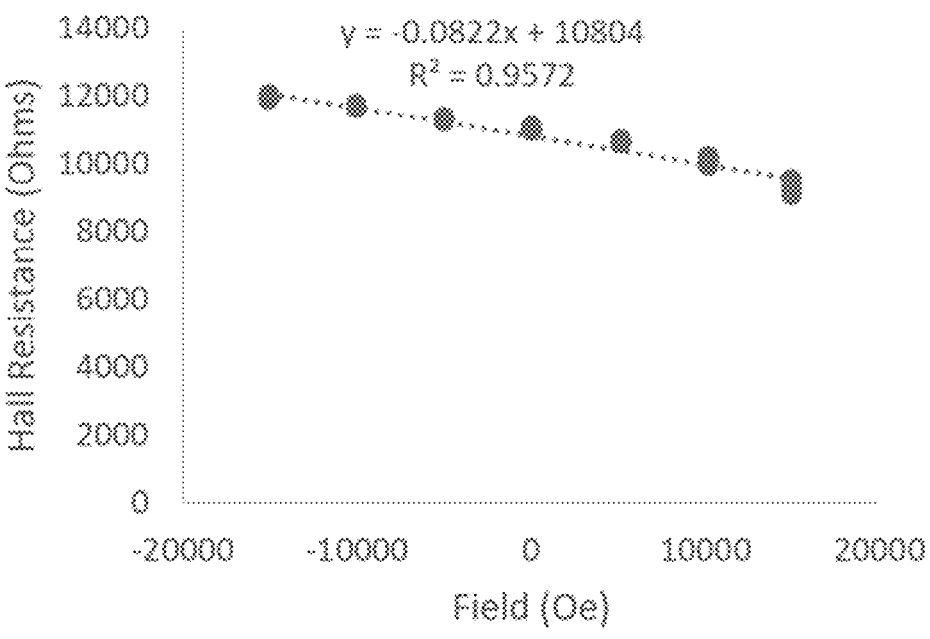
FIG. 8A is a plot of the Hall Effect of gallium nitride wafer having n-type conductivity, according to one embodiment.
Figure 8B:
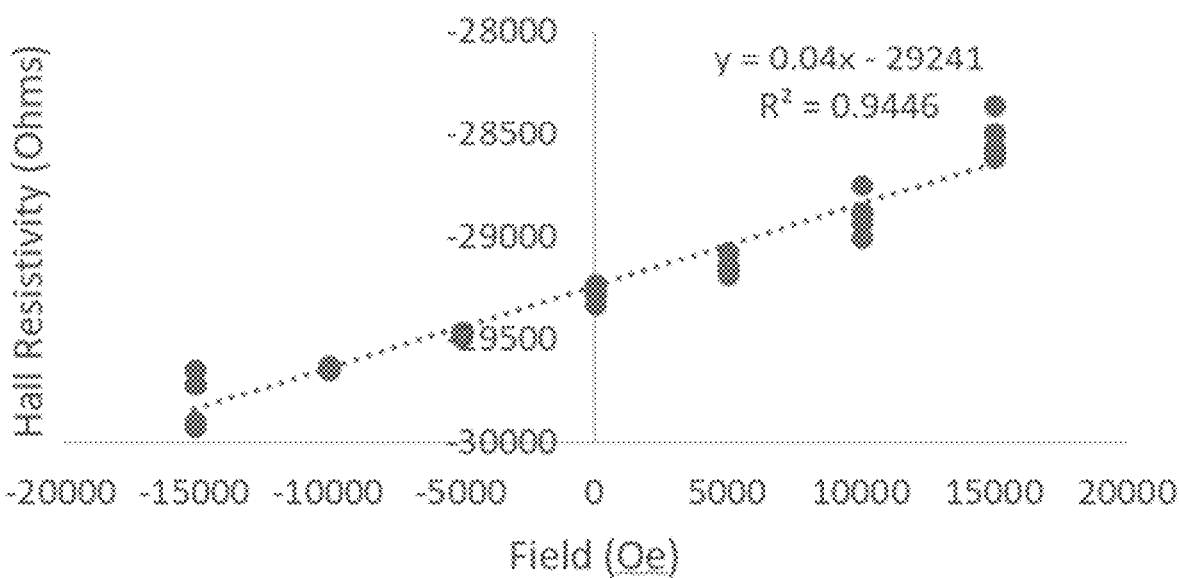
FIG. 8B is a plot of the Hall Effect of a gallium nitride wafer after vacancy-assisted ion diffusion of magnesium, according to one embodiment.

FIGS. 8A-8B depict plots of Hall Effect of p-type doping of a GaN material with Mg, according to one embodiment. FIG. 8A is the plot of a control material being a GaN wafer before diffusion, e.g., the n-type GaN before doping with Mg. The plot shows that the method begins with a wafer having n-type conductivity. FIG. 8B represents properties after diffusion of a GaN wafer at 800° C. for three minutes, following the process as described herein. As shown in FIG. 8B, the Hall Resistivity of the doped GaN wafer demonstrates a change in the slope that is consistent with a change in slope from a n-type material to p-type material.

In an exemplary approach, diffusion of Mg doping in GaN at 800° C. for three minutes has shown p-type doping (as shown in FIG. 8B), a sheet carrier density of 1.8×12 cm$^{-2}$, and a mobility of 13 cm$^2$/V-s, which is an expected mobility for p-GaN, as would be understood by one skilled in the art.

By carefully choosing the temperature and time of annealing, high carrier concentrations of p-GaN may be measured using Hall Effect. In exemplary approaches, using 100 nm of MgF$_2$ capped by 100 nm of Pt, which is then diffused at 800° C. for 3 minutes, may result in a sheet carrier concentration of 0.8×10$^{12}$ cm$^{-2}$ to 2×10$^{12}$ cm$^{-2}$. Without wishing to be bound by any theory, this may translate to a likely carrier concentration of 3×10$^{17}$ cm$^{-3}$ to 8×10$^{17}$ cm$^{-3}$, based on a best estimate of amount of Mg.

FIG. 16 is a plot of Mg concentration in the GaN substrate as measured by SIMS after diffusion using a heterostructure having various cap layers. Within the nearest 50 nm to the surface of the GaN substrate, the pattern of Mg concentration is greatest in the doped GaN substrate that had an yttrium cap layer. The inset of the plot shows a magnified view of the 20 nm depth of the substrates. The peak Mg concentration of 1020 cm−3 occurs 10 nm within the bulk of the sample and decays to $10^{17}$ cm$^{-3}$ at ~100 nm. Varying the material of the cap layer has a significant cap layer effect as measured by efficiency of Mg doping in the GaN substrate.

Comparison of Interstitial Diffusion to Vacancy-Assisted Diffusion

Figure 17:
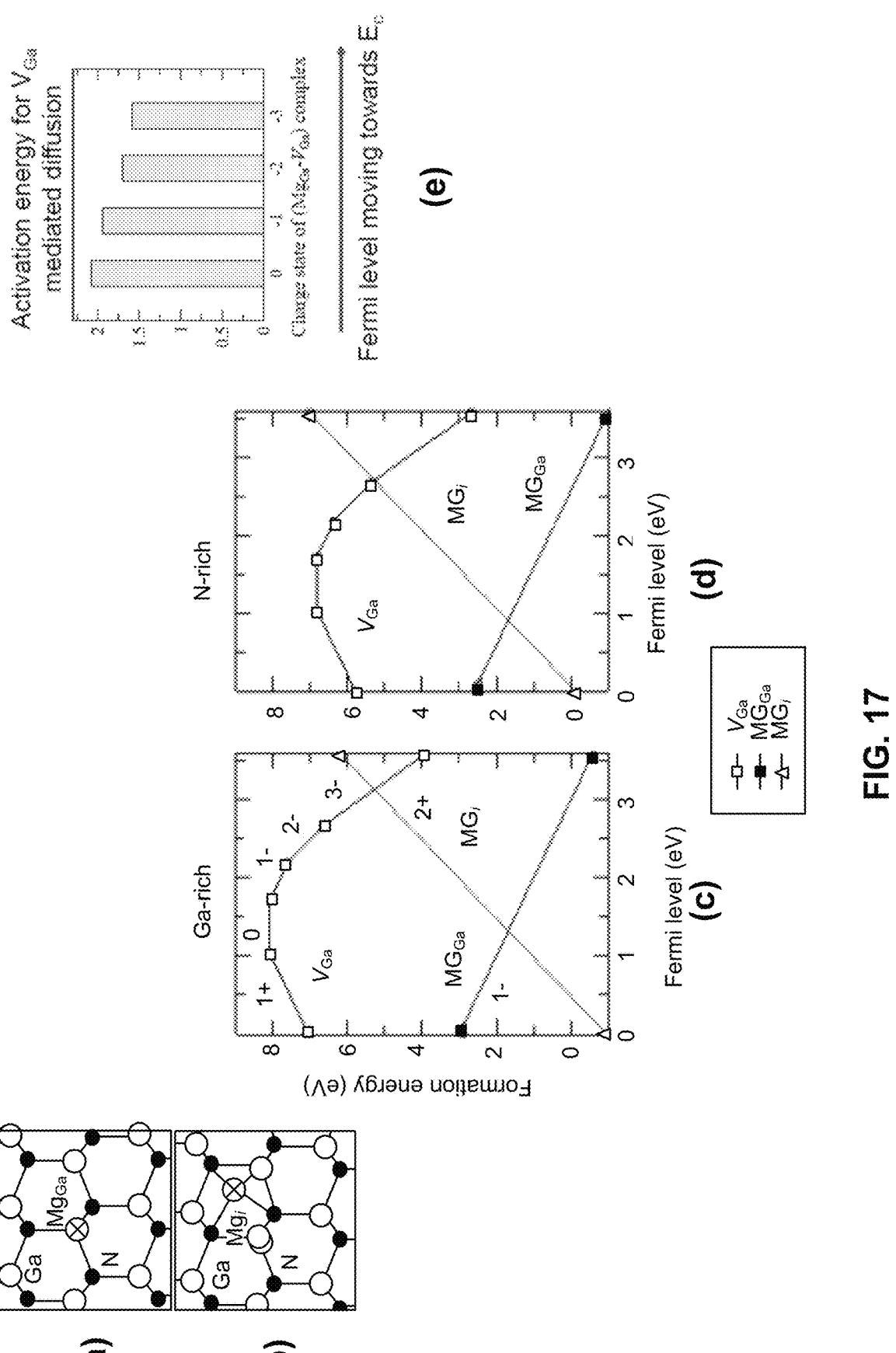
FIG. 17 illustrates the formation of Mg-doped GaN by Ga vacancy diffusion and interstitial diffusion, according to one embodiment. Part (a) is a schematic drawing of Mg substituted at Ga site in the GaN substrate, part (b) is a schematic drawing of Mg at interstitial site in the GaN substrate, part (c) is a plot of the formation energies in a Ga-rich substrate, part (d) is a plot of the formation energies in a N-rich substrate, part (e) is a comparison graph of the activation energies to charge state of formed complexes.

FIG. 17 illustrates the formation of Mg doped GaN by Ga vacancy diffusion and interstitial diffusion. A schematic drawing of Mg substituted at Ga site in the GaN substrate (Mg$_{GA}$) is shown in part (a) and Mg at interstitial site in the GaN substrate (Mg$_i$) is shown in part (b). A comparison of the formation energies V$_{GA}$, Mg$_{Ga}$, and Mg$_i$ are shown in a gallium (Ga)-rich substrate as shown in part (c) and a nitrogen (N)-rich substrate as shown in part (d). As shown a comparison of activation energies for the V$_{Ga}$ mediated Mg$_{Ga}$ diffusion in various charge state charge state of M$_{Ga}$-V$_{Ga}$ complexes in part (e), as the Fermi level moves toward E$_c$ the activation energy for V$_{Ga}$ mediated diffusion is lowered thereby increasing the rate of diffusion of Mg by vacancy-mediated diffusion.

Figure 18:
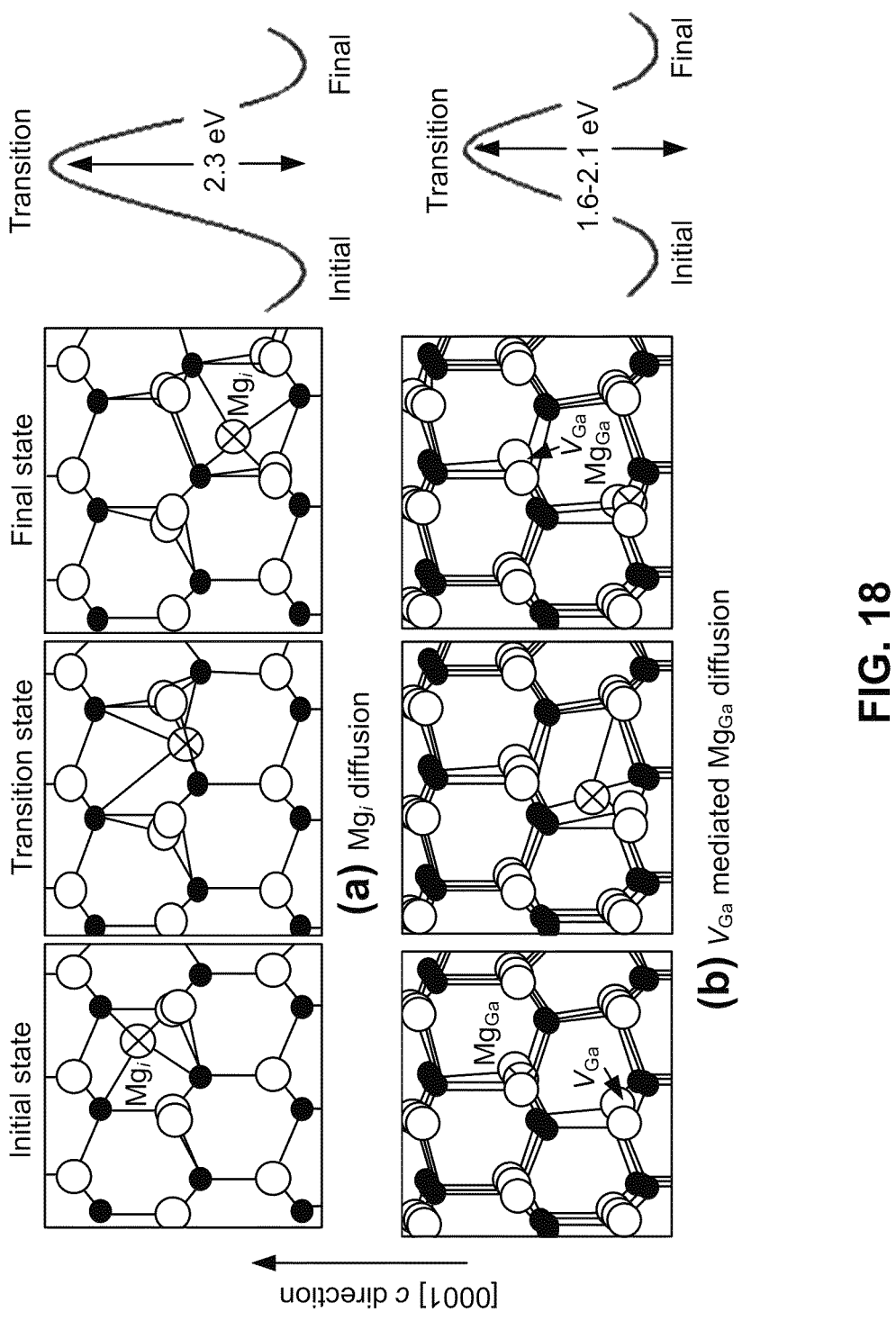
FIG. 18 is a series of schematic diagrams of the transition of Mg diffusion from initial state to final state, according to one embodiment. Part (a) illustrates transition of Mg diffusion by interstitial diffusion, part (b) illustrates transition of Mg diffusion by vacancy-mediated diffusion.

Schematic diagrams of the transition of Mg diffusion from initial state to final state via a transition state are illustrated in FIG. 18. Part (a) illustrates the transition of Mg diffusion by interstitial diffusion (Mg$_i$) at the initial state, transition state, and final state. The formation energy of the transition state is about 2.3 eV. Part (b) illustrates the transition of Mg$_{Ga}$ to a vacancy Ga site (V$_{Ga}$) by V$_{Ga}$-mediated Mg$_{Ga}$ diffusion at the initial state, transition state, and final state. The formation energy of the transition state of the V$_{Ga}$-mediated Mg$_{Ga}$ diffusion is in a range of 1.6 to 2.1 eV, significantly lower than the formation energy of the transition state in the interstitial diffusion process.

Figure 19:
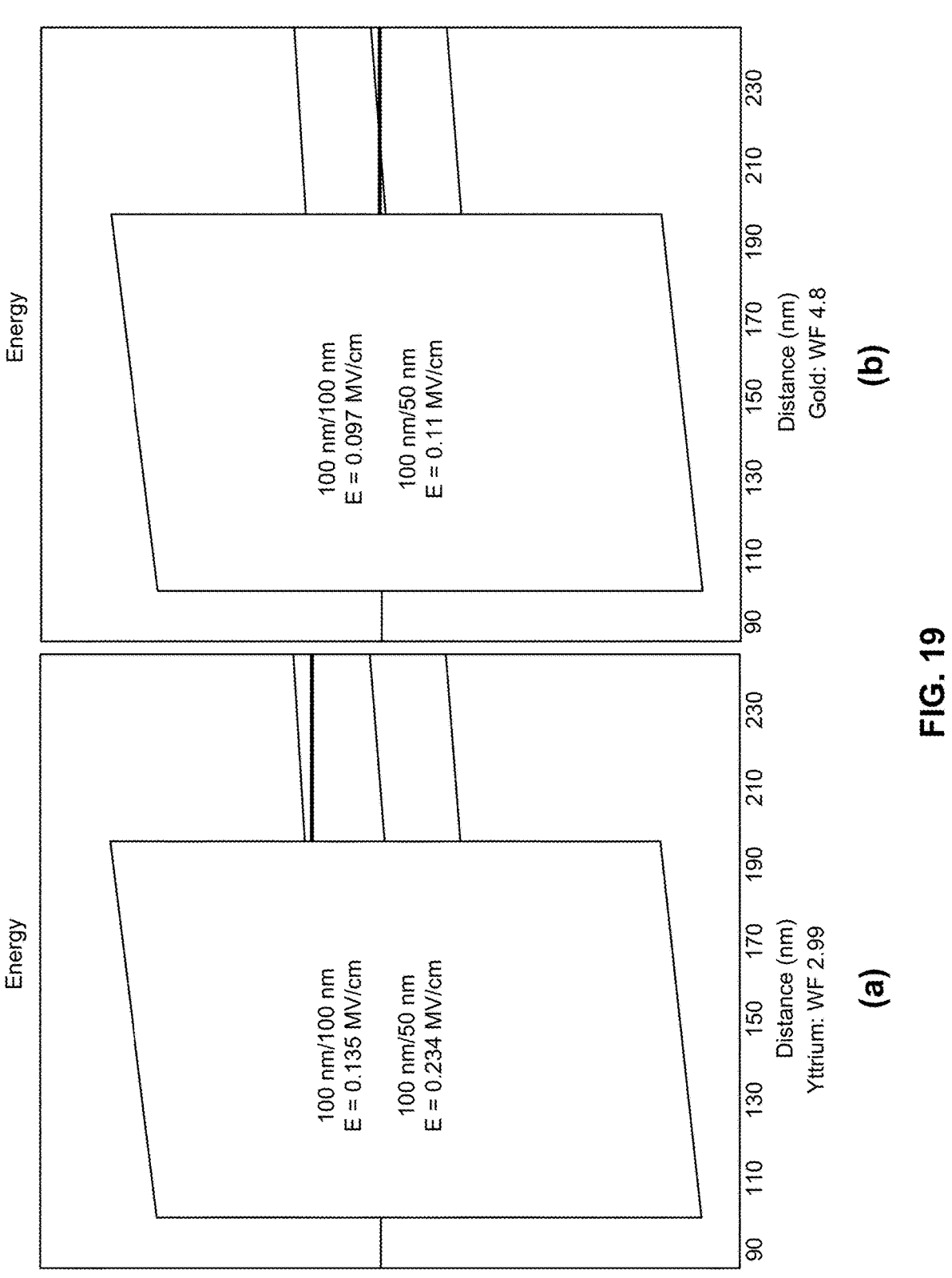
FIG. 19 depicts a series of theoretical band diagrams of heterostructures having different materials for a cap layer, according to one embodiment. Part (a) yttrium cap layer, part (b) gold cap layer, part (c) palladium cap layer, and part (d) platinum cap layer.
Figure 19:
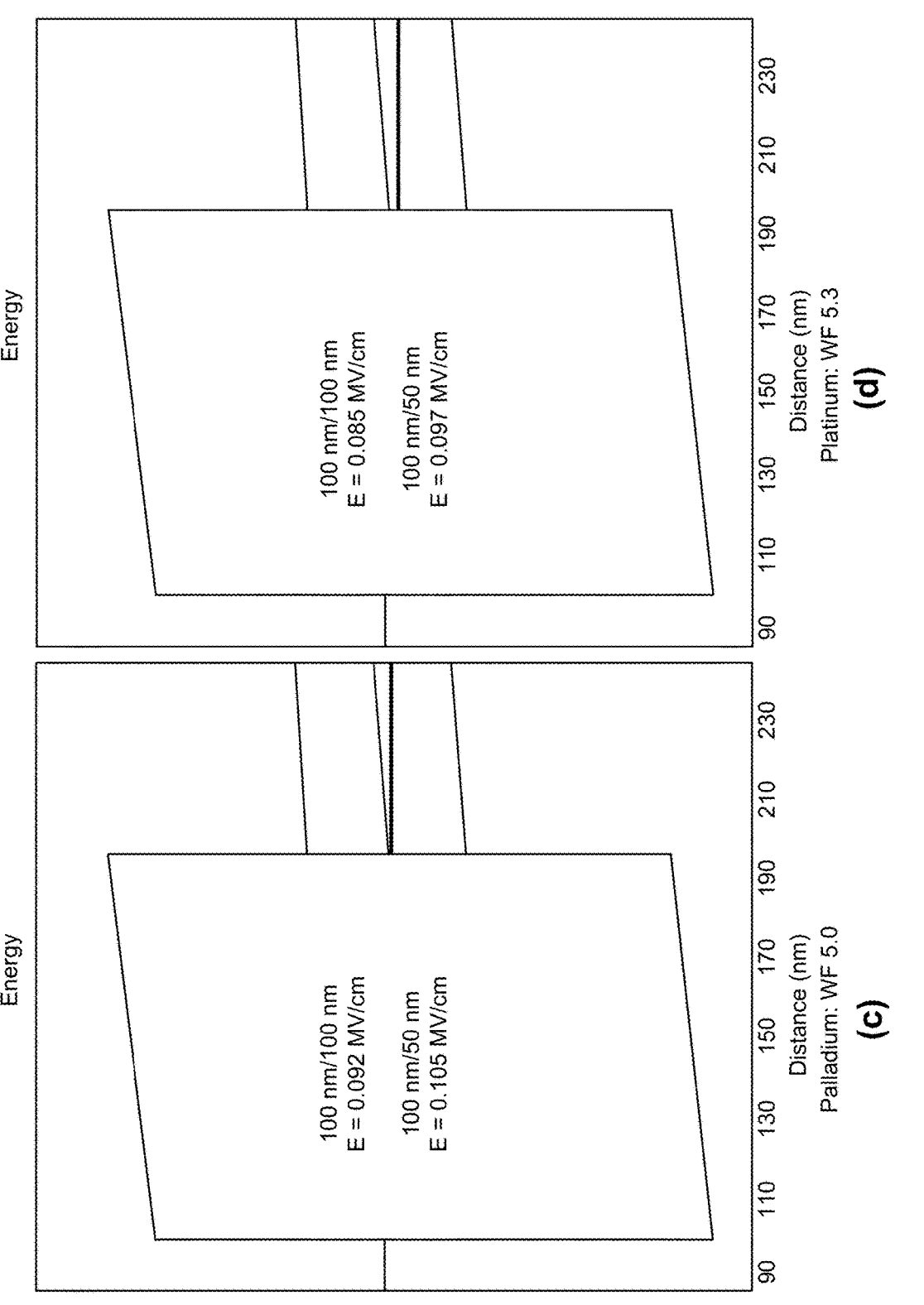

FIG. 19 depicts a series of band gap diagrams of heterostructures having different material for the cap layer based the work function of the material. Each heterostructure comprises a GaN substrate layer having the following properties N$_A$=5×10$^{15}$ cm and EA of 4.1 eV; and a source layer of MgF$_2$ having the following properties: E$_g$=12.2 eV, ε=5.1, and EA of −0.2 eV. Part (a) illustrates a heterostructure having an yttrium (Y) cap layer with a work function of 2.99. The Y cap layer having a deposition thickness of 100 nm and the source layer having a deposition thickness 100 nm had a E=0.135 MV/cm. A Y cap layer having a deposition thickness of 100 nm with a thinner source layer of 50 nm had a E=0.234 MV/cm. Notably, the Fermi level was near the surface of the GaN substrate.

Part (b) illustrates a heterostructure having a gold (Au) cap layer with a work function of 4.8. An Au cap layer having a deposition thickness of 100 nm and the source layer having a deposition thickness 100 nm had a E=0.097 MV/cm. An Au cap layer having a deposition thickness of 100 nm with a thinner source layer of 50 nm had a E=0.11 MV/cm. Notably, the Fermi level was near the middle of the deposition thickness of the GaN substrate.

Part (c) illustrates a heterostructure having a palladium (Pd) cap layer with a work function of 5.0. A Pd cap layer having a deposition thickness of 100 nm and the source layer having a deposition thickness 100 nm had a E=0.092 MV/cm. A Pd cap layer having a deposition thickness of 100 nm with a thinner source layer of 50 nm had a E=0.105 MV/cm. Notably, the Fermi level was further distanced from the surface of the GaN substrate.

Part (d) illustrates a heterostructure having a platinum (Pt) cap layer with a work function of 5.3. A Pt cap layer having a deposition thickness of 100 nm and the source layer having a deposition thickness 100 nm had a E=0.085 MV/cm. A Pt cap layer having a deposition thickness of 100 nm with a thinner source layer of 50 nm had a E=0.097 MV/cm. Notably, the Fermi level was further distanced from the surface of the GaN substrate.

Computed Formation Energy of Mg-Related Defects

Figure 20:
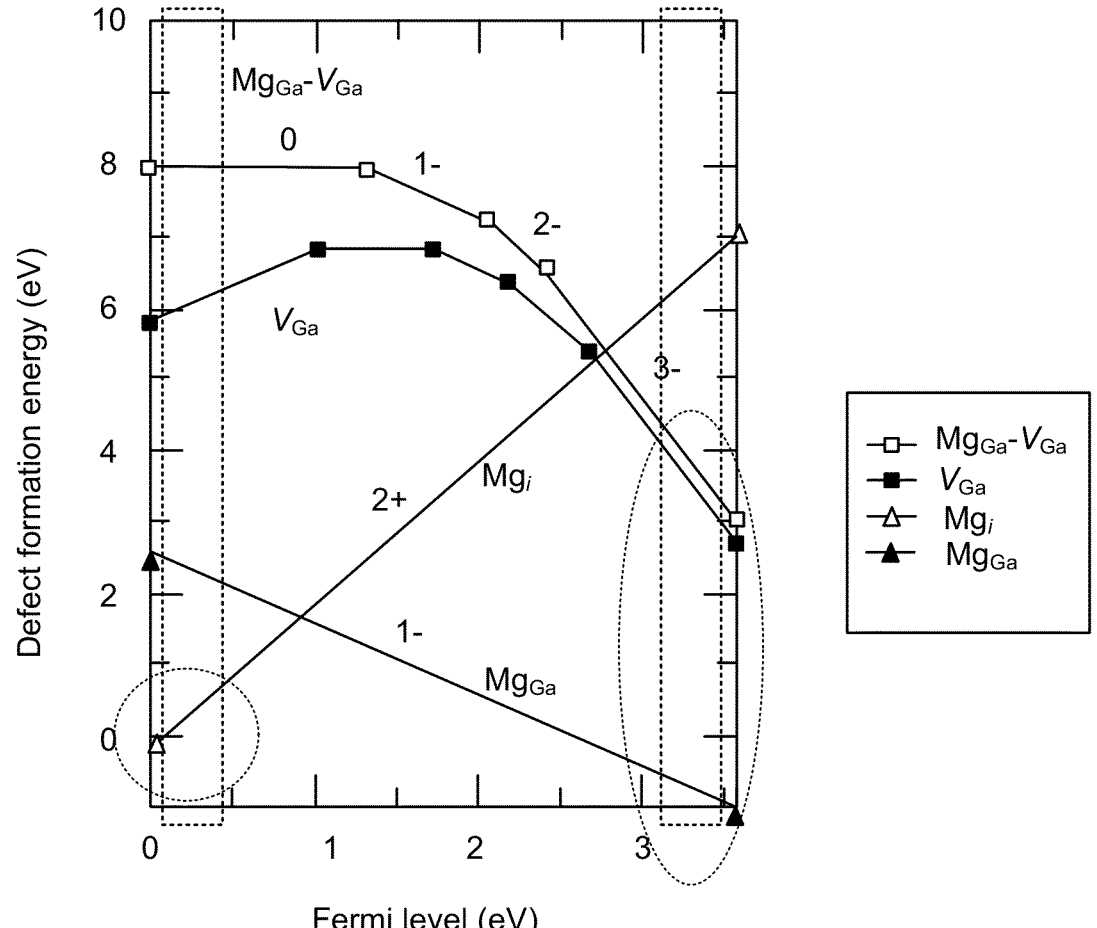
FIG. 20 depicts a plot of the computed formation energy of Mg-related defects under N-rich growth conditions, according to one embodiment.

FIG. 20 depicts a plot of the computed formation energy of Mg-related defects under N-rich growth condition. As discussed previously, substitutional Mg at Ga site ($Mg_{Ga}$) serves as a shallow acceptor with (0/−) charge transition at 0.1 eV above the valence band, while interstitial Mg ($Mg_i$) is a shallow donor with a double positive charge (2+). When the Fermi level is located near the valence band, Mg prefers to form $Mg_i$, and it can diffuse in GaN with the activation energy of 2.3 eV. However, as the Fermi level is increased, $Mg_{Ga}$ would dominate over $Mg_i$, due to the lowered formation energy of $Mg_{Ga}$.

The formation energy of the ($Mg_{Ga}$—$V_{Ga}$) complex was examined since the diffusion of $Mg_{Ga}$ is mediated by $V_{Ga}$. As depicted in FIG. 20, the formation energy of the ($Mg_{Ga}$—$V_{Ga}$) complex decreases as the Fermi level increases, indicating that the concentration of this defect complex would increase. In addition, the activation energy for the $V_{Ga}$ mediated $Mg_{Ga}$ diffusion is predicted to be 2.08, 1.94, 1.70 eV for (1−), (2−), and (3−) charge state of the ($Mg_{Ga}$—$V_{Ga}$) complex. This tendency suggests that as the Fermi level is increased, $Mg_{Ga}$ diffusion would be facilitated.

Figure 21:
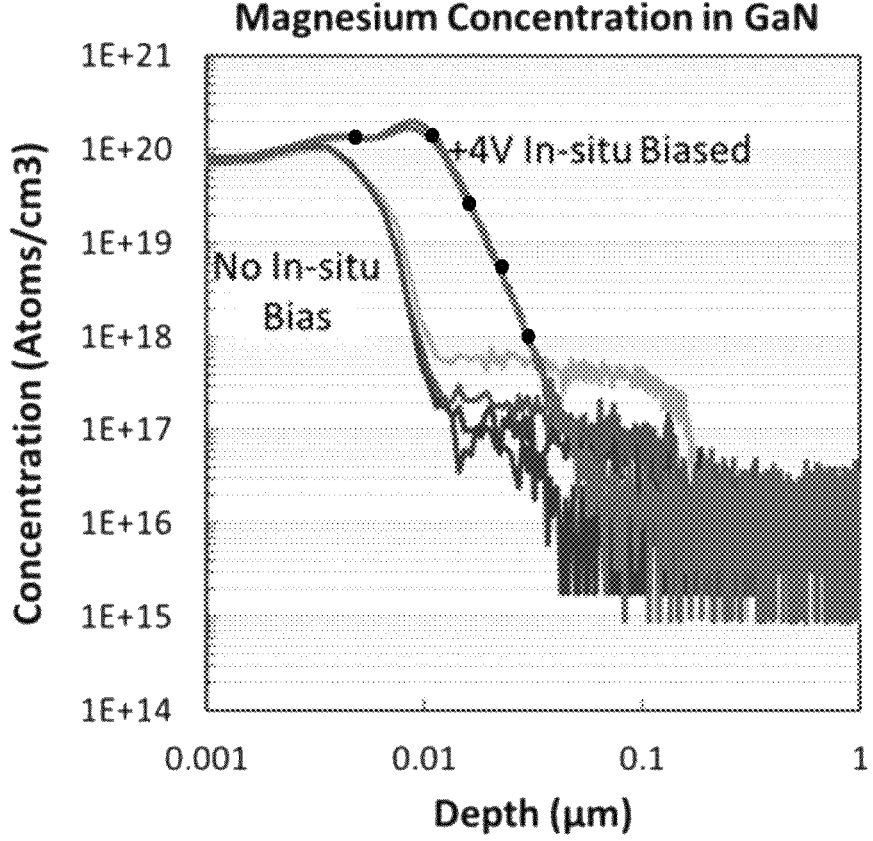
FIG. 21 is a plot of secondary ion mass spectrometry (SIMS) measuring Mg concentrations with and without in situ bias, according to one embodiment.

FIG. 21 is a plot of Mg concentration in the GaN substrate as measured by SIMS after diffusion with (●) and without (solid lines) in situ bias. An applied voltage, e.g., +4 V, demonstrated a significant increase in concentration of diffused Mg in the GaN substrate (with in situ bias) in the 100 nm nearest the surface of the substrate compared to diffusion in GaN without in situ bias.

Superjunction Devices Formed by Field Assisted Diffusion of Dopants

By utilizing various aspects of the field-assisted diffusion methodology described in detail above, charge balanced layers (CBLs) can be achieved in semiconductor materials, including in situations where traditional means of fabrication cannot be applied.

As discussed briefly above, a superjunction device is one which utilizes charge balancing layers to effectively spread the electric field over 2- or 3-dimensions within a semiconductor voltage sustaining layer instead of 1-dimension. Effectively, this increases the maximum voltage a device is capable of withstanding.

Figure 22:
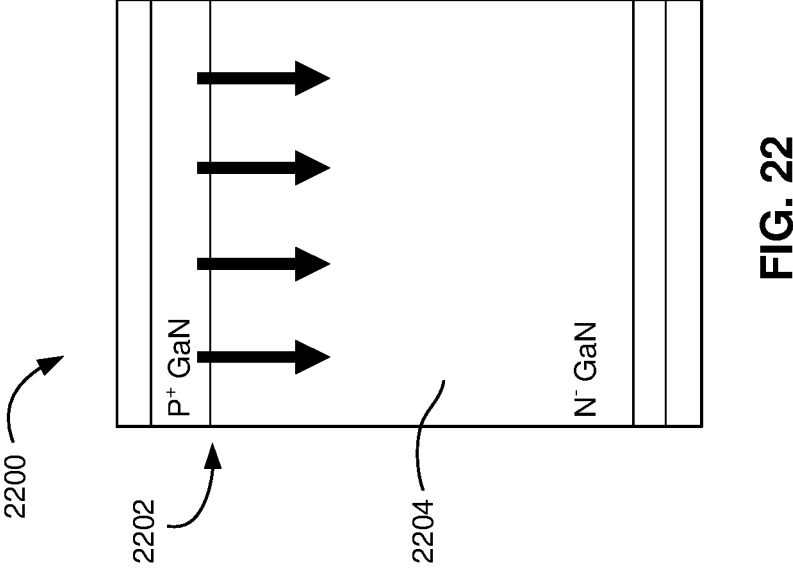
FIG. 22 is a diagram of a p-n junction device with a one dimensional depletion region.

By way of example, FIG. 22 depicts a p-n junction device 2200 (e.g., diode or transistor) with a one dimensional depletion region 2202.

As shown in FIG. 22, a dopant has been applied to a voltage sustaining layer 2204, thereby creating the depletion region 2202. When a forward bias is applied to the device 2200, the device 2200 provides very little resistance. When a reverse bias is applied to the device 2200, the device 2200 provides a high resistance. However, the voltage sustaining layer 2204 has a breakdown voltage which limits the amount of power the device 2200 can handle in the reverse bias. This material limit is due in part to the fact that the voltage is applied across the device in one dimension.

Figure 23:
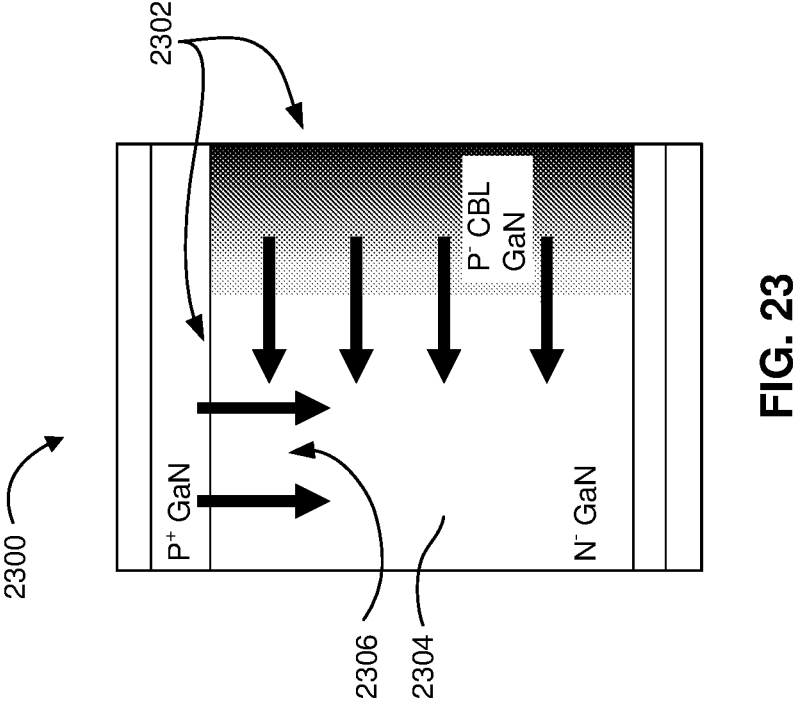
FIG. 23 depicts a p-n superjunction device with a two dimensional depletion region, according to one aspect of the present invention.

FIG. 23 depicts a p-n superjunction device 2300 with a two dimensional depletion region 2302, according to one aspect of the present invention. As an option, the present device 2300 may be implemented in conjunction with features from any other embodiment listed herein, such as those described with reference to the other FIGS. Of course, however, such device 2300 and others presented herein may be used in various applications and/or in permutations which may or may not be specifically described in the illustrative embodiments listed herein. Further, the device 2300 presented herein may be used in any desired environment.

Fabrication steps, as well as composition and function of the various layers, for any portion of the device 2300 may be conventional, except as otherwise described herein. Moreover, the device 2300 may include more or fewer layers than shown, depending on the application, said additional layers being conventional.

With continued reference to FIG. 23, the p-n superjunction device 2300 includes a voltage sustaining layer 2304 (generally referred to in the descriptions above as a "substrate") of a semiconductor material. The voltage sustaining layer 2304 has a two dimensional depletion region 2302 due to presence of a dopant (which may be a single dopant or combination of dopants) therein. Selective positioning of the dopant within the voltage sustaining layer 2304 to create a CBL that has the effect of distributing the electric field within the voltage sustaining layer in two dimensions instead of one. Here, the CBL is patterned peripherally along the direction that the voltage is dropped; thus, if the device is a vertical device, the CBL is patterned vertically along the sidewall.

In the example shown, the voltage sustaining layer 2304 is initially n-type, and thus behaves as if it has free electrons. By adding p-type dopants along the periphery of the voltage sustaining layer 2304 via doping, the charges within the voltage sustaining layer 2304 can be balanced. Similarly, if the voltage sustaining layer 2304 were p-type with an n-type overlayer, addition of n-type dopant along the periphery of the voltage sustaining layer can be used to balance the charges within the voltage sustaining layer 2304.

Referring again to FIG. 23, the resulting structure behaves as if the material of the voltage sustaining layer 2304 has almost no free carriers in the reverse bias, which is ideal for holding off a large voltage. But in the forward bias, conduction is primarily limited to region 2306. Thus, although in this example, conduction is limited to approximately one half of the area, the device 2300 still benefits from a relatively high conductivity. Accordingly, the material limit of the one dimensional design is overcome for the same material, such that the superjunction device can stand higher voltages with relatively low conduction losses.

Field assisted diffusion, described in much more detail above and below, is used to cause the dopant to diffuse through the sidewall of the voltage sustaining layer 2304 and into the voltage sustaining layer 2304. This process generally results in the dopant being more concentrated along a sidewall of the voltage sustaining layer 2304 than toward a center of the voltage sustaining layer 2304. In effect, there is a concentration gradient of the dopant in the voltage sustaining layer 2304 whereby the concentration of dopant is highest along the sidewall and said concentration decreases from the sidewall toward the center of the voltage sustaining layer 2304.

After diffusion, the dopant may be present throughout only a portion of the voltage sustaining layer. However, depending on the character of the diffusion, dopant atoms may be present throughout the entire voltage sustaining layer, i.e., the dopant can be dispersed throughout the voltage sustaining layer 2304. Note also that the character (e.g., magnitude) of the electrical field affects the doping concentration profile within the voltage sustaining layer 2304. Note that successive diffusions may be performed to reduce the dopant gradient from the outside to the inside of the voltage sustaining layer 2304.

In addition, the doped region corresponding to the CBL does not have to extend from the top to the bottom of the voltage sustaining layer 2304; at least some enhancement will still occur even if the dopant is present along only a portion of the length of the voltage sustaining layer 2304.

A benefit of field assisted diffusion is that the damage typical of ion implantation is not present. Rather, because the dopant is diffused into the voltage sustaining layer 2304, the physical structure of the voltage sustaining layer 2304 remains relatively intact, save for the presence of dopant after the field assisted diffusion process. Moreover, the dopant concentration profile within the voltage sustaining layer 2304 can be controlled by controlling the field assisted diffusion parameters, including voltage and current level applied, level of heating, etc. Thus, the dopant concentration profile will typically be different than a dopant profile created by ion implantation.

The dopant has an opposite charge when ionized than the charge of the ionized dopant already in the bulk semiconductor material that determines the p- or n-type of the bulk semiconductor material. To achieve optimal operation, the dopant is present in an effective amount to substantially balance the charge concentration within the bulk of the voltage sustaining layer 2304, ideally to the point that the charge concentrations are about equal. For example, if the voltage sustaining layer 2304 before doping has a charge concentration of $1 \times 10^{17}$ per $cm^3$ n-type and a total volume of 1 $cm^3$, charge balance could be reached by adding a p-type dopant to a half-space of the volume at a concentration of $2 \times 10^{17}$ per $cm^3$. In this way each half of the volume would be left with equal but opposite total charge and thus charge balanced.

In another approach, the amount of the dopant in the voltage sustaining layer is such that a charge concentration within the doped region and a charge concentration within the remaining voltage sustaining layer are substantially balanced, e.g., as when the volumes of the doped region and the remainder of the voltage sustaining layer are about equal.

The closer to true balance of charges within the voltage sustaining layer 2304, the higher the breakdown voltage of the voltage sustaining layer 2304. Conversely, if the charge concentrations are slightly different within the voltage sustaining layer 2304, the voltage sustaining layer 2304 will break down at lower voltages. At approximately 30% mismatch, the superjunction effect is essentially lost.

Note that there are situations where a mismatch of charge concentrations may be desirable. Accordingly, in some aspects, the charges are intentionally not balanced.

One additional consideration is the width of the voltage sustaining layer 2304. The width of the voltage sustaining layer 2304 may be considered when designing the final characteristics of the device. Note that a very wide but charge balanced voltage sustaining layer 2304 formed with a CBL as described herein would likely tend to behave like a regular device. Accordingly, one practicing the invention may select a width based on the concentration and critical electric field of the semiconductor, and determine the parameters of the diffusion process in consideration of said width.

In various approaches, the relative charge concentrations are within 25% of one another, within 15% of one another, preferably within 10% of one another, more preferably within 5% of one another, and even more preferably within 2.5% of one another. Ideally, the charges are as close to perfectly balanced as possible, e.g., the relative charge concentrations are within 1% of one another. For example, if the voltage sustaining layer 2304 is p-type, enough n-type dopant is diffused into the voltage sustaining layer 2304 to balance the charges. To achieve the highest voltage handling limit, the amount of charge outside the depletion region of the voltage sustaining layer 2304 should be substantially equal to the amount of the opposite charge in the depletion region 2302 of the voltage sustaining layer 2304.

A feedback mechanism present during the diffusion process, e.g., as described above with reference to FIG. 13, may be used to determine the optimal amount of doping to achieve the aforementioned charge balance.

The voltage sustaining layer 2304 (again, referred to above as a substrate) may be formed of any semiconductor material, with those materials listed herein being preferred. For example, the semiconductor material may include a Group-III-nitride material such as a compound of a nitrogen and at least one element selected from the group consisting of: gallium, aluminum, indium, boron, scandium, and thallium.

Any suitable dopant that would become apparent to one skilled in the art upon reading the present disclosure may be used. Illustrative dopants include magnesium, silicon, germanium, tin, and carbon. In further aspects, the dopant is a rare earth element such as a lanthanide (e.g., europium, samarium, erbium, etc.). In yet further aspects, the dopant includes one or more of: manganese, chromium, iron, nickel, vanadium, cobalt, and gadolinium. As noted above, the dopant may be a single dopant, or may be a combination of dopants such as a combination of any dopants listed herein and selected to provide the desired effect on the resulting structure.

Illustrative Methods for Forming Superjunction Devices Using Field Assisted Diffusion of Dopants As alluded to above, because superjunction structures require selective area doping, a process where dopants can be patterned with high resolution into a semiconductor material is generally preferred. Previous methods of doping such as ion implantation and regrowth tend to introduce crystalline defects into the semiconductor lattice, which limit or prevent the enhancement of the voltage sustaining layer. Moreover, previous attempts at dopant diffusion as a process were attempted, but for certain material systems (e.g., GaN, SiC, diamond etc.) extreme temperatures and/or pressures are required to introduce large enough dopant concentrations. These extreme conditions tend to damage the integrity of previous processing steps or the material itself.

The aforementioned drawbacks are overcome by utilizing the bias-assisted diffusion process described herein. Using the processes described herein, dopants can be controllably diffused into a material at much lower temperatures, thereby allowing superjunction structures to be realized in materials previously thought impossible. The controllable nature of such methodology makes it ideal for the creation of charge balanced layers.

FIG. 24 depicts a method 2400 for electric field-enhanced dopant diffusion to form a superjunction product, in accordance with one embodiment. As an option, the present method 2400 may be implemented using any of the steps, techniques, materials, etc. described elsewhere herein, such as those described with reference to other FIGURES such as FIGS. 3, 12 and 15. Of course, however, this method 2400 and others presented herein may be used to form structures for a wide variety of devices and/or purposes which may or may not be related to the illustrative embodiments listed herein. Further, the methods presented herein may be carried out in any desired environment. Moreover, more or less operations than those shown in FIG. 24 may be included in method 2400, according to various embodiments. It should also be noted that any of the aforementioned features may be used in any of the embodiments described in accordance with the various methods. Finally, except as otherwise described, conventional processing techniques, which would become apparent to one skilled in the art upon reading the present disclosure, may be used in any of the steps.

Referring to step 2402, a source layer is formed on a sidewall (or equivalently sidewalls) of a voltage sustaining layer (also referred to herein as a substrate) comprised of a semiconductor material. The source layer comprises a dopant. The sidewall extends at least a portion of the distance between a top and a bottom of the voltage sustaining layer. Assuming the overall plane of formation of the device is horizontal, the sidewall may be substantially vertical, or tilted from vertical.

In step 2404, the voltage sustaining layer with source layer thereon is heated.

In step 2406, a voltage is applied to the heated voltage sustaining layer for causing diffusion of the dopant from the source layer to the voltage sustaining layer thereby changing an electrical conductivity of the voltage sustaining layer. Note that this step may entail causing diffusion of at least one element from the voltage sustaining layer out of the voltage sustaining layer, e.g., to a cap layer, whereby the dopant diffuses into the voltage sustaining layer to a former location of the at least one element.

As mentioned above, materials used, processing conditions and techniques, etc. used during the process 2400 may be similar to those presented elsewhere herein. For example, the temperature of the heating may, in some aspects, be in a range of greater than 200° C. to less than 1000° C. is for a GaN voltage sustaining layer, and in some approaches, in a range of greater than 600° C. and less than 800° C. Similarly, the time duration of the heating may be less than one hour in some aspects, and less than 20 minutes in some approaches. In one approach, the heating is performed for an amount of time and temperature that changes the conductivity of the voltage sustaining layer from a n-type conductivity to a p-type conductivity. Moreover, the heating may be performed in an atmosphere that includes hydrogen, whereby, after the heating, the hydrogen is removed from the voltage sustaining layer.

Any technique for determining when the proper amount of dopant has been diffused into the voltage sustaining layer may be used, including any disclosed or suggested herein. For example, an electrical characteristic and/or an optical property of the voltage sustaining layer during the application of the voltage may be monitored. A determination of when to stop applying the voltage may be made based on the monitoring. The measured electrical characteristic and/or optical characteristic may be compared to a look up table correlating the measurement(s) to an extent of diffusion. The look up table may be initially created based on experimentation, experimentation and extrapolation, modeling, and combinations thereof.

By using the techniques listed herein for field assisted diffusion of dopants on a sidewall of a voltage sustaining layer, the semiconductor material thereof will have fewer semiconductor lattice defects due to introduction of the dopant into the voltage sustaining layer, and none of the semiconductor lattice defects that would occur from ion implantation of a dopant. Moreover, the voltage sustaining layer has much fewer physical defects (negligible or none) that are characteristic of heat damage than would be found in product created using conventional techniques such as ion implantation with an annealing step.

Figure 25:
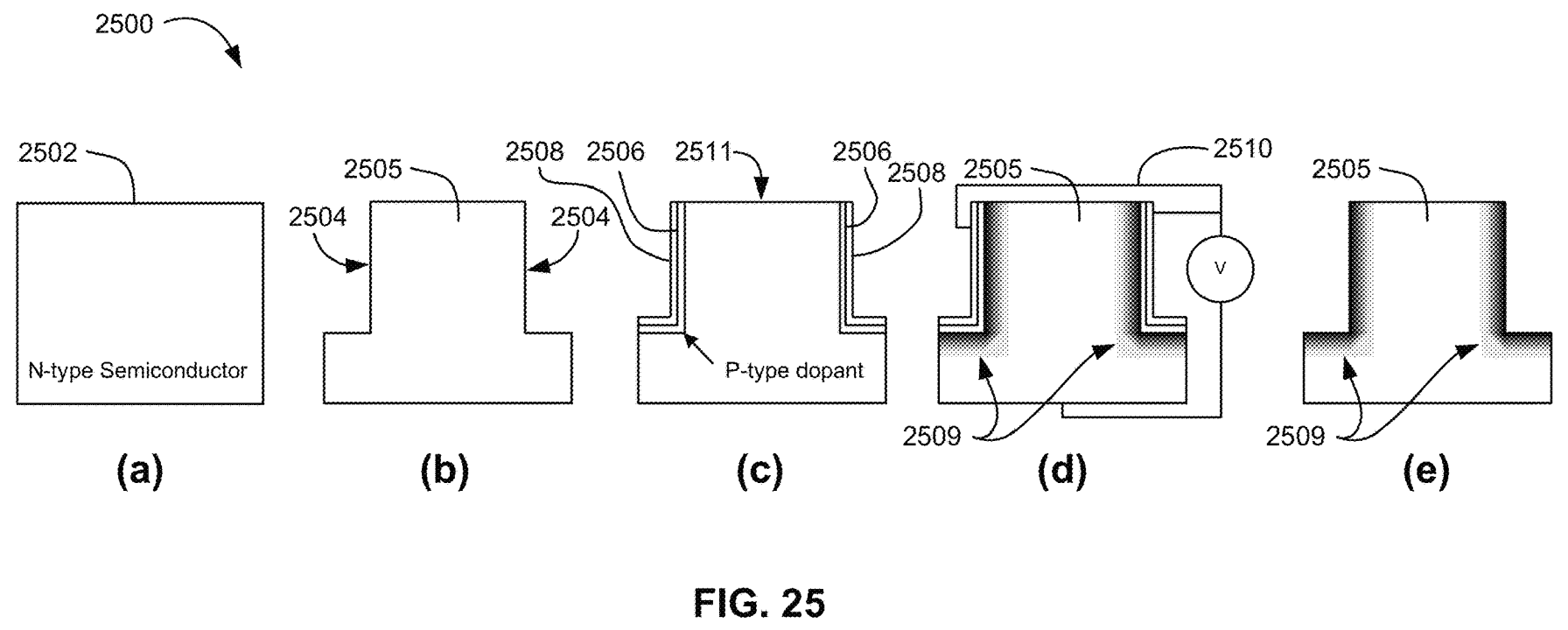

FIG. 25 graphically depicts a method 2500 for electric field-enhanced dopant diffusion to form a superjunction product, in accordance with one illustrative embodiment. As an option, the present method 2500 may be implemented using any of the steps, techniques, materials, etc. described elsewhere herein, such as those described with reference to other FIGURES such as FIGS. 3, 12 and 15. Of course, however, this method 2500 and others presented herein may be used to form structures for a wide variety of devices and/or purposes which may or may not be related to the illustrative embodiments listed herein. Further, the methods presented herein may be carried out in any desired environment. Moreover, more or less operations than those shown in FIG. 25 may be included in method 2500, according to various embodiments. It should also be noted that any of the aforementioned features may be used in any of the embodiments described in accordance with the various methods. Finally, except as otherwise described, conventional processing techniques, which would become apparent to one skilled in the art upon reading the present disclosure, may be used in any of the steps.

Referring to part (a) of FIG. 25, a semiconductor material 2502 is fabricated or otherwise acquired. The semiconductor material 2502 may be of any desired composition and/or type, e.g., p-type or n-type. For high voltage device creation, preferred materials include Si, SiC, GaN, GaO, diamond, AlN, and AlGaN.

Referring to part (b), the starting material 2502 is processed to define sidewalls 2504, thereby defining one or more voltage sustaining layers 2505 of the semiconductor material between the sidewalls 2504. Any suitable conventional subtractive process may be used, such as masking the top of the starting material and etching, milling, etc. the exposed regions of the starting material, e.g., to form channels, thereby defining one or more voltage sustaining layers 2505. Formation of the mask may be achieved via conventional lithographic techniques, e.g., using photolithography. Other approaches for defining the sidewalls include cleaving, saw cutting, etc.

As shown in part (c), a source layer 2506 is deposited onto the sidewalls 2504 of the voltage sustaining layer 2505 in a location where dopant diffusion is desired. The source layer 2506 may have a composition as described elsewhere herein, e.g., a layer of the dopant or a metallic layer having the dopant therein. Where the voltage sustaining layer 2505 is silicon, the dopants may include phosphorus and boron. Where the voltage sustaining layer 2505 is GaN, the dopants may include silicon as an n-type donor, and Mg as a p-type donor.

The source layer 2506 is chosen to balance the charges within the voltage sustaining layer 2505. For example, if the voltage sustaining layer 2505 is a p-type semiconductor, the source layer 2506 is chosen such that n-type dopant diffuses into the voltage sustaining layer 2505.

Any known deposition process to deposit the source layer 2506 (and any additional layers) may be used, such as atomic layer deposition (ALD), chemical vapor deposition (CVD), MOCVD, plasma vapor deposition (PVD), sputtering, etc. As shown, the source layer 2506 is applied to sidewalls 2504 of the voltage sustaining layer 2505, as opposed to the top or bottom. A cap layer 2508 as described elsewhere herein may also be applied to the sidewalls. The mask used for the subtractive process of part (b) may remain on the structure to prevent application of the source layer 2506 to the top surface 2511 of the voltage sustaining layer. The mask may form a barrier between any source layer 2506 deposited thereon and the underlying structure, or the mask may be removed using conventional lithography techniques, such as gentle chemical mechanical polishing and/or dissolution of the mask using a solvent.

Referring to part (d), field assisted diffusion is performed, e.g., as described at various places herein, to create doped regions 2509 where dopant has migrated into the voltage sustaining layer 2505. A basic circuit 2510 for applying the electrical field is shown. The field-assisted diffusion process introduces dopant atoms such that a charge concentration, substantially opposite to that of the voltage sustaining layer 2505, is present within the voltage sustaining layer 2505. The magnitude of the concentration of dopant introduced is controlled, e.g., with time, temperature (heating) and/or bias conditions, such that the charge concentration within the remaining voltage sustaining layer 2505 and within the diffused region are essentially balanced. The optimal time, temperature and/or bias conditions for a given dopant/ semiconductor combination may be calculated, determined from a predefined look up table, determined via routine experimentation following the teachings presented herein, etc. as would become apparent to one skilled in the art after reading the present disclosure. In general, the bias conditions should affect the Fermi level at the interface of the source layer and a voltage sustaining layer 2505 such that the voltage sustaining layer 2505 is positioned energetically to preferentially allow dopant atoms to diffuse into the voltage sustaining layer 2505.

The voltage applied can be positive or negative, depending on the type of semiconductor material, and is applied while heating the structure in an appropriate atmosphere, e.g., oxygen, argon, hydrogen balance argon, etc. For example, a positive voltage applied to the source layer 2506 when the voltage sustaining layer 2505 is grounded preferentially biases the semiconductor to accept acceptors, while a negative voltage allows donors to form at the surface. The voltage applied may be direct current (DC), or DC with an alternating current (AC) signal applied over the DC. The voltage level generally depends on the type of semiconductor of the voltage sustaining layer 2505, the type of dopant, and the thickness of the source layer 2506. The voltage level applied is preferably sufficient to bend the Fermi level at the interface of the voltage sustaining layer 2505 and the source layer 2506 toward the conduction band or the valence band, as appropriate. Moreover, a higher voltage generally corresponds to deeper diffusion of dopant into the voltage sustaining layer 2505. Successful diffusions of Mg into GaN have been conducted at voltages up to about 20 volts. It is believed higher voltages could be used. Note that the voltage may be changed, e.g., increased, as dopant is driven into the voltage sustaining layer 2505 to maintain a desired diffusion rate and/or diffusion profile.

The temperature applied during the diffusion should be high enough to promote diffusion, but not so high as to damage the voltage sustaining layer 2505 or other materials in the structure. For example, for GaN, damage begins to appear at a temperature of about 900° C., and therefore, diffusion into GaN should be performed at a temperature below 900° C.

As noted in the description of FIG. 13, the electrical characteristics of the voltage sustaining layer 2505 changes as dopant diffuses therein. The changes in such electrical characteristics, such as the impedance across a voltage sustaining layer 2505, can be used to estimate the extent of diffusion of the dopant, e.g., with reference to a look up table that correlates impedance to extent of diffusion, via real-time calculations, etc. As basepoints for calculating the extent of diffusion, one may perform diffusion experiments to characterize the electrical characteristics for various levels of doping for a given materials system, thereby creating data from which to extrapolate the extent of diffusion in a live process. In another approach, a closed loop method where one measures an actual physical characteristic using the complex impedance, capacitance and inductance measured to approximate how may free carriers are available during the diffusion step.

The source layer 2506, and cap layer 2508 if present, are removed. The resulting structure shown in part (e) is a superjunction structure that is ready for device formation, e.g., diode, transistor, etc.

The dimensions of the channels, thicknesses of the various components and layers, etc. depend on the desired characteristics of the final device, and would be readily determinable by one skilled in the art, once armed with the teachings herein, without undue experimentation.

Figure 26:
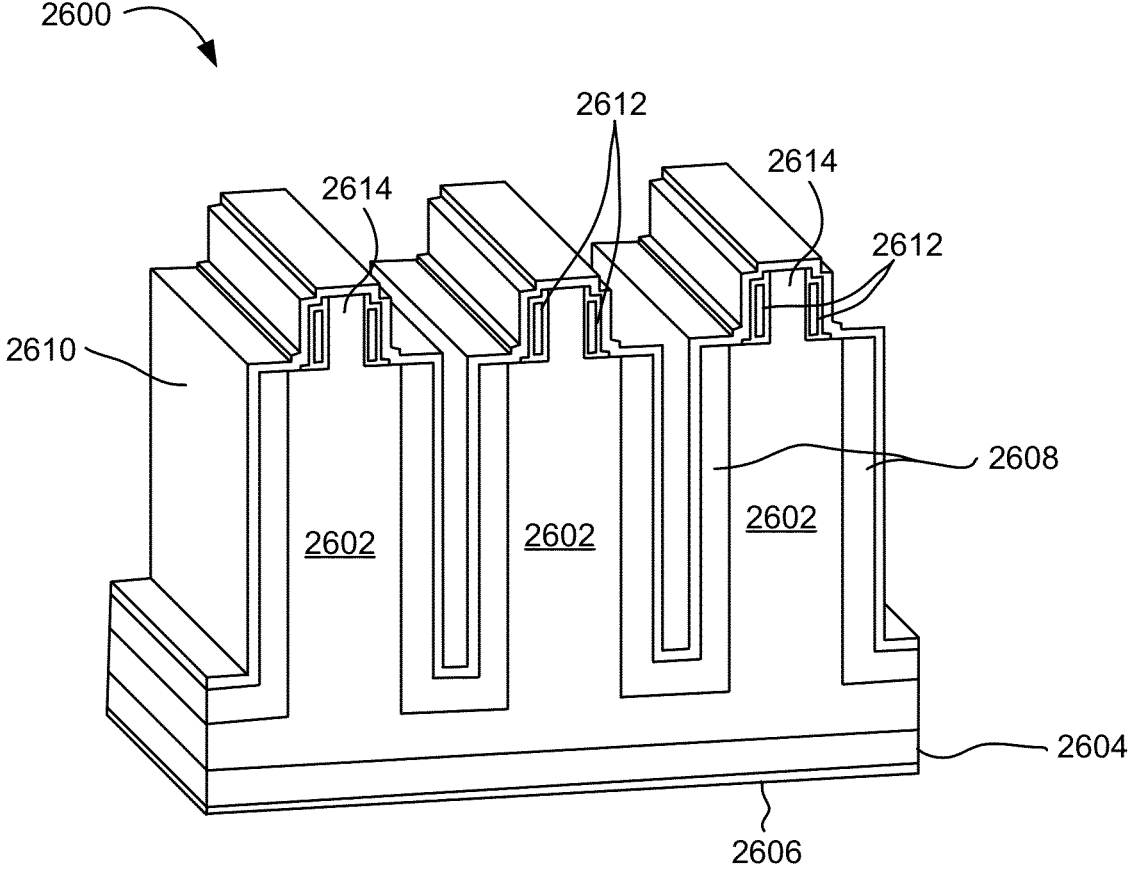
FIG. 26 is a partial perspective view of an illustrative superjunction device, in accordance with one aspect of the present invention.

FIG. 26 depicts an illustrative superjunction device 2600, in accordance with one aspect of the present invention. As an option, the present superjunction device 2600 may be created using any of the steps, techniques, materials, etc. described elsewhere herein, such as those described with reference to other FIGURES such as FIGS. 3, 12, 15 and 25. Of course, however, this superjunction device 2600 and others presented herein may be used in a wide variety of devices and/or for a wide variety of purposes which may or may not be related to the illustrative embodiments listed herein. Further, the superjunction device 2600 presented herein may be used in any desired environment.

The superjunction device 2600 depicted in this example is a GaN superfunction Fin-shaped Field Effect Transistor (FinFET) fabricated on top of a superjunction structure. As shown, the superjunction device 2600 includes an array of vertically oriented voltage sustaining layers 2602 of n⁻ GaN, above a base 2604 of n⁺ GaN and a drain 2606. Each voltage sustaining layer 2602 has doped regions 2608 along the vertical sidewalls thereof, which make each voltage sustaining layer 2602a superjunction structure.

Overlying each of the voltage sustaining layer 2602 is a source layer 2610, which contacts both the p-type region along the lateral sidewalls of the voltage sustaining layer 2602 and the top surface between the gate layers 2612. The gate layers 2612 are used to control conduction in the fin 2614 along the top, such that whenever the gate "pinches off" conduction at the fin 2614, the device 2600 will hold off a voltage that is enhanced by the superjunction structure below.

The dimensions of the channels, thicknesses of the various components and layers, etc. depend on the desired characteristics of the final superjunction device 2600, and would be readily determinable by one skilled in the art, once armed with the teachings herein, without undue experimentation.

Uses

The embodiments described herein may be used for any suitable purpose, and in any device where a structure having field-assisted dopants diffused therein. For example, the present disclosure encompasses any device that utilizes the field-assisted diffusion process to controllably distribute dopants within a semiconductor material that subsequently improves the voltage handling capabilities of said device by distributing the electric field within a voltage sustaining layer.

Illustrative uses include light emitting diodes, laser diodes, transistors, MOSFETs, JFETs, vertical GaN devices, optoelectronics, power electronics, sensors, p-GaN devices, etc.

Various aspects having the superjunction structure are particularly beneficial when used in high power electronic device structures. Examples include junction barrier Schottky diodes, superjunction transistors (JFET, MOSFET, COOLMOS, FinFET, etc.). These devices can then be used in high power conversion circuitry. Examples include renewable energy systems such as wind and solar power regulation and conditioning. Other uses include defense and aerospace, such as applications in aircraft, spacecraft, and satellite system control and power conversion. Further applications include use in utility systems such as high voltage DC transmission, smart grid applications. Yet other applications include use in automotive applications, such as electric vehicle battery to motor conversion.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown but is to be accorded the widest scope consistent with the principles and features disclosed herein.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments but should be defined only in accordance with the following claims and their equivalents.

What is claimed is:

1. An apparatus, comprising:
a superjunction device having a monolithic voltage sustaining layer formed of a semiconductor material and a dopant in the voltage sustaining layer,
the dopant being for distributing an electric field within the voltage sustaining layer,
the dopant being more concentrated along a sidewall of the voltage sustaining layer than toward a center of the voltage sustaining layer, the sidewall extending at least a portion of the distance between a top surface and a bottom surface of the voltage sustaining layer.

2. The apparatus as recited in claim 1, wherein the dopant has an opposite charge when ionized than the charge of an ionized dopant in a bulk of the semiconductor material.

3. The apparatus as recited in claim 2, wherein an amount of the dopant in the voltage sustaining layer is such that a charge concentration within a doped region of the voltage sustaining layer and within the remaining voltage sustaining layer are substantially balanced.

4. The apparatus as recited in claim 2, wherein an amount of the dopant in a doped region of the voltage sustaining layer is sufficient to approximately balance charges within a bulk of the remaining voltage sustaining layer.

5. The apparatus as recited in claim 1, wherein the apparatus includes a superjunction device having the voltage sustaining layer.

6. An apparatus, comprising:
a superjunction device having a voltage sustaining layer formed of a semiconductor material and a dopant in the voltage sustaining layer,
the dopant being for distributing an electric field within the voltage sustaining layer,
the dopant being more concentrated along a sidewall of the voltage sustaining layer than toward a center of the voltage sustaining layer, the sidewall extending at least a portion of the distance between a top surface and a bottom surface of the voltage sustaining layer,
wherein the semiconductor material has no semiconductor lattice defects from ion implantation into the voltage sustaining layer.

7. The apparatus as recited in claim 1, wherein the semiconductor material includes a Group-III-nitride material.

8. The apparatus as recited in claim 7, wherein the Group-III-nitride material comprises a compound of a nitrogen and at least one element selected from the group consisting of: gallium, aluminum, indium, boron, scandium, and thallium.

9. The apparatus as recited in claim 1, wherein the dopant is present throughout only a portion of the voltage sustaining layer.

10. The apparatus as recited in claim 1, wherein the dopant is present throughout the voltage sustaining layer.

11. The apparatus as recited in claim 1, wherein the dopant includes magnesium.

12. The apparatus as recited in claim 1, wherein the dopant is selected from the group consisting of: silicon, germanium, tin, and carbon.

13. The apparatus as recited in claim 1, wherein the dopant is a lanthanide.

14. The apparatus as recited in claim 1, wherein the dopant is selected from the group consisting of: manganese, chromium, iron, nickel, vanadium, cobalt, and gadolinium.

15. The apparatus as recited in claim 1, further comprising an electrode layer extending along the sidewall of the voltage sustaining layer.

16. The apparatus as recited in claim 1, wherein the voltage sustaining layer does not have ion implantation damage.

17. A method of electric field-enhanced dopant diffusion to form the superjunction device of claim 1, the method comprising:
forming a source layer on a sidewall of a voltage sustaining layer comprised of a semiconductor material, the source layer comprising a dopant;
heating the voltage sustaining layer with source layer thereon; and
applying a voltage to the heated voltage sustaining layer for causing diffusion of the dopant from the source layer to the voltage sustaining layer thereby changing an electrical conductivity of the voltage sustaining layer.

18. The method as recited in claim 17, wherein a temperature of the heating is in a range of greater than 200 degrees Celsius to less than 1000 degrees Celsius.

19. The method as recited in claim 17, wherein a time duration of the heating is less than one hour, and comprising monitoring an electrical characteristic and/or an optical property of the voltage sustaining layer during the applying, and determining when to stop the applying based on the monitoring.

20. The method as recited in claim 17, wherein the heating is performed in an atmosphere that includes hydrogen; and comprising, after the heating, removing hydrogen from the voltage sustaining layer.

21. The apparatus as recited in claim 1, wherein the monolithic voltage sustaining layer is formed from a single block of the semiconductor material.

\* \* \* \* \*